(12) United States Patent
Humpston et al.

(10) Patent No.: US 7,936,062 B2
(45) Date of Patent: May 3, 2011

(54) WAFER LEVEL CHIP PACKAGING

(75) Inventors: Giles Humpston, Aylesbury (GB);
Michael J. Nystrom, San Jose, CA
(US); Vage Oganesian, Palo Alto, CA
(US); Yulia Aksenton, Jerusalem (IL);
Osher Avsian, Kiryat Ono (IL); Robert Burtzlaff, San Jose, CA (US); Avi Dayan, Jerusalem (IL); Andrey Grinman, Jerusalem (IL); Felix Hazanovich, Jerusalem (IL); Ilya Hecht, Beit Shemesh (IL); Charles Rosenstein, Ramat Beit Shemesh (IL); David Ovrutsky, Ashkelon (IL); Mitchell Hayes Reifel, San Jose, CA (US)

(73) Assignee: Tessera Technologies Ireland Limited (IE)

( * ) Notice: Subject to any disclaimer, the term of this patent is extended or adjusted under 35 U.S.C. 154(b) by 834 days.

(21) Appl. No.: 11/655,777

(22) Filed: Jan. 19, 2007

(65) Prior Publication Data
US 2007/0190691 A1 Aug. 16, 2007

Related U.S. Application Data

(60) Provisional application No. 60/761,171, filed on Jan. 23, 2006, provisional application No. 60/775,086, filed on Feb. 21, 2006.

(51) Int. Cl.
*H01L 23/12* (2006.01)
(52) U.S. Cl. ........ 257/704; 257/711; 257/726; 257/680; 257/729
(58) Field of Classification Search .................. 257/680, 257/704, 711, 726, 729
See application file for complete search history.

(56) References Cited

U.S. PATENT DOCUMENTS

| 2,507,956 | A | 5/1950 | Bruno et al. |
| 2,796,370 | A | 6/1957 | Ostrander |
| 2,851,385 | A | 9/1958 | Spruance, Jr. et al. |
| 3,648,131 | A | 3/1972 | Stuby |
| 3,761,782 | A | 9/1973 | Youmans |
| 3,981,023 | A | 9/1976 | King et al. |
| 4,259,679 | A | 3/1981 | Knibb et al. |
| 4,279,690 | A | 7/1981 | Dierschke |
| 4,339,689 | A | 7/1982 | Yamanaka et al. |

(Continued)

FOREIGN PATENT DOCUMENTS
EP 0 506 491 9/1992

(Continued)

OTHER PUBLICATIONS

U.S. Appl. No. 10/077,388, filed Feb. 15, 2002, assigned to Tessera, Inc., now Abandoned.

*Primary Examiner* — Mary Wilczewski
*Assistant Examiner* — Telly D Green
(74) *Attorney, Agent, or Firm* — Lerner, David, Littenberg, Krumholz & Mentlik, LLP

(57) ABSTRACT

Packaged microelectronic elements are provided. In an exemplary embodiment, a microelectronic element having a front face and a plurality of peripheral edges bounding the front face has a device region at the front face and a contact region with a plurality of exposed contacts adjacent to at least one of the peripheral edges. The packaged element may include a plurality of support walls overlying the front face of the microelectronic element such that a lid can be mounted to the support walls above the microelectronic element. For example, the lid may have an inner surface confronting the front face. In a particular embodiment, some of the contacts can be exposed beyond edges of the lid.

23 Claims, 46 Drawing Sheets

U.S. PATENT DOCUMENTS

| | | |
|---|---|---|
| 4,551,629 A | 11/1985 | Carson et al. |
| 4,558,171 A | 12/1985 | Gantley et al. |
| 4,764,846 A | 8/1988 | Go |
| 4,768,077 A | 8/1988 | Scherer |
| 4,774,630 A | 9/1988 | Reisman et al. |
| 4,794,092 A | 12/1988 | Solomon |
| 4,797,179 A | 1/1989 | Watson et al. |
| 4,806,106 A | 2/1989 | Mebane et al. |
| 4,812,420 A | 3/1989 | Matsuda et al. |
| 4,825,284 A | 4/1989 | Soga et al. |
| 4,827,376 A | 5/1989 | Voss |
| 4,862,197 A | 8/1989 | Stoffel |
| 4,862,249 A | 8/1989 | Carlson |
| 4,894,707 A | 1/1990 | Yamawaki et al. |
| 4,933,601 A | 6/1990 | Sagawa et al. |
| 4,984,358 A | 1/1991 | Nelson |
| 5,070,297 A | 12/1991 | Kwon et al. |
| 5,072,520 A | 12/1991 | Nelson |
| 5,104,820 A | 4/1992 | Go et al. |
| 5,118,924 A | 6/1992 | Mehra et al. |
| 5,124,543 A | 6/1992 | Kawashima |
| 5,126,286 A | 6/1992 | Chance |
| 5,139,972 A | 8/1992 | Neugebauer et al. |
| 5,148,265 A | 9/1992 | Khandros et al. |
| 5,148,266 A | 9/1992 | Khandros et al. |
| 5,177,753 A | 1/1993 | Tanaka |
| 5,187,122 A | 2/1993 | Bonis |
| 5,198,963 A | 3/1993 | Gupta et al. |
| 5,220,838 A | 6/1993 | Fung et al. |
| 5,250,462 A | 10/1993 | Sasaki et al. |
| 5,266,501 A | 11/1993 | Imai |
| 5,266,833 A | 11/1993 | Capps |
| 5,285,352 A | 2/1994 | Pastore et al. |
| 5,321,303 A | 6/1994 | Kawahara et al. |
| 5,335,210 A | 8/1994 | Bernstein |
| 5,347,159 A | 9/1994 | Khandros et al. |
| 5,382,829 A | 1/1995 | Inoue et al. |
| 5,390,844 A | 2/1995 | Distefano et al. |
| 5,398,863 A | 3/1995 | Grube et al. |
| 5,438,305 A | 8/1995 | Hikita et al. |
| 5,448,014 A | 9/1995 | Kong et al. |
| 5,473,190 A | 12/1995 | Inoue et al. |
| 5,486,720 A | 1/1996 | Kierse et al. |
| 5,491,302 A | 2/1996 | Distefano et al. |
| 5,500,540 A | 3/1996 | Jewell et al. |
| 5,504,035 A | 4/1996 | Rostoker et al. |
| 5,518,964 A | 5/1996 | DiStefano et al. |
| 5,526,449 A | 6/1996 | Meade et al. |
| 5,530,288 A | 6/1996 | Stone |
| 5,536,909 A | 7/1996 | DiStefano et al. |
| 5,546,654 A | 8/1996 | Wojnarowski et al. |
| 5,557,501 A | 9/1996 | DiStefano et al. |
| 5,567,657 A | 10/1996 | Wojnarowski et al. |
| 5,576,680 A | 11/1996 | Ling |
| 5,578,874 A | 11/1996 | Kurogi et al. |
| 5,595,930 A | 1/1997 | Baek |
| 5,608,262 A | 3/1997 | Degani et al. |
| 5,610,431 A | 3/1997 | Martin |
| 5,612,570 A | 3/1997 | Eide et al. |
| 5,629,239 A | 5/1997 | DiStefano et al. |
| 5,629,241 A | 5/1997 | Matloubian et al. |
| 5,633,785 A | 5/1997 | Parker et al. |
| 5,642,261 A | 6/1997 | Bond et al. |
| 5,657,206 A | 8/1997 | Pedersen et al. |
| 5,659,952 A | 8/1997 | Kovac et al. |
| 5,661,087 A | 8/1997 | Pedersen et al. |
| 5,668,033 A | 9/1997 | Ohara et al. |
| 5,672,519 A | 9/1997 | Song et al. |
| 5,675,180 A | 10/1997 | Pedersen et al. |
| 5,677,200 A | 10/1997 | Park et al. |
| 5,677,569 A | 10/1997 | Choi et al. |
| 5,679,977 A | 10/1997 | Khandros et al. |
| 5,688,716 A | 11/1997 | DiStefano et al. |
| 5,703,400 A | 12/1997 | Wojnarowski et al. |
| 5,705,858 A | 1/1998 | Tsukamoto |
| 5,706,174 A | 1/1998 | Distefano et al. |
| 5,717,245 A | 2/1998 | Pedder et al. |
| 5,734,196 A | 3/1998 | Horton et al. |
| 5,744,752 A | 4/1998 | McHerron et al. |
| 5,747,870 A | 5/1998 | Pedder et al. |
| 5,757,074 A | 5/1998 | Matloubian et al. |
| 5,766,987 A | 6/1998 | Mitchell et al. |
| 5,787,581 A | 8/1998 | DiStefano et al. |
| 5,798,286 A | 8/1998 | Faraci et al. |
| 5,798,557 A | 8/1998 | Salatino et al. |
| 5,801,474 A | 9/1998 | Sakairi |
| 5,814,894 A | 9/1998 | Igarashi et al. |
| 5,817,541 A | 10/1998 | Averkiou et al. |
| 5,821,609 A | 10/1998 | DiStefano et al. |
| 5,830,782 A | 11/1998 | Smith et al. |
| 5,837,562 A | 11/1998 | Cho |
| 5,837,566 A | 11/1998 | Pedersen et al. |
| 5,849,623 A | 12/1998 | Wojnarowski et al. |
| 5,857,858 A | 1/1999 | Gorowitz et al. |
| 5,859,475 A | 1/1999 | Freyman et al. |
| 5,869,353 A | 2/1999 | Levy et al. |
| 5,869,887 A | 2/1999 | Urushima et al. |
| 5,869,894 A | 2/1999 | Degani et al. |
| 5,872,697 A | 2/1999 | Christensen et al. |
| 5,886,393 A | 3/1999 | Merrill et al. |
| 5,888,884 A | 3/1999 | Wojnarowski |
| 5,891,761 A | 4/1999 | Vindasius et al. |
| 5,892,417 A | 4/1999 | Johnson et al. |
| 5,895,233 A | 4/1999 | Higashi et al. |
| 5,895,972 A | 4/1999 | Paniccia |
| 5,900,674 A | 5/1999 | Wojnarowski et al. |
| 5,905,639 A | 5/1999 | Warren |
| 5,909,052 A | 6/1999 | Ohta et al. |
| 5,910,687 A | 6/1999 | Chen et al. |
| 5,913,109 A | 6/1999 | Distefano et al. |
| 5,915,168 A | 6/1999 | Salatino et al. |
| 5,915,752 A | 6/1999 | DiStefano et al. |
| 5,918,112 A | 6/1999 | Shah et al. |
| 5,920,142 A | 7/1999 | Onishi et al. |
| 5,926,380 A | 7/1999 | Kim |
| 5,929,517 A | 7/1999 | Distefano et al. |
| 5,938,452 A | 8/1999 | Wojnarowski |
| 5,952,712 A | 9/1999 | Ikuina et al. |
| 5,965,933 A | 10/1999 | Young et al. |
| 5,973,391 A | 10/1999 | Bischoff et al. |
| 5,976,913 A | 11/1999 | Distefano et al. |
| 5,985,695 A | 11/1999 | Freyman et al. |
| 5,986,746 A | 11/1999 | Metz et al. |
| 5,991,989 A | 11/1999 | Onishi et al. |
| 5,993,981 A | 11/1999 | Askinazi et al. |
| 6,002,163 A | 12/1999 | Wojnarowski |
| 6,005,466 A | 12/1999 | Pedder et al. |
| 6,011,330 A | 1/2000 | Goodman et al. |
| 6,020,217 A | 2/2000 | Kuisl et al. |
| 6,037,659 A | 3/2000 | Weixel |
| 6,040,235 A | 3/2000 | Badehi |
| 6,046,076 A | 4/2000 | Mitchell et al. |
| 6,046,410 A | 4/2000 | Wojnarowski et al. |
| 6,049,470 A | 4/2000 | Weale |
| 6,049,972 A | 4/2000 | Link et al. |
| 6,054,756 A | 4/2000 | DiStefano et al. |
| 6,072,236 A | 6/2000 | Akram et al. |
| 6,075,289 A | 6/2000 | Distefano |
| 6,080,596 A | 6/2000 | Vindasius et al. |
| 6,081,035 A | 6/2000 | Warner et al. |
| 6,092,280 A | 7/2000 | Wojnarowski |
| 6,093,888 A | 7/2000 | Laureanti et al. |
| 6,094,138 A | 7/2000 | Eberhardt et al. |
| 6,098,278 A | 8/2000 | Vindasius et al. |
| 6,100,594 A | 8/2000 | Fukui et al. |
| 6,104,272 A | 8/2000 | Yamamoto et al. |
| 6,121,676 A | 9/2000 | Solberg |
| 6,122,009 A | 9/2000 | Ueda et al. |
| 6,124,179 A | 9/2000 | Adamic, Jr. |
| 6,124,546 A | 9/2000 | Hayward et al. |
| 6,124,637 A | 9/2000 | Freyman et al. |
| 6,133,626 A | 10/2000 | Hawke et al. |
| 6,134,118 A | 10/2000 | Pedersen et al. |
| 6,140,144 A | 10/2000 | Najafi et al. |
| 6,156,652 A | 12/2000 | Michalicek |
| 6,156,980 A | 12/2000 | Peugh et al. |
| 6,165,814 A | 12/2000 | Wark et al. |

| | | | |
|---|---|---|---|
| 6,169,328 B1 | 1/2001 | Mitchell et al. | |
| 6,181,015 B1 | 1/2001 | Gotoh et al. | |
| 6,194,774 B1 | 2/2001 | Cheon et al. | |
| 6,214,644 B1 | 4/2001 | Glenn | |
| 6,218,729 B1 | 4/2001 | Zavrel, Jr. et al. | |
| 6,221,751 B1 | 4/2001 | Chen et al. | |
| 6,225,688 B1 | 5/2001 | Kim et al. | |
| 6,225,694 B1 | 5/2001 | Terui et al. | |
| 6,228,686 B1 | 5/2001 | Smith et al. | |
| 6,229,200 B1 | 5/2001 | Mclellan et al. | |
| 6,229,427 B1 | 5/2001 | Kurtz et al. | |
| 6,235,141 B1 | 5/2001 | Feldman et al. | |
| 6,238,949 B1 | 5/2001 | Nguyen et al. | |
| 6,238,950 B1 | 5/2001 | Howser et al. | |
| 6,249,039 B1 | 6/2001 | Harvey et al. | |
| 6,252,778 B1 | 6/2001 | Tonegawa et al. | |
| 6,255,714 B1 | 7/2001 | Kossives et al. | |
| 6,261,945 B1 | 7/2001 | Nye, III et al. | |
| 6,265,246 B1 | 7/2001 | Ruby et al. | |
| 6,265,763 B1 | 7/2001 | Jao et al. | |
| 6,274,937 B1 | 8/2001 | Ahn et al. | |
| 6,279,227 B1 | 8/2001 | Khandros et al. | |
| 6,281,570 B1 | 8/2001 | Kameyama et al. | |
| 6,285,064 B1 | 9/2001 | Foster | |
| 6,292,086 B1 | 9/2001 | Chu | |
| 6,297,551 B1 | 10/2001 | Dudderar et al. | |
| 6,309,910 B1 | 10/2001 | Haba et al. | |
| 6,310,386 B1 | 10/2001 | Shenoy | |
| 6,316,840 B1 | 11/2001 | Otani et al. | |
| 6,321,444 B1 | 11/2001 | Yatsuda et al. | |
| 6,323,735 B1 | 11/2001 | Welland et al. | |
| 6,326,689 B1 | 12/2001 | Thomas | |
| 6,326,696 B1 | 12/2001 | Horton et al. | |
| 6,326,697 B1 | 12/2001 | Farnworth | |
| 6,329,715 B1 | 12/2001 | Hayashi et al. | |
| 6,342,406 B1 | 1/2002 | Glenn et al. | |
| 6,344,688 B1 | 2/2002 | Wang | |
| 6,353,263 B1 | 3/2002 | Dotta et al. | |
| 6,362,525 B1 | 3/2002 | Rahim | |
| 6,366,629 B1 | 4/2002 | Chen et al. | |
| 6,368,896 B2 | 4/2002 | Farnworth et al. | |
| 6,373,130 B1 | 4/2002 | Salaville | |
| 6,376,279 B1 | 4/2002 | Kwon et al. | |
| 6,377,464 B1 | 4/2002 | Hashemi et al. | |
| 6,384,397 B1 | 5/2002 | Takiar et al. | |
| 6,387,747 B1 | 5/2002 | Cha et al. | |
| 6,387,793 B1 | 5/2002 | Yap et al. | |
| 6,396,043 B1 | 5/2002 | Glenn et al. | |
| 6,396,116 B1 | 5/2002 | Kelly et al. | |
| 6,396,470 B1 | 5/2002 | Zhang et al. | |
| 6,403,400 B2 | 6/2002 | Lin et al. | |
| 6,404,131 B1 | 6/2002 | Kawano et al. | |
| 6,420,208 B1 | 7/2002 | Pozder et al. | |
| 6,429,036 B1 | 8/2002 | Nixon et al. | |
| 6,429,511 B2 | 8/2002 | Ruby et al. | |
| 6,441,481 B1 | 8/2002 | Karpman | |
| 6,449,828 B2 | 9/2002 | Pahl et al. | |
| 6,452,238 B1 | 9/2002 | Orcutt et al. | |
| 6,459,150 B1 | 10/2002 | Wu et al. | |
| 6,472,727 B2 | 10/2002 | Miyazaki et al. | |
| 6,480,389 B1 | 11/2002 | Shie et al. | |
| 6,483,179 B2 | 11/2002 | Iizima et al. | |
| 6,492,194 B1 | 12/2002 | Bureau et al. | |
| 6,492,201 B1 | 12/2002 | Haba | |
| 6,493,231 B2 | 12/2002 | Nicholson et al. | |
| 6,493,240 B2 | 12/2002 | Broglia et al. | |
| 6,493,861 B1 | 12/2002 | Li et al. | |
| 6,498,099 B1 | 12/2002 | McLellan et al. | |
| 6,498,381 B1 | 12/2002 | Halahan et al. | |
| 6,521,987 B1 | 2/2003 | Glenn et al. | |
| 6,534,340 B1 | 3/2003 | Karpman et al. | |
| 6,548,911 B2 | 4/2003 | Yu et al. | |
| 6,550,664 B2 | 4/2003 | Bradley et al. | |
| 6,552,475 B2 | 4/2003 | Hori et al. | |
| 6,555,901 B1 | 4/2003 | Yoshihara et al. | |
| 6,562,647 B2 | 5/2003 | Zandman et al. | |
| 6,583,444 B2 | 6/2003 | Fjelstad | |
| 6,583,513 B1 | 6/2003 | Utagikar et al. | |
| 6,596,634 B2 | 7/2003 | Umetsu et al. | |
| 6,607,941 B2 | 8/2003 | Prabhu et al. | |
| 6,614,660 B1 | 9/2003 | Bai et al. | |
| 6,621,163 B2 | 9/2003 | Weekamp et al. | |
| 6,624,505 B2 | 9/2003 | Badehi | |
| 6,627,864 B1 | 9/2003 | Glenn et al. | |
| 6,627,985 B2 | 9/2003 | Huppenthal et al. | |
| 6,627,998 B1 | 9/2003 | Caletka et al. | |
| 6,646,289 B1 | 11/2003 | Badehi et al. | |
| 6,656,827 B1 | 12/2003 | Tsao et al. | |
| 6,657,296 B2 | 12/2003 | Ho et al. | |
| 6,664,624 B2 | 12/2003 | Haematsu et al. | |
| 6,670,206 B2 | 12/2003 | Kim et al. | |
| 6,670,215 B2 | 12/2003 | Miyazaki et al. | |
| 6,674,159 B1 | 1/2004 | Peterson et al. | |
| 6,678,167 B1 | 1/2004 | Degani et al. | |
| 6,693,361 B1 | 2/2004 | Siniaguine et al. | |
| 6,699,730 B2 | 3/2004 | Kim et al. | |
| 6,710,456 B1 | 3/2004 | Jiang et al. | |
| 6,713,856 B2 | 3/2004 | Tsai et al. | |
| 6,717,254 B2 | 4/2004 | Siniaguine | |
| 6,734,040 B2 | 5/2004 | Yamaguchi et al. | |
| 6,744,109 B2 | 6/2004 | Barton et al. | |
| 6,753,205 B2 | 6/2004 | Halahan | |
| 6,764,875 B2 * | 7/2004 | Shook | 438/106 |
| 6,768,190 B2 | 7/2004 | Yang et al. | |
| 6,784,020 B2 | 8/2004 | Lee et al. | |
| 6,787,916 B2 | 9/2004 | Halahan | |
| 6,798,070 B2 | 9/2004 | Funaya et al. | |
| 6,809,412 B1 | 10/2004 | Tourino et al. | |
| 6,818,545 B2 | 11/2004 | Lee et al. | |
| 6,822,324 B2 | 11/2004 | Tao et al. | |
| 6,830,877 B2 | 12/2004 | Ma et al. | |
| 6,849,916 B1 | 2/2005 | Glenn et al. | |
| 6,870,259 B2 * | 3/2005 | Silverbrook | 257/704 |
| 6,903,012 B2 | 6/2005 | Geefay et al. | |
| 6,903,883 B2 | 6/2005 | Amanai et al. | |
| 6,933,616 B2 | 8/2005 | Fang | |
| 6,940,158 B2 | 9/2005 | Haba et al. | |
| 6,955,943 B2 | 10/2005 | Zakel et al. | |
| 6,972,480 B2 | 12/2005 | Zilber et al. | |
| 6,982,475 B1 | 1/2006 | MacIntyre | |
| 6,995,462 B2 | 2/2006 | Bolken et al. | |
| 7,033,664 B2 | 4/2006 | Zilber et al. | |
| 7,164,199 B2 | 1/2007 | Tarn | |
| 7,265,440 B2 | 9/2007 | Zilber et al. | |
| 7,276,798 B2 | 10/2007 | Higashi et al. | |
| 7,754,537 B2 | 7/2010 | Haba et al. | |
| 7,791,184 B2 | 9/2010 | Wood et al. | |
| 2001/0005040 A1 | 6/2001 | Hong | |
| 2001/0009300 A1 | 7/2001 | Sugimura | |
| 2001/0013653 A1 | 8/2001 | Shoji | |
| 2001/0033478 A1 | 10/2001 | Ortiz et al. | |
| 2001/0042902 A1 | 11/2001 | Wakabayashi et al. | |
| 2002/0000646 A1 | 1/2002 | Gooch et al. | |
| 2002/0016024 A1 | 2/2002 | Thomas | |
| 2002/0017699 A1 | 2/2002 | Shenoy | |
| 2002/0056900 A1 | 5/2002 | Liu et al. | |
| 2002/0074668 A1 | 6/2002 | Hofstee et al. | |
| 2002/0089835 A1 | 7/2002 | Simmons | |
| 2002/0090803 A1 | 7/2002 | Salaville | |
| 2002/0102004 A1 | 8/2002 | Minervini | |
| 2002/0159242 A1 | 10/2002 | Nakatani et al. | |
| 2002/0170175 A1 | 11/2002 | Aigner et al. | |
| 2002/0179696 A1 | 12/2002 | Pattanaik et al. | |
| 2002/0195700 A1 | 12/2002 | Li | |
| 2003/0001252 A1 | 1/2003 | Ku et al. | |
| 2003/0017687 A1 | 1/2003 | Hembree | |
| 2003/0025204 A1 | 2/2003 | Sakai | |
| 2003/0038327 A1 | 2/2003 | Smith | |
| 2003/0047797 A1 | 3/2003 | Kuan et al. | |
| 2003/0052404 A1 | 3/2003 | Thomas | |
| 2003/0067073 A1 | 4/2003 | Akram et al. | |
| 2003/0077878 A1 | 4/2003 | Kumar et al. | |
| 2003/0102540 A1 | 6/2003 | Lee | |
| 2003/0133588 A1 | 7/2003 | Pedersen | |
| 2003/0148578 A1 | 8/2003 | Ku et al. | |
| 2003/0151139 A1 | 8/2003 | Kimura | |
| 2003/0159276 A1 | 8/2003 | Wakefield | |
| 2003/0168725 A1 | 9/2003 | Warner et al. | |

| | | | | | | |
|---|---|---|---|---|---|---|
| 2003/0211014 A1 | 11/2003 | Jacquorie et al. | | 2005/0236684 A1 | 10/2005 | Chen et al. |
| 2003/0218283 A1* | 11/2003 | Yasumura et al. ............ 267/136 | | 2005/0248680 A1 | 11/2005 | Humpston |
| 2004/0007774 A1 | 1/2004 | Crane, Jr. et al. | | 2005/0258518 A1 | 11/2005 | Yang et al. |
| 2004/0029356 A1 | 2/2004 | Timme et al. | | 2005/0279916 A1 | 12/2005 | Kang et al. |
| 2004/0041249 A1 | 3/2004 | Tsai et al. | | 2006/0023108 A1 | 2/2006 | Watanabe et al. |
| 2004/0069758 A1 | 4/2004 | Azdasht et al. | | 2006/0044450 A1 | 3/2006 | Wolterink et al. |
| 2004/0099917 A1 | 5/2004 | Greathouse et al. | | 2006/0081983 A1 | 4/2006 | Humpston et al. |
| 2004/0099938 A1 | 5/2004 | Kang et al. | | 2006/0091488 A1 | 5/2006 | Kang et al. |
| 2004/0104261 A1 | 6/2004 | Sterrett et al. | | 2006/0110854 A1 | 5/2006 | Horning et al. |
| 2004/0104470 A1 | 6/2004 | Bang et al. | | 2006/0141665 A1 | 6/2006 | Mohammed |
| 2004/0106294 A1 | 6/2004 | Lee et al. | | 2006/0166480 A1 | 7/2006 | Yun et al. |
| 2004/0115866 A1 | 6/2004 | Bang et al. | | 2006/0220234 A1* | 10/2006 | Honer et al. .................. 257/724 |
| 2004/0145054 A1 | 7/2004 | Bang et al. | | 2006/0278997 A1 | 12/2006 | Gibson et al. |
| 2004/0164981 A1 | 8/2004 | Fujita et al. | | 2007/0042527 A1 | 2/2007 | Tuckerman et al. |
| 2004/0166662 A1 | 8/2004 | Lei | | 2007/0138644 A1 | 6/2007 | McWilliams et al. |
| 2004/0188124 A1* | 9/2004 | Stark ........................... 174/52.3 | | | | |
| 2004/0217455 A1 | 11/2004 | Shiono et al. | | | | |
| 2004/0238934 A1 | 12/2004 | Warner et al. | | | FOREIGN PATENT DOCUMENTS | |
| 2004/0259325 A1 | 12/2004 | Gan | | EP | 0 585 186 A | 3/1994 |
| 2005/0017348 A1 | 1/2005 | Haba et al. | | EP | 0 828 346 | 3/1998 |
| 2005/0042805 A1 | 2/2005 | Swenson et al. | | EP | 1 071 126 A | 1/2001 |
| 2005/0062135 A1 | 3/2005 | Tase et al. | | EP | 1 357 741 A | 10/2003 |
| 2005/0067681 A1 | 3/2005 | De Villeneuve et al. | | GB | 2392555 | 3/2004 |
| 2005/0067688 A1 | 3/2005 | Humpston | | JP | 5047620 | 2/1993 |
| 2005/0082653 A1 | 4/2005 | McWilliams et al. | | JP | 07-202157 | 8/1995 |
| 2005/0082654 A1 | 4/2005 | Humpston et al. | | JP | 08-213874 A | 8/1996 |
| 2005/0085016 A1 | 4/2005 | McWilliams et al. | | JP | 11-026782 A | 1/1999 |
| 2005/0087861 A1 | 4/2005 | Burtzlaff et al. | | JP | 11-326366 | 11/1999 |
| 2005/0095835 A1 | 5/2005 | Humpston et al. | | JP | 2006-041277 A | 2/2006 |
| 2005/0104179 A1 | 5/2005 | Zilber et al. | | WO | WO-85/02283 | 5/1985 |
| 2005/0116344 A1 | 6/2005 | Humpston | | WO | WO-89/04113 | 5/1989 |
| 2005/0126472 A1 | 6/2005 | Popescu et al. | | WO | WO-95/19645 | 7/1995 |
| 2005/0139984 A1 | 6/2005 | Tuckerman et al. | | WO | WO-97/11588 A1 | 3/1997 |
| 2005/0142685 A1 | 6/2005 | Ouellet et al. | | WO | WO-02/058233 A | 7/2002 |
| 2005/0167773 A1 | 8/2005 | Ozawa et al. | | WO | WO-2004/017399 | 2/2004 |
| 2005/0170656 A1 | 8/2005 | Nasiri et al. | | WO | WO-2004/023546 | 3/2004 |
| 2005/0189622 A1 | 9/2005 | Humpston et al. | | WO | WO-2004/025699 | 3/2004 |
| 2005/0189635 A1 | 9/2005 | Humpston et al. | | WO | WO-2004/027880 A | 4/2004 |
| 2005/0205977 A1 | 9/2005 | Zilber et al. | | | | |

* cited by examiner

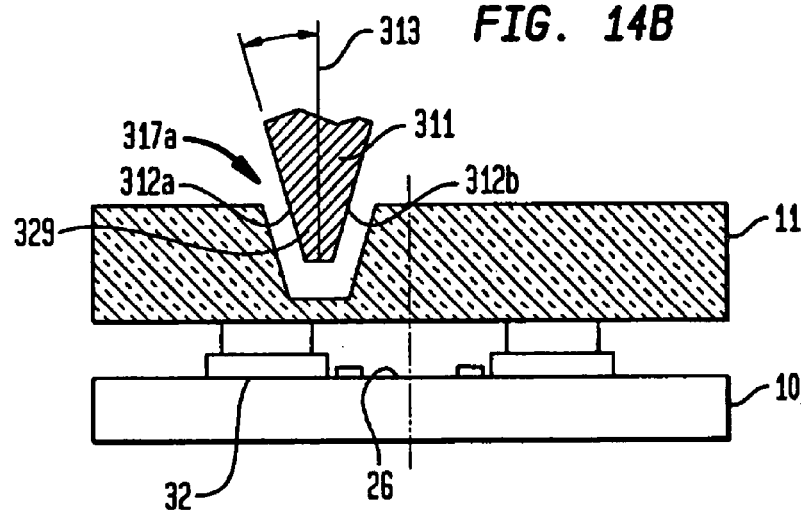
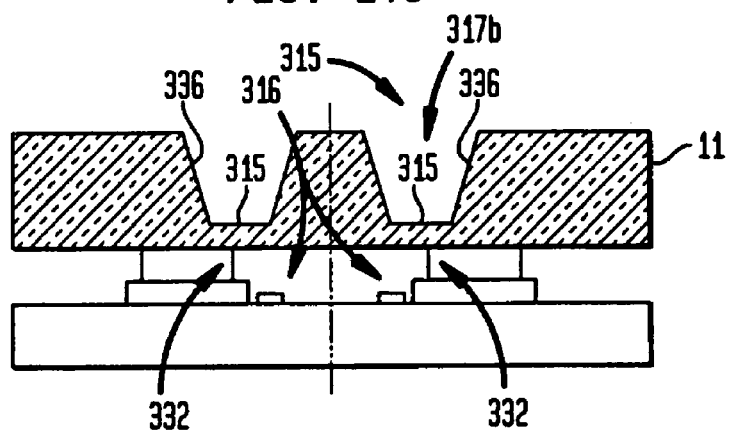
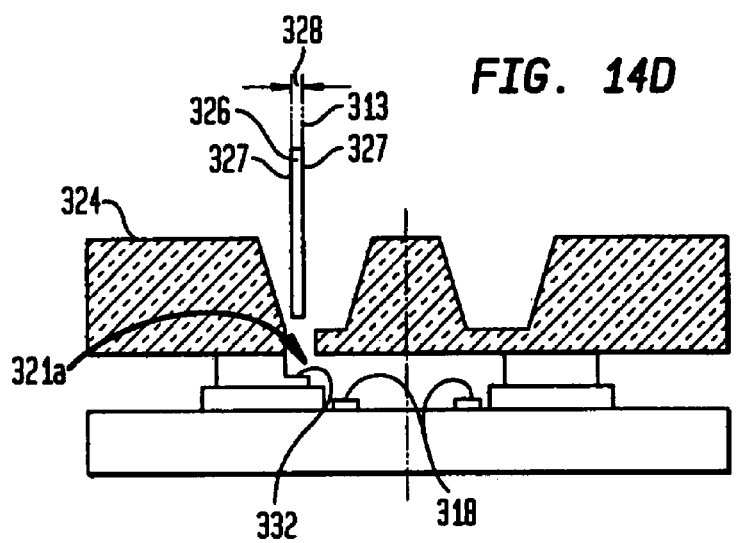

WAFER LEVEL CHIP PACKAGING

REFERENCE TO INCORPORATED APPLICATIONS

This application claims the benefit of the filing dates of U.S. provisional patent applications 60/761,171 filed Jan. 23, 2006 and 60/775,086 filed Feb. 21, 2006, the disclosures of which are hereby incorporated herein by reference. The disclosures of the following commonly owned United States patent applications and United States provisional patent applications are also hereby incorporated by reference herein: Ser. Nos. 10/711,945; 10/928,839; 10/948,976; 10/949, 575; 10/949,674; 10/949,693; 10/949,844; 10/949,847; 10/977,515; 11/016,034; 11/025,440; 11/068,830; 11/068, 831; 11/120,711; 11/121,434; 11/204,680; 11/319,836; 11/322,617; 60/632,241; 60/664,129; and 60/707,813. The following U.S. Patents are incorporated by reference herein: U.S. Pat. Nos. 5,716,759; 5,547,906; 5,455,455; and 6,777, 767.

BACKGROUND OF THE INVENTION

The present invention relates to microelectronic packaging. Microelectronic chips typically are thin, flat bodies with oppositely facing, generally planar front and rear surfaces and with edges extending between these surfaces. Chips generally have contacts on the front surface, which are electrically connected to the circuits within the chip. Certain chips require a protective element, referred to herein as a cap, lid or cover, over all or part of the front surface. For example, chips having optoelectronic devices, e.g., image sensors or light emitting devices and the like incorporate optically active regions on their front surfaces, which are best protected from physical and chemical damage by a cap, lid or cover.

Certain other types of devices such as microelectromechanical or "MEMS" chips include microscopic electromechanical devices, e.g., acoustic transducers such as microphones, which must be covered by a cap. The caps used for MEMS and SAW chips must be spaced from the front surface of the chip to an open gas-filled or vacuum void beneath the cap in the active area, so that the cap does not touch the acoustical or mechanical elements. Voltage controlled oscillators (VCOs) sometimes also require a cap to be placed over the active area.

Desirably, protective lids or caps are added to such units by processing which is efficient and which provides reliable protection for the sensitive devices early in the packaging process.

SUMMARY OF THE INVENTION

A method of making a plurality of lidded microelectronic elements is provided in accordance with an aspect of the invention. In accordance with such embodiment, a lid wafer is assembled with a device wafer. The lid wafer is then severed into a plurality of lid elements, such that, desirably, portions of the lid wafer overlying contacts at a front face of the device wafer adjacent to dicing lanes of the device wafer are removed. Desirably, the device wafer is severed along the dicing lanes to provide a plurality of lidded microelectronic elements.

In accordance with one or more preferred aspects of the invention, the assembling of the device wafer with the lid wafer includes applying an adhesive to at least one of the lid wafer or the device wafer and attaching the lid wafer to the device wafer with the adhesive.

In accordance with one or more preferred aspects of the invention, the adhesive is applied to overlie the contacts of the device wafer. Portions of the adhesive overlying the contacts may be removed after severing the lid wafer.

In accordance with one or more preferred aspects of the invention, the sawing of the lid wafer into lid elements results in edges of the lid elements being oriented at an angle with respect to a normal to the outer surface of the lid.

In accordance with one or more preferred aspects of the invention, the step of assembling the lid wafer with the device wafer includes supporting an inner surface of the lid wafer above a front surface of the device wafer.

In accordance with one or more preferred aspects of the invention, the contacts of the device wafer can be disposed in contact regions adjacent to the dicing lanes. The device wafer may further include device regions disposed between the contact regions which contain microelectronic devices. The step of supporting the inner surface of the lid wafer above the front surface of the device wafer may further include providing elongated structure between the front surface of the device wafer and the inner surface of the lid wafer. For example, the elongated structure may include walls separating at least some of the contact regions from the device regions.

In accordance with a particular embodiment, the step of severing the lid wafer may include a first sawing operation using a blade having an edge oriented at the angle with respect to a normal to the outer surface of the lid wafer to saw at least partially through a thickness of the lid wafer, then performing a second sawing operation with a blade having an edge aligned with the normal. Such sawing operation may be performed by sawing only partially through the thickness of the lid wafer.

As a result of the first sawing operation, edges of the lid elements may be aligned with the supporting walls, such that the second sawing operation cuts at least partially into the supporting walls. Desirably, the second sawing operation is performed at a much faster rate relative to the lid wafer than the first sawing operation.

In accordance with one or more preferred aspects of the invention, a support plate can be mounted to a rear face of the device wafer prior to severing the device wafer along the dicing lanes such that the lidded microelectronic elements include severed portions of the support plate.

In accordance with a preferred aspect of the invention, exposed corners of the microelectronic elements may be rounded by operations used to sever the device wafer into the lidded microelectronic elements. For example, the corners can be rounded by at least one process selected from the group consisting of mechanical grinding, laser ablation and plasma etching.

In accordance with another aspect of the invention, a turret can be mounted to the lid element of one of the lidded microelectronic elements such that chamfered edges of the turret mate with the angled edges of the lid element. Angled edges of the lid element may be used to align an optical element supported by the turret to be parallel to an active surface of an optoelectronic device of the microelectronic element. The optical element may include a lens and the optoelectronic device may include an imaging device.

In a particular embodiment, metallic first features on the front surface of the device wafer can be bonded to metallic second features on an inner surface of the lid wafer and the inner surface of the lid wafer can be bonded to the front surface after the first features are joined to the second features. Desirably, cavities between the front surface and the inner surface are hermetically sealed such that each of the plurality of lidded microelectronic elements includes a cavity.

In a particular embodiment, the first and second features can be diffusion bonded to each other. In one example, the metallic first features include bond pads of the microelectronic element. The metallic first features may have a first thickness in a vertical direction normal to the front surface and the metallic second features have a second thickness in a vertical direction normal to the inner surface. Desirably, the first thickness is greater than the second thickness and the sealant contacts vertical exterior surfaces of the first features above the front surface.

The step of providing the sealant may be performed by forcing the sealant through openings in at least one of the microelectronic element and the lid. Desirably, a barrier is provided at a periphery of the cavity between the front face and the inner surface, the barrier hindering entry of the sealant into the cavity.

A method of making a plurality of lidded microelectronic elements in accordance with another aspect of the invention in which a lid wafer is assembled with a device wafer. Desirably, tapered openings are formed which extend through a thickness of the lid wafer, each of the openings aligned to one or more contacts exposed at a front face of the device wafer. Desirably, the device wafer is then severed along the dicing lanes. The tapered openings may be formed using at least one process selected from the group consisting of: ultrasonic machining, ablation using an electromagnetic wave, etching, and local abrasion. In a particular embodiment, the tapered openings can be formed by ultrasonic machining using a tool having a tapered tool body operable to contact walls of the tapered opening. For example, the tapered openings can be formed by local abrasion and the local abrasion is performed by directing an abrasive through a nozzle towards the lid.

In accordance with another aspect of the invention, a method is provided for forming a plurality of lidded microelectronic elements. Desirably, a lid wafer is assembled with a device wafer to form a lidded device wafer. Portions of the lid wafer overlying contact regions of the device wafer are removed, the contact regions including rows of contacts disposed at a front face of the device wafer. The device wafer can then be severed along dicing lanes into lidded microelectronic elements each having a lid and at least one row of contacts exposed by the lid.

In a particular embodiment, the lidded device wafer can include a layer of an adhesive disposed between the front face of the device wafer and an inner surface of the lid wafer. The contact regions can be disposed adjacent to the dicing lanes. The adhesive may contact portions of the device wafer other than the contact regions. In a particular embodiment, the layer of adhesive may contact linearly extending portions of the device wafer adjacent to the dicing lanes. For example, the layer of adhesive may contact the linearly extending portions of the device wafer and expose the contact regions of the device wafer.

In a particular embodiment, the layer of adhesive may cover the contact regions of the device wafer including the contacts. Portions of the adhesive layer may be removed from the contacts after removing the portions of the lid wafer. Chemical or mechanical processing may be used to remove the portions of the adhesive layer.

The removal of portions of the adhesive layer may be performed by a process such as, for example, ashing, etching in accordance with photolithographic patterns, or dissolving the adhesive with a solvent.

In a particular embodiment, a first dielectric layer can be applied to the front face of the device wafer and a second dielectric layer be attached to the inner surface of the lid wafer. The operation of assembling the lid wafer to the device wafer may then be performed using an adhesive to join the first dielectric layer to the second dielectric layer. In a particular embodiment the adhesive is a flowable adhesive and the flowable adhesive is applied to an exposed surface of the second dielectric layer prior to joining the first dielectric layer to the second dielectric layer.

In accordance with a particular embodiment of the invention, a lidded microelectronic element is provided which includes a microelectronic element having a front face, an optoelectronic element at the front face. Desirably, a lid element is joined to the microelectronic element, the lid element overlying the optoelectronic element. Desirably, a rear face of the microelectronic element includes first features defining a plane of contact for the rear face and second features defining recesses in the rear face below the first features. Desirably, the recesses have sufficient volumes to contain an adhesive when the rear face is mounted with the adhesive to a surface of another element.

An assembly in accordance with a particular aspect of the invention can include the lidded microelectronic element and a circuit panel which has a major surface mounted to the rear face of the microelectronic element. Desirably, the adhesive is at least substantially free of voids.

In a particular embodiment, an interface between the rear face and the major surface has low thermal impedance. The rear face of the microelectronic element can be mounted to the major surface of a circuit panel, wherein the adhesive is at least substantially free of voids.

In a particular embodiment, a circuit panel having a major surface can be mounted to the rear face of the microelectronic element, wherein the rear face and the major surface are at least substantially parallel.

In accordance with another aspect of the invention, a method is provided for making a plurality of lidded microelectronic elements. In accordance with such method, a device wafer is provided which has a front surface and a plurality of contacts on the front surface. Desirably, an inner surface of a lid wafer is assembled to the front surface of the device wafer. Desirably, the lid wafer includes a first portion consisting essentially of inorganic material extending between the inner surface and an outer surface of the lid wafer and second portions including polymeric material disposed within openings in the first portion. Channels may be formed which extend through the second portions to expose rows of the contacts adjacent to dicing lanes of the device wafer. Afterwards, the assembled lid wafer and device wafer may be severed along dicing lanes into lidded microelectronic elements.

In a particular embodiment, the step of sawing may result in edges of the lid elements being oriented at an angle with respect to a normal to the outer surface of the lid. In one embodiment, the angle may be 20 degrees, for example.

In accordance with an aspect of the invention, a lidded microelectronic element is provided which includes a microelectronic element having a front face and a plurality of peripheral edges bounding the front face. A device region may be provided at the front face. The chip may further includes contact region including a plurality of exposed bond pads adjacent to at least one of the peripheral edges. A lid can be mounted to the microelectronic element above the device region such that at least some of the bond pads are exposed beyond edges of the lid. A support plate may be mounted below a rear face of the microelectronic element, the support plate underlying at least a portion of the rear face adjacent to the at least one of the peripheral edges.

In accordance with one or more particular aspects of the invention, the support plate may have annular shape and underlie portions of the rear face adjacent to all of the peripheral edges. In one embodiment, the dimensions of the support plate may equal the dimensions of the rear face.

In accordance with one or more particular aspects of the invention, the support plate can have a coefficient of thermal expansion at least approximately equal to a coefficient of thermal expansion of the microelectronic element.

In accordance with one or more particular aspects of the invention, the microelectronic element can include silicon and the support plate include at least one material selected from the group consisting of silicon, glasses, ceramics, nitrides of silicon, nitrides of aluminum, molybdenum and tungsten.

In accordance with an aspect of the invention, a microelectronic element is provided which has a front face and a plurality of peripheral edges bounding the front face. The microelectronic element desirably includes a device region at the front face. Desirably, the microelectronic element also includes a contact region including a plurality of exposed contacts adjacent to at least one of the peripheral edges, and support walls overlying the front face. A lid can be mounted to the support walls above the microelectronic element. Desirably, an inner surface of the lid confronts the front face. At least some of the contacts may be exposed beyond edges of the lid.

In accordance with one or more particular aspects of the invention, the support walls may be bonded by an adhesive to at least one of the front face of the microelectronic element or the inner surface of the lid. In a particular embodiment, edges of the support walls may be exposed beyond edges of the lid.

In accordance with one or more particular aspects of the invention, the support walls may include recesses. The recesses may extend in at least a lateral direction, i.e., a direction transverse to a normal direction with respect to the front face.

In accordance with one or more particular aspects of the invention, the microelectronic element may include an optoelectronic device in the device region, wherein the lid is at least partially transparent to energy at wavelengths of interest with respect to operation of the optoelectronic device.

In accordance with one or more particular aspects of the invention, the lid can include a plurality of peripheral edges. The edges may be oriented at an angle with respect to a normal to the front face of the microelectronic element. In a particular embodiment, the support walls may overlie a region of the microelectronic element between the device region and the contact region. In one or more embodiments, the microelectronic element can include an optoelectronic device and at least one second device and the support walls at least partially overlie the at least one second device.

In a particular embodiment, the support walls can be provided such that they do not overlie the optoelectronic device. The support walls may be such as to conduct heat between the at least one second device and the lid. In one or more embodiments, the support walls and the lid conduct heat between (i) a first one of the at least one second device at a first location of the microelectronic element and (ii) a second one of the at least one second device at a second location of the microelectronic element.

The packaged microelectronic element may be provided such that a material including at least one of a solid component or a liquid component is disposed between the device region at the front face and an inner surface of the lid. The material can include a solid component. The solid component may be such as to fill spaces between the device regions and the lid wafer. In a particular embodiment, the material includes a liquid component and the liquid component fills spaces between the device regions and the lid wafer. The material may be used to control a distance between a front surface of the device wafer and an inner surface of the lid wafer. The material may be such as to apply a stress to at least one of the lid wafer or the device wafer. Alternatively, or in addition thereto, the material may function to perform at least one of heat-spreading or impeding of heat-spreading. Alternatively, or in addition thereto, the material may have an optical property different from an optical property of the lid wafer. For example, the material may have a refractive index different from a refractive index of the lid wafer. Alternatively, or in addition thereto, the material may have a mechanical motion damping property. Alternatively, or in addition thereto, the material may increase dielectric strength between the lid wafer and the device wafer. In a particular embodiment, a portion of the liquid component can be included in liquid lenses between the device regions and the lid wafer. For example, a portion of the liquid component is included in microdroplets contacting the device regions, and the device regions include electrowetting devices operable to electrically alter shapes of the microdroplets.

In a particular embodiment, the support walls include an adhesive. Desirably, the packaged microelectronic element can include a dam extending from the front face of the microelectronic element between the device region and the contact region, the dam separating the adhesive from at least some of the contacts.

In accordance with another aspect of the invention, a packaged microelectronic element is provided which includes a microelectronic element. Desirably, the microelectronic element includes a device region and a contact region exposed at the front face, the contact region including a plurality of bond pads. A lid can be joined to the microelectronic element, the lid overlying the device region. A plurality of contacts are desirably exposed at a top surface of the packaged microelectronic element. The packaged microelectronic element may further include a plurality of conductive traces extending upwardly from the bond pads at least partly along walls of the packaged microelectronic element to the contacts.

In accordance with one or more particular aspects of the invention, the lid may include a plurality of openings exposing the bond pads, the walls include walls of the openings and the conductive traces extend in stripes along the walls of the openings. Desirably, at least some of the openings expose a plurality of the bond pads. The microelectronic element may further include a plurality of peripheral edges bounding the front face. Desirably, at least some of the openings extend from one of the peripheral edges a horizontal dimension of the front face to an opposite one of the peripheral edges.

In accordance with one or more particular aspects of the invention, the microelectronic element has a width in a widthwise horizontal dimension and a length in a lengthwise horizontal dimension. Desirably, at least some openings extend the width of the microelectronic element from a first one of the peripheral edges to a second, opposite peripheral edge of the microelectronic element. The microelectronic element has a length in a lengthwise horizontal dimension. Desirably, at least some openings extend the length of the microelectronic element from a first one of the peripheral edges to a second, opposite peripheral edge of the microelectronic element.

The lid may include a top surface and a plurality of peripheral edges extending downwardly from the top surface of the lid. The packaged microelectronic element may further include one or more dielectric elements overlying the contact regions and having an inner surface adjacent to one or more of the peripheral edges. Desirably, the one or more dielectric elements have at least one outer surface remote from the inner surface, where the at least one outer surface defines at least portions of the walls. Contacts may be exposed at top surfaces of the dielectric elements.

The lid may include a top surface and a plurality of peripheral edges extending away from the top surface of the lid. Contact regions of the microelectronic element are desirably exposed beyond the peripheral edges, and the walls may be defined by the edges of the lid.

An assembly may include a packaged microelectronic element in accordance with one or more above-described aspects of the invention and a circuit panel having a plurality of terminals. The terminals can be conductively connected through the contacts to the bond pads of the packaged microelectronic element. The terminals of the circuit panel may be disposed above the packaged microelectronic element. In such case, the contacts may be conductively connected to the terminals through wire bonds. The terminals of the circuit panel can be disposed above the packaged microelectronic element and the contacts are conductively connected to the terminals through masses of fusible conductive material. The fusible conductive material can be selected from the group consisting of solders, tin and eutectic compositions, for example. Terminals of the circuit panel may be disposed above the packaged microelectronic element and the contacts conductively connected to the terminals through a conductive adhesive.

In accordance with an aspect of the invention, a method for making a plurality of lidded microelectronic elements is provided. A supporting structure is desirably provided such that it overlies one of an inner surface of a lid wafer or a front face of device wafer. Desirably, the lid wafer is assembled with the device wafer by action including bonding an exposed surface of the supporting structure to the other one of the inner surface of the lid wafer or the front face of the device wafer. The lid wafer and the device wafer may then be severed into a plurality of lidded microelectronic elements, where each lidded microelement includes a lid element severed from the lid wafer and a microelectronic element severed from the device wafer. Each microelectronic element may include a device region and the supporting structure then include a plurality of walls which enclose the device regions of the plurality of microelectronic elements. In a particular embodiment, the contacts may be disposed in contact regions adjacent to edges of the microelectronic elements. For example, the device regions may be disposed between the contact regions. A plurality of walls may separate the contact regions from the device regions. In a particular embodiment, a sealant may be applied to edges of the lid elements and at least exposed surfaces of the adhesive after the step of severing.

One of the lidded microelectronic elements may be mounted to a circuit panel. The sealant may desirably be applied after the step of mounting to contact conductive interconnections between the lidded microelectronic element and the circuit panel. A sealant may be applied to overlie at least some of the contacts of the device wafer between edges of the lid elements prior to the step of severing.

In accordance with an aspect of the invention, a method is provided for making a plurality of lidded microelectronic elements. A device wafer is provided which has a front surface and a plurality of contacts on the front surface. Desirably, a lid wafer is mounted such that an inner surface of a lid wafer overlies the front surface of the device wafer. Desirably, the lid wafer includes a first portion consisting essentially of inorganic material extending between the inner surface and an outer surface of the lid wafer. Second portions including polymeric material may be disposed within openings in the first portion. Apertures may be formed which extend through the second portions in alignment with the contacts. Desirably, the assembled lid wafer and device wafer are severed along dicing lanes into lidded microelectronic elements.

In accordance with one or more particular aspects of the invention, the lid wafer may be assembled with the device wafer with an adhesive between a contact region of the device wafer and the inner surface of the wafer. The method may further include removing portions of the adhesive to expose the contacts after opening the aligned areas of the second portions. In a particular embodiment, the second portions may extend partially under a lower major surface of the first portion. The second portions may extend partially under a lower major surface of the first portion. The method may further include providing an adhesive between the front surface of the device wafer and opposing surfaces of the second portions. The second portions may extend a first distance in a normal direction down from a lower major surface of the first portion, the first distance being at least ten times a thickness of the adhesive.

In a particular embodiment, the apertures in the second portions are tapered such that the apertures become smaller in a direction from the outer surface towards the inner surface. Apertures may have an oval-shaped contour in a plane defined by the outer surface of the lid wafer. Desirably, each of at least some of the apertures being aligned with a plurality of the contacts. Adjacent ones of the apertures may have a first pitch smaller than a second pitch which would be realizable in adjacent ones of second apertures, were the second apertures to have been formed in the first portion, given the thickness and the material of the first portion.

In a particular embodiment, the first portion includes a plurality of island portions, each island portion spaced from each one of the island portions adjacent thereto by one of the second portions.

In accordance with one or more particular aspects of the invention, portions of the adhesive may be removed to expose the contacts after opening the aligned areas of the second portions.

In one embodiment, the adhesive may be provided to overlie a contact region of the device wafer and the method further includes removing portions of the adhesive to expose the contacts after opening the aligned areas of the second portions. In one embodiment, roller coating may be used to coat exposed surfaces of the second portions with the adhesive prior to assembling the lid wafer with the device wafer. The inorganic material may be at least substantially transparent, such as glass, for example.

In a particular embodiment, the lid wafer may be formed by steps which include forming a plurality of blind slots in the lid wafer from a first surface selected from one of the inner surface or the outer surface. A polymeric material may then be introduced into the blind slots. Desirably, a thickness of the lid wafer is reduced from one of the inner and outer surfaces other than the first surface until the polymeric material becomes exposed. In one embodiment, the thickness of the adhesive is less than about 5 microns.

In accordance with an aspect of the invention, a method is provided for assembling a semiconductor element including an optoelectronic device with a circuit panel. A vacuum head is aligned with an optoelectronic device on a front face of semiconductor element. Desirably, the alignment step is performed using light returning from a front face of the semiconductor element through an at least partially transparent lid element overlying the semiconductor element. The lidded semiconductor element may then be transported with the vacuum head to a mounting location on the circuit panel. The lid element may include an exposed outer surface. In a particular embodiment, vacuum head engages an exposed outer surface of the lid element and such exposed outer surface overlies the optoelectronic device in alignment with the optoelectronic device.

BRIEF DESCRIPTION OF THE DRAWINGS

FIGS. 14B-14E are partial sectional views illustrating stages in severing operations performed in accordance with an embodiment of the invention.

FIG. 50 is a sectional view through line 50-50 of FIG. 51 showing a packaged chip in accordance with an embodiment of the invention.

DETAILED DESCRIPTION

Figure 1:
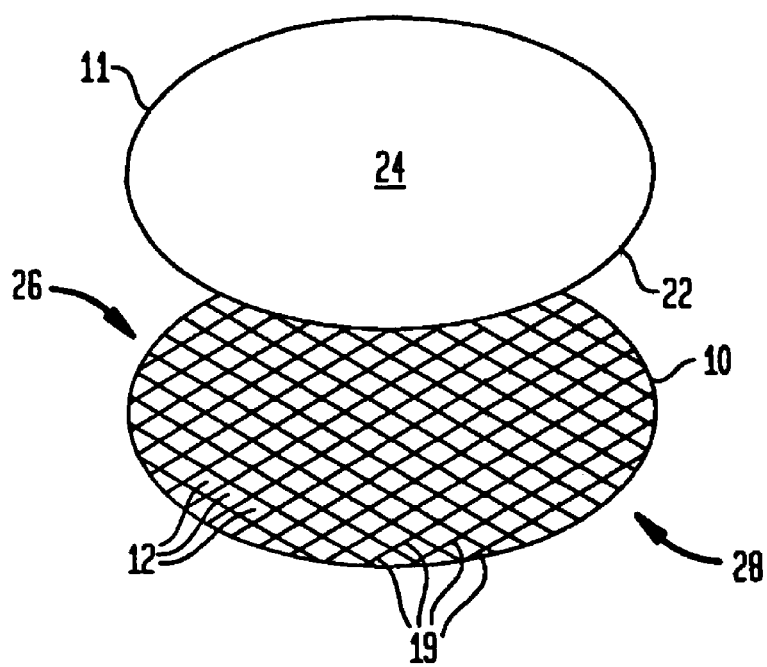
FIG. 1 is a perspective view illustrating a lid wafer and device wafer to be joined in a wafer-level packaging process in accordance with an embodiment of the invention.

Referring to FIG. 1, in a wafer-scale process according to one embodiment of the present invention, a lid wafer 11 is aligned to overlie a front face of a device wafer 10. The device wafer contains a plurality of microelectronic elements such as integrated circuits ("ICs") or micro-electromechanical ("MEMs") elements, such microelectronics and/or MEMs elements being referred to herein singly or collectively as "chips". Each such chip occupies a region 12 of the device wafer, each region 12 being attached to other regions at dicing lanes 19 which run in parallel and perpendicular directions across the front face of the device wafer.

The lid wafer is assembled in alignment with the device wafer to form a lidded assembly which defines cavities between the front face of the wafer and an inner surface 22 of the lid wafer, as will be further shown and described below. As initially attached to the device wafer, the surface of the lid wafer need not have been patterned previously. The lid wafer preferably has an essentially planar outer surface 24 which faces away from the front face of the device wafer 10. As initially mounted to the device wafer, the lid wafer preferably does not include through holes, channels, slots, recesses or other patterned openings which either protrude up above an outer (top) major surface of the lid wafer, or which extend inwardly towards the inner surface 22 of the wafer from the outer surface 24. In general, openings such as through holes, channels, etc. need not be formed in the lid wafer prior to its assembly to the device wafer. In a particular embodiment, some openings in the lid wafer are present prior to the lid wafer being assembled with the device wafer. In such case, the openings will be in addition to the openings that are formed later. Also, in a particular embodiment, instead of or in addition to having pre-formed openings, the lid wafer may include alignment marks for use in aligning the lid wafer with the device wafer.

Figure 2A:
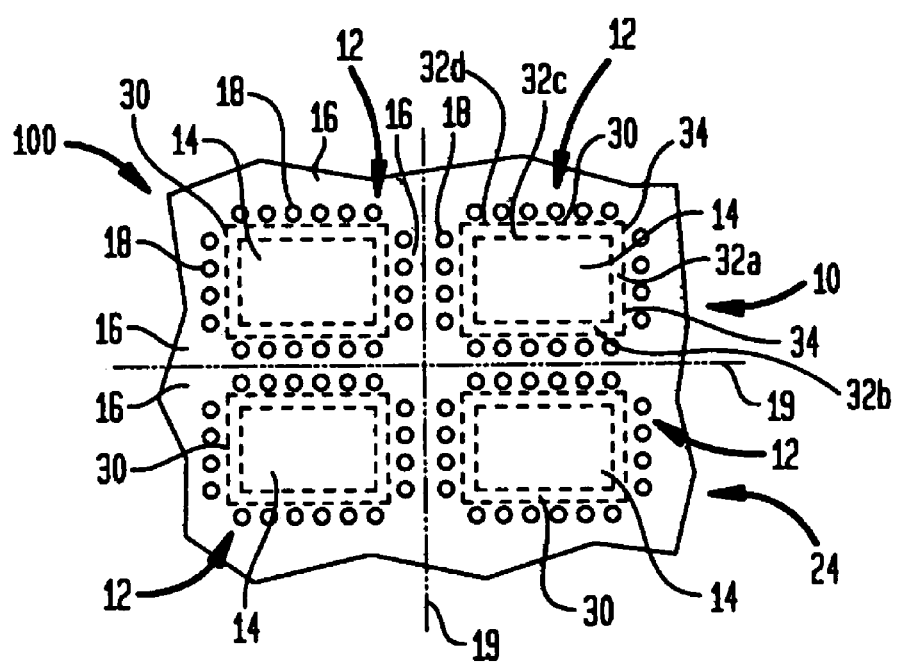
FIG. 2A is a fragmentary plan view illustrating a portion of a device wafer to be packaged.

FIG. 2A is a fragmentary plan view illustrating a small portion 100 of the wafer element for clarity of illustration. The wafer element 100 includes a large number of regions 12, each such region including a device region 14 or active area and a contact region 16 disposed outside of the active area, on one or more sides of the active area. Each device region 14 may include a portion of a microelectronic or micro-electromechanical element or specifically a chip. Preferably, each region 12 is bounded by lines such as dicing lanes 19 (FIG. 1) and is coextensive with the area of a chip. By "dicing lanes" is meant locations where the chips of the wafer are to be separated into individual chips by a subsequent dicing process such as sawing or scribing and breaking, regardless of how that subsequent process will be performed. The front surface of the wafer element 100 is seen in FIG. 2A. Each region 12 of the wafer 10 has exposed contacts 18 disposed in its contact region 16. In the particular embodiment depicted, the contacts 18 are disposed on all four sides of the active area, but contacts 18 may be provided on less than all sides of the active area 14. For clarity of illustration, the regions are demarcated by lines 19 at boundaries between adjacent regions, but these lines may not be visible in actual practice.

In the next stage of the process, the lid wafer 11 is assembled with the device wafer such that the lid wafer overlies the front surface 26 of the device wafer 10. Where the finished device is intended to function as an imaging or light-emitting unit, the lid wafer 11 preferably is transparent to radiation at the relevant wavelengths. For example, the lid wafer may include one or more materials selected from glasses, silicon, quartz and/or polymers, among others. The material composition of the lid wafer may be geared to filter particular spectral ranges, e.g., ultra-violet and/or infrared wavelengths and/or filtering or anti-reflective coatings may be applied to the surface of the lid wafer. In a particular embodiment, the lid wafer may include a mesh of glass fiber embedded in an appropriate transparent medium. Alternatively, the lid wafer may consist essentially of an optical grade polymer, for cost reduction. Lenses may be incorporated into the lid wafer. In the case of a polymer, lenses can be fabricated in the lid wafer by molding.

The lid wafer 11 desirably has a coefficient of thermal expansion substantially similar to the coefficient of thermal expansion of the device wafer 10. optionally, the lid wafer 11 may have one or more additional properties or structural features. For example, the lid wafer may be at least partially conductive in order to assist in providing electrostatic discharge ("ESD") protection. Optionally, the lid wafer may include at least one pore for permitting a flow or diffusion of material between an outer surface of the lid wafer and an inner surface of the lid wafer. In this embodiment, the lid wafer 11 is a flat sheet, having a planar inner surface 22 and a planar outer surface 24. The lid wafer 11 is assembled so that the inner surface 22 overlies and faces toward the front surface 26 of the device wafer 10. The device wafer 10 also has an oppositely-directed rear surface 28.

Figure 3A:
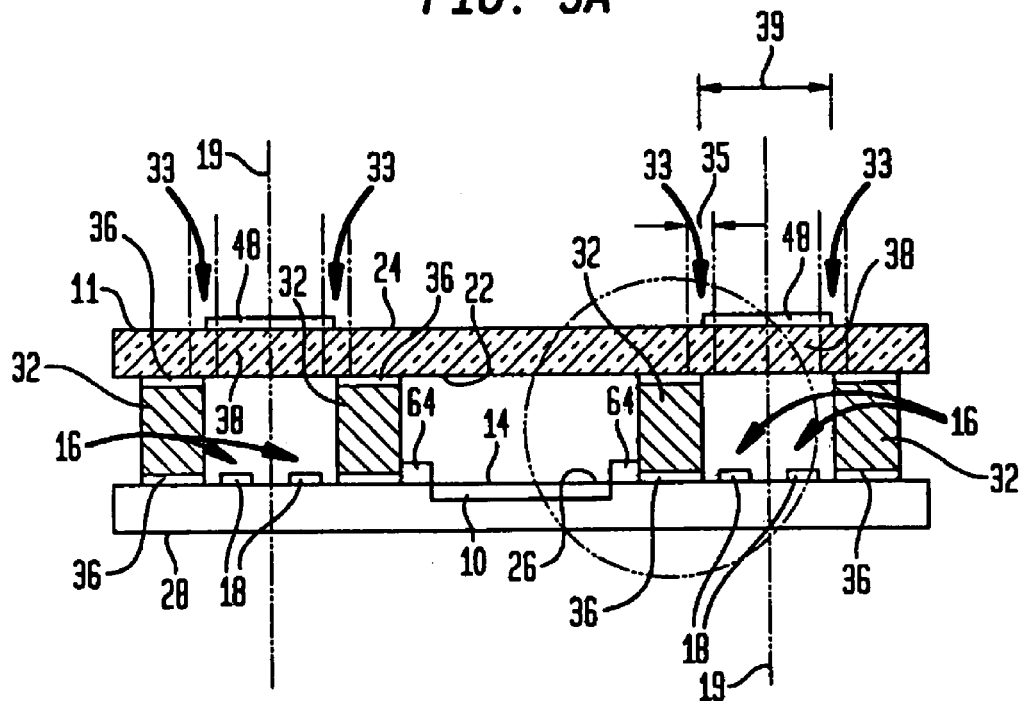
FIG. 3A is a partial sectional view illustrating a wafer-level method of packaging chips in accordance with an embodiment of the invention.

In the fragmentary sectional view illustrated in FIG. 3A, the lid wafer is mounted to the device wafer 10 with a plurality of spacing elements, i.e., "support structures" 32 or "spacers" supporting the lid wafer a desired distance above the device wafer. The support structures raise the inner surface 22 of the lid wafer to a desired distance above the front surface 26 of the device wafer. For example, support structures can raise the inner surface of the lid wafer a distance preferably between 5 microns and 600 microns. Preferably, the support structures are sufficiently rigid to maintain the inner surface of the lid wafer a predetermined distance above the front surface of the device wafer. In the case of an imaging device, the distance is preferably 40 microns. Generally, the support structures also perform a function to seal the volume overlying the device region 14 of each region, for example, to avoid contamination from particles, as in the case of an optoelectronic device, e.g., imaging device or optical emitting device. In a particular case, such as in case of a MEMs device, especially, a surface acoustic wave ("SAW") device, the supporting structures may hermetically seal such device from humidity and/or ingress of oxidation agents.

Figure 2B:
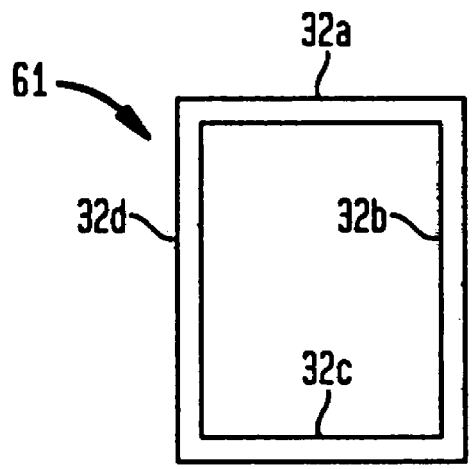
FIGS. 2B-2E are plan views illustrating contours of support wall structures for incorporation in lidded microelectronic elements in accordance with embodiments of the invention.

A preferred placement and contour of the support structures 30 in relation to device regions 14 are shown in dashed outline form in FIG. 2A. Preferably, each of the support structures 30 includes a continuous volume of material in form of a rectangular shaped ring 61 (FIG. 2B) when viewed in plan, such ring surrounding the device region to enclose the volume between the lid wafer and the device region of each chip. Another name for such rectangular support structure is a "picture frame ring seal" including a sealing medium which extends in a rectangular pattern between the device wafer and lid. Each support structure preferably includes four essentially straight walls, including a pair of parallel walls 32a, 32c, oriented in a first direction and another pair of parallel walls 32b, 32d oriented in a second direction at an angle, which may be a right angle. Alternatively, the support structure may have a bowed, e.g., circular or elliptical, appearance which lacks corners. Alternatively, in another embodiment, each support structure need not enclose the device region 14 entirely. In such embodiment, the support structure may have, for example two walls such as walls 32a, 32c supporting the lid wafer above the device region. In a particular example of such embodiment, contacts are disposed only in the contact region 16 adjacent to walls 32a, 32c. In still another embodiment, each support structure 30 surrounds the device region, but the continuity of each support structure 30 is interrupted by open spaces, such as to permit the flow or air or presence of device features extending between the device region and the surrounding contact region.

Figure 2C:
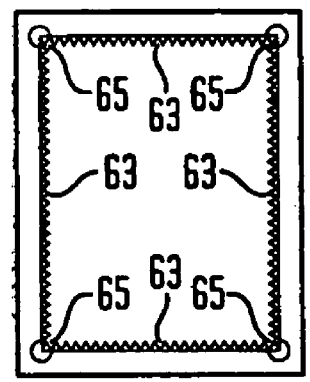
Figure 2E:
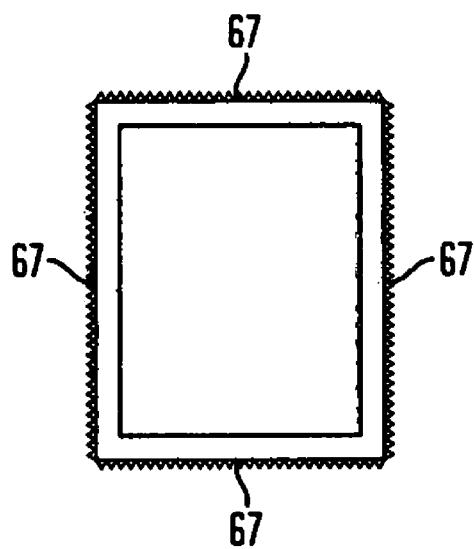
Figure 2D:
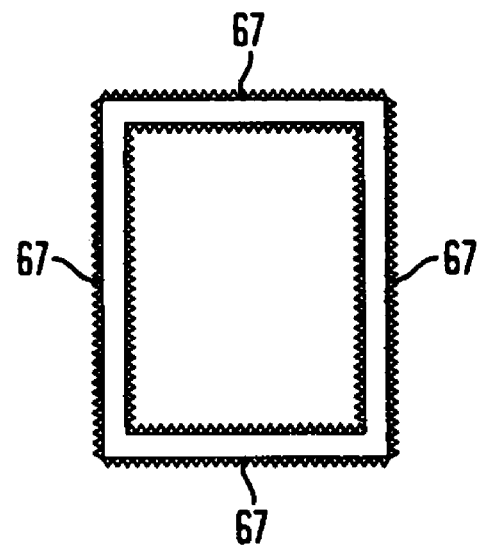

FIGS. 2C through 2E are plan views illustrating rectangular support structures according to variations of the embodiment of the invention. As illustrated in FIG. 2C, interior walls 63 of the support structure are fabricated to have an exposed roughened edge, for example, having a "saw tooth" appearance. The roughened edge helps avoid unwanted spreading of an adhesive used in bonding the support structure onto a device region of the chip. In addition, the roughened saw tooth edge can also increase the horizontal area over which the support structure extends, increasing the structure strength of the support structure. As also shown in FIG. 2C, corners 65 between the internal edges of the support structure are radiused. Radiused corners can act as traps to help avoid unwanted spreading of an adhesive applied thereto onto the device region of the chip. FIG. 2D illustrates a rectangular support structure according to a variation in which saw tooth edges 67 are provided on the exterior walls, in addition to the ones on the interior walls. Of course, another possible variation is for the saw tooth edges to be provided only on the exterior walls 67, as shown in FIG. 2E.

Figure 2F:
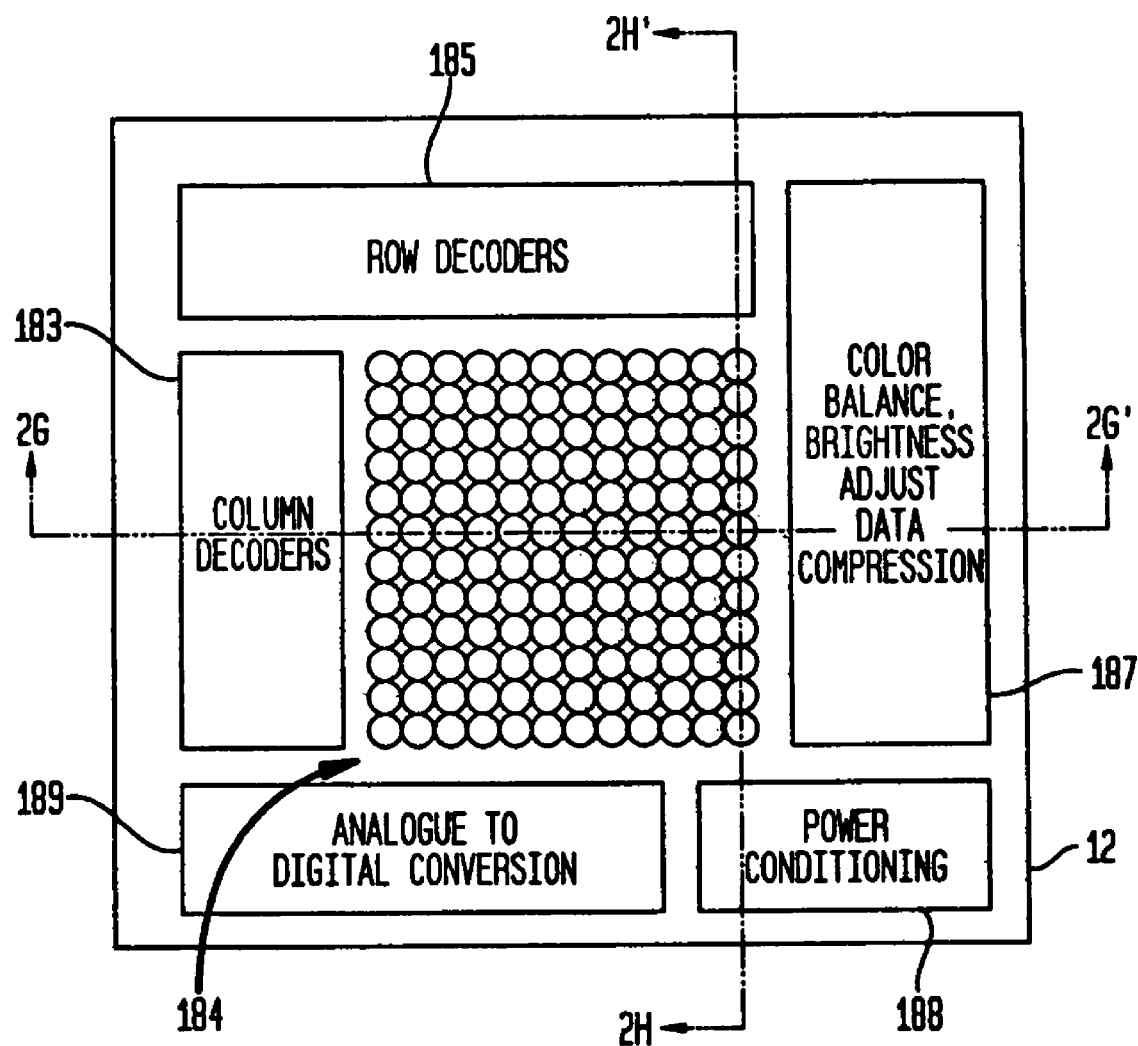
FIG. 2F is a plan view illustrating a particular microelectronic chip to be packaged in accordance with embodiments of the invention.

FIG. 2F is a plan view illustrating a chip 12 or other microelectronic element which may be a portion of a device wafer 10. As shown therein, an imaging device 184 is disposed at the front face of the chip, e.g., an imaging array such as a charge-coupled device ("CCD") array or other optoelectronic apparatus. The chip may be a multi-function chip having other functions integrated thereon. The additional circuitry include circuits which cooperate with the optoelectronic apparatus 184 of the chip. In an exemplary embodiment, additional circuitry includes column decoders 183, row decoders 185, circuitry for adjusting image quality 187, e.g., circuitry for adjusting color balance, brightness and data compression, as well as power conditioning circuits 188 and circuitry 189 for performing analog to digital conversion ("ADC circuitry"). With such functions integrated on a single chip 12, an image captured by the imaging array 184 is converted to digital form and processed before exiting the chip as a digital image signal.

The circuitry provided on the chip 12 can and typically does have different power densities. The imaging array 184 typically has a relatively low power density. Power density is a measure of average operating power dissipated by the chip per unit area of the chip. The imaging array 184 typically operates at a lower power density than digital logic circuits, especially the column and row decoder circuits 183, 185 and the image quality adjustment circuitry 187. The power conditioning circuitry 188 and the ADC circuitry 189 typically operate at a still higher power density due to the types of devices contained therein and power that such circuits typically consume at a steady operating state.

The devices which make up the imaging array can be sensitive to heat such that output of devices at particular locations of the imaging array can vary according to the temperature present at such locations. As a result, low light performance declines at locations of the imaging array which are hotter than others. Ultimately, various locations of the image can appear brighter or darker in accordance with the temperature present at the locations.

Figure 2G:
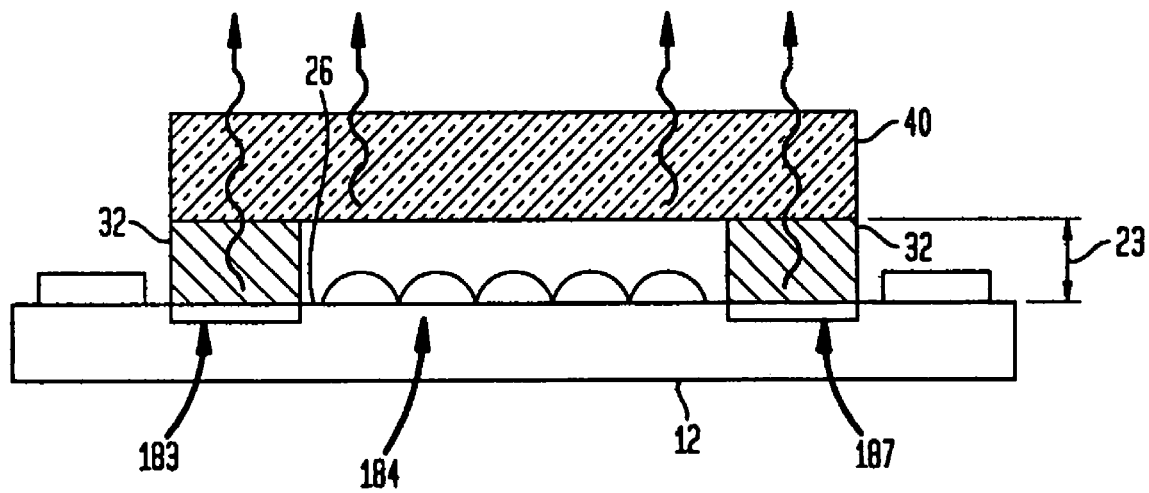
FIGS. 2G-2H are sectional views illustrating packaged chips in accordance with embodiments of the invention.
Figure 2H:
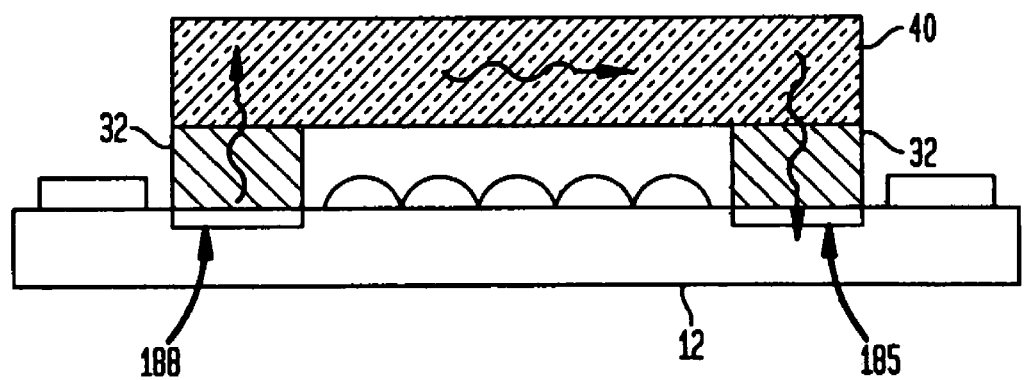

FIG. 2G illustrates a particular embodiment of the invention in which the support walls are positioned over the additional circuitry of the chip so as to assist in transmitting heat therefrom into the lid or cover element 40 of the package. In the sectional view of FIG. 2G, walls 32 illustrated therein overlie the column decoder circuits 183 and the image quality adjustment circuits 187, the walls 32 conducting the heat upwardly into the lid 40 and outward to a space external to the package. As illustrated in FIG. 2H, the walls and lid 40 may assist in reducing a gradient of thermal energy between the various circuits of the chip. For example, in the sectional view shown in FIG. 2H, heat can be conducted from a relatively hot portion of the chip, e.g., the power conditioning circuitry 188, through the lid 40 towards a cooler portion of the chip, such as to row decoder circuits 185.

Heat is transmitted efficiently through package materials which possess good thermal conductivity. For example, good thermal conductivity can be provided when the lid element 40 is constructed of quartz and the standoff walls 32 are constructed of a thermally conductive material, e.g., a thermally conductive adhesive. When the lid, standoff walls or both include polymeric materials, better heat conductivity can be obtained when the height of the standoff walls 32 above the front face of the chip is limited to about 50 microns or less.

In one embodiment, the support structures are formed from a flowable organic material which is deposited and cured in a supporting structure having the correct shape and dimensions. In one example, a curable polymer is molded, e.g., by injection molding, to form an assembly including a sheet of the support structures held on a releasable adhesive on a backing. The free surface of the support structures is then first attached to the inner surface of the lid wafer, or first attached to the device wafer by an adhesive 36 between the top surfaces or bottom surfaces of walls 32 of the support structures and the respective wafer. The releasable adhesive, e.g., peelable layer, opposite the side attached to the lid wafer or device wafer is then removed, and walls 32 of the support structures are then attached at ends by an adhesive 36 to the other one of the wafers to form the structure illustrated in FIG. 3A. In a particular embodiment, the adhesive is applied by a roller to the top or bottom surfaces of the walls 32 of support structures.

Alternatively, the support structures can be formed in place on the inner surface of the lid wafer prior to assembling the lid wafer with the support structures to the device wafer. For example, the organic material may include a polymer such as a photosensitive polymer which is curable by ultraviolet light ("UV settable polymer"). Alternatively, a photoresist or other selectively activatable polymer can be deposited onto the lid wafer and patterned to form the support structures shown in FIG. 3A.

Various other sealing materials such as adhesives and other polymers, glasses, especially low melting point glasses and frit glass, and fusible metallic materials such as solders, tin, and eutectic compositions and solder pastes can be used to form support structures, for example, a picture frame ring seal. Alternatively, support structures can be manufactured, as by molding, etching, machining, pressing, etc., and then mounted between the lid wafer and device wafer with a sealing material, such as a material listed above. When hermeticity is needed, suitable materials include silicon or other semiconductors, metals, sol gels, glasses and ceramics.

In another alternative, a sealing medium is selectively deposited onto the inner surface of the lid wafer only onto locations where the support structures are to be formed and the lid wafer is then joined to the device wafer. Rigid standoff elements 60 (FIG. 3C) may be used to space the inner surface of the lid wafer 11 a predetermined distance from the device wafer 10. The standoff elements can be incorporated into the area where the sealing material is provided or, alternatively be placed at other appropriate locations of the device wafer, such as in the contact region 16 where a standoff element 62 is provided. The composition of the rigid standoff element 60 is selected in accordance with the type of sealing medium used. For example, when the sealing medium is solder, the standoff element can include a metal which is wettable by solder such as copper which melts at a higher temperature than solder. In another example, when the sealing medium includes an uncured polymer, the standoff can include a hardened cured polymer.

Figure 3B:
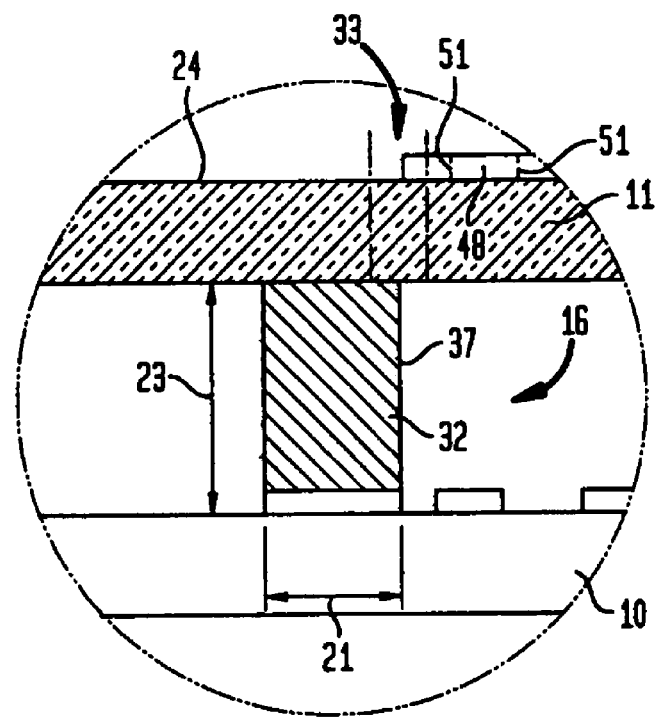
FIG. 3B is an enlarged sectional view corresponding to FIG. 3A.
Figure 3C:
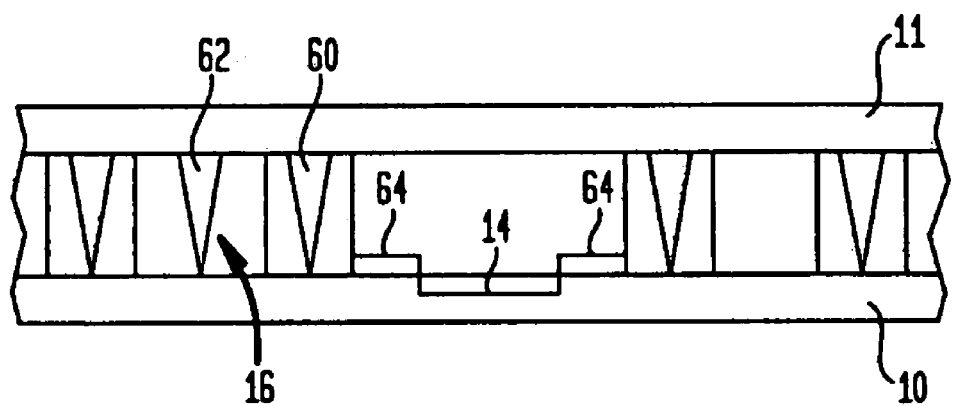
FIG. 3C is a partial sectional view illustrating a wafer-level method of packaging chips in accordance with a variation of the embodiment of the invention shown in FIG. 3A.
Figure 3D:
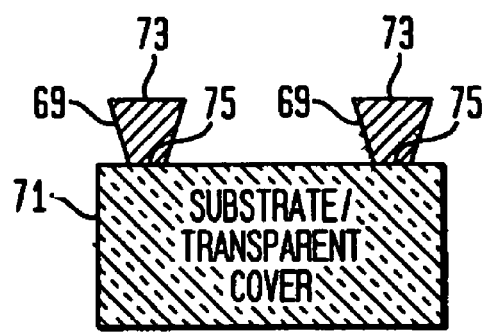
FIGS. 3D and 3E are sectional views illustrating lid wafers having attached support walls structures for incorporation in packaged chips according to an embodiment of the invention.
Figure 3E:
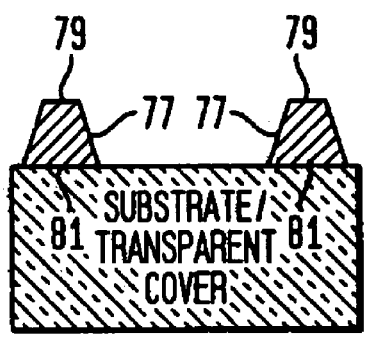

FIGS. 3D-3E are sectional diagrams which illustrate additional examples of the profiles of support structures which can be fabricated in place on the lid wafer 71. The support structures 69 shown in FIG. 3D have an inverse trapezoidal profile. When the lid wafer is inverted and attached to the device wafer, these structures are wider at the bottom face 73 which contacts the device wafer than at the top face 75. FIG. 3E illustrates alternative support structures 77 in which the structures 77 are narrower at the bottom face 79 than at the top face 81 contacting the lid wafer.

Standoff walls may be made of different materials, including but not limited to: metal, glass, alloy, polymer, crystalline material, electrophoretic material, or a combination thereof. In one embodiment, standoff walls include a photo-imageable polymer, such as solder mask, polyimide, SU8 or the cyclotene group polymers such as BCB. In this case, the walls may be constructed using photolithography. In a particular embodiment, standoff walls 32 include a solder mask material as a structural component. Standoff walls which include a solder mask can be advantageous. Polymeric materials such as solder mesh, for example, have good wetting properties with respect to adhesives. Materials commonly used as solder masks place less restrictions on the viscosity of the adhesive.

In the case where standoff walls 32 are constructed from a material that does not spread the adhesive uniformly all over the surface, better control may be needed to distribute the adhesive over standoff walls 32. Moreover, the following parameters may be addressed: viscosity of the adhesive, amount of the adhesive, and the adhesive application temperature.

While the foregoing description refers to a wafer featuring standoff walls, the adhesive-spreading method and corresponding device are also useful to perform wafer-level bonding of either rough or smooth elements, and elements other than standoff walls. Particular bonding methods such as diffusion, eutectic, adhesive, anodic bonding, and anodic sealing can be used to perform attach or bond protective layer 2 to the substrate. Optionally, an adhesion promoter may be used.

In an embodiment of the invention, standoff walls 32 are electrodeposited onto a conductive pattern, either on the front surface of the device wafer 10, the inner surface of the lid wafer 11 or both. In an embodiment of the present invention, the conductive pattern includes a layer of aluminum, such as deposited by sputtering followed by photolithographic patterning.

In another alternative embodiment of the present invention, standoff walls 32 are etched or ground into the material of the lid wafer 11 itself. Dry etching, for example, using plasma, or wet etching, for example using a solution including potassium hydroxide (KOH), or deep, reactive ion etching, among others, can be used to pattern the lid wafer 11 in this way.

Alternatively, it is possible to form the standoff walls as integral features of the lid wafer 11, using lithography and etching to remove portions of the lid wafer 11 where cavities are to be formed.

In another alternative embodiment of the present invention, standoff walls 32 are produced separately. In this case, the lid wafer 11, standoff walls 32 and device wafer 10 are attached together to produce the required cavities.

In another embodiment of the present invention, standoff walls 32 are formed in situ over the inner surface of the lid wafer from a material which remains sticky following the lithography process. In this case, it may not be necessary to use an adhesive to attach standoff walls 32; rather, in such case the exposed surfaces of standoff walls 32 are ready to be attached to device wafer 10.

In a particular embodiment, the lid wafer 11 is molded as an integral unit having a unitary construction to include standoff walls and cover portions which overlie cavities between the standoff walls.

In accordance with another embodiment of the present invention, standoff walls 32 are formed by photo lithographically patterning a layer of photo-imageable material overlying a substrate such as the device wafer, lid wafer or both.

Alternatively, the standoff walls can be formed by patterning a photo-imageable layer on a handle substrate and then transferring the patterned layer to one of the device wafer or lid wafer. In an embodiment of the present invention, the photo-imageable material includes epoxy.

Preferably, standoff walls include a low stress material. Photo-imageable polymers having inorganic fillers exhibit low stress and stability under thermal changes.

Standoff walls 32 may feature a variety of topography, patterns and materials. For example: straight standoff walls; zig-zag patterned standoff walls; and varied thicknesses, such as cone, pyramid steps in the height, and narrow or wide at the center.

A standoff wall having varied width may result either from a lithography process or from using more than one layer. A standoff wall having varied width can be beneficial in cases where a specific wetting angle is needed, wherein the use of a specific angle may help in obtaining the required wetting.

Silicon or any other crystalline material may be used to produce a standoff wall having varied width. The degree of the variation in width typically depends on the material type.

Using certain processes, e.g., plasma etching, it is possible to control an angle the standoff wall makes with the inner surface of the lid wafer to be between 45 to 90 degrees.

In an embodiment of the present invention, openings are made inside standoff walls 32. The openings are useful for applications that require the flow of fluids or gas.

In a particular embodiment, the lateral width 21 (FIG. 3B) of standoff walls 32 is between 50 and about 400 microns. An exemplary height 23 of standoff walls 32 above the front surface of the device wafer is between 10 and 400 microns.

Figure 3F:
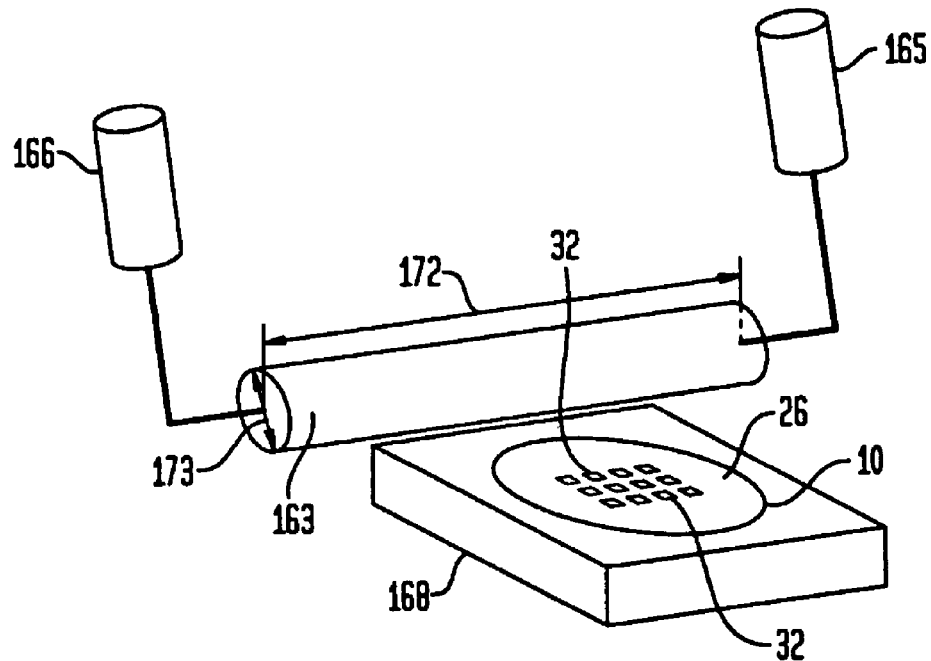
FIGS. 3F is a perspective view illustrating a roller coating method of applying an adhesive to support wall structures of a substrate in accordance with an embodiment of the invention.

Herein below adhesive-spreading methods and corresponding devices are described according to embodiments of the present invention. In an embodiment of the present invention, walls 32 (e.g. "standoff walls") of the support structure project upward from the surface of the device wafer 10 (FIG. 3A). Such device wafer is placed on a chuck 168, e.g., a backside vacuum chuck, with a face 26 of the wafer facing up and the adhesive is applied over the exposed top surfaces of the standoff walls 32 using a roller 163, (FIG. 3F). In a particular embodiment, the roller includes a handle 165 for use in holding the roller while manually applying the adhesive to the standoff walls. Optionally, the roller may include a second handle 166, to allow the roller to be held in both hands during use. Using the one or two handles, the operator rolls the adhesive-bearing roller over the exposed surfaces of the standoff walls on the wafer to apply an adhesive coating having uniform thickness to the standoff walls. In another variation, motion is imparted to the roller 163 by an external apparatus which rotates the roller while the roller contacts the standoff walls. Such apparatus can also be used to apply a measured downward force or "downforce" between the roller and the standoff walls of the wafer.

The disclosed method enables adhesive to be spread selectively over high topography areas. Preferably by such method, complete and uniform wafer-level adhesive-spreading is achieved over a complex pattern (such as the standoff walls pattern). When roller 163 is rolled over standoff walls 32, a predefined amount of the adhesive sticks to standoff walls 32. For example, an 8 micron (micrometer) thick adhesive layer is spread over standoff walls 32 by roller 163, and a 2 micrometer thick adhesive layer remains after bonding and curing. Preferably, the exposed surface of at least the standoff walls and/or the opposing bonding surface of the lid wafer or device wafer is rough. When the surface of the standoff walls and/or opposing surface of the device wafer or lid wafer is rough, adhesive strength is increased. However, when the surface of the standoff walls or of the wafer or both are rough, more adhesive may be required.

It is to be noted that the width 172 of roller 163 should be greater than the diameter 173 of wafer 10, and the diameter of roller 163 should be much larger than the lateral distance 39 (FIG. 3A) between adjacent standoff walls 32. In a variation of the above-described method, the standoff walls 32 are provided on the inner surface 22 of the lid wafer 11 or cover wafer. In such case, lid wafer 11 is held in place by the chuck 168, with the inner surface 22 of the lid wafer facing up, and the adhesive is applied to the exposed bottom surfaces of the standoff walls.

Preferably, the surface of roller 163 used to spread the adhesive on standoff walls 32 is made of a hard material in order to prevent dents, scratches and other deformations to roller 163. In order to achieve a uniform coating of the adhesive over standoff walls 32, desirably there should be no creases, folds or bends on the roller's surface. Therefore, using a roller made of a soft material can be problematic inasmuch as the roller might become damaged from falls or other impact. Structurally, the roller includes a core of hard material, which preferably is a metal, e.g., steel, aluminum or other such material, or alternatively, ceramic or stone material. Steel is less subject to scratching than aluminum, but the final coating or plating layer used over the core material can help to protect the core from scratching. In addition, the roller 163 preferably has substantial weight, such that during use, the force of gravity on the roller 163 applies pressure uniformly in a downward direction between the roller and the standoff walls. Optionally, there are applications—such as when adhesive is spread on high walls or applications that are not optical—in which a roller made of rubber may be used.

Preferably, roller 163, as a good applicator used in spreading adhesive over standoff walls 32, should provide good wetting of the adhesive to the surface of roller 163. In an embodiment of the present invention, the core material of the roller 163 is plated or coated with a metal having good wetting characteristics relative to the adhesive. For example, either chrome or titanium or a combination of layers of chrome and titanium have good wetting with respect to organic materials including adhesives such as epoxies which preferably are used in accordance with this embodiment of the invention. Good wetting of the adhesive to the roller is required for the adhesive to spread uniformly over the roller's exterior surface. Moreover, chrome coating improves the mechanical stability/hardness of the outer surface of the roller 163, an advantage for reducing the damage to the roller caused by the contact between roller 163 and standoff walls 32.

Optionally, roller 163 features a temperature control mechanism. As a result, the temperature of roller 163 may be controlled in a predefined interval. In an embodiment of the present invention, roller 163 is heated prior to use. Heating roller 163 prior to use can be advantageous. Heating the roller can help produce uniform and quick adhesive dispersion. However, a heated roller can cause the adhesive to more quickly polymerize, and as a result, the quality of the adhesion can be negatively affected. In an embodiment of the present invention, a roller that is at room temperature is used, and the type of adhesive used is selected according to the expected temperature of the roller.

Figure 3G:
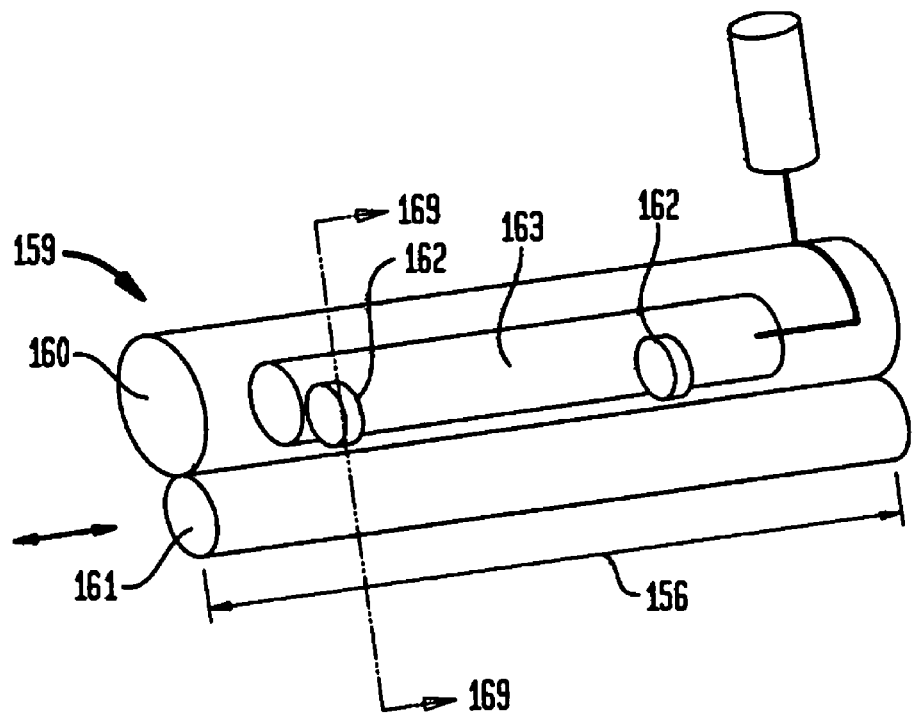
FIG. 3G is a perspective view of an apparatus for applying adhesive to a roller used in a roller coating method according to an embodiment of the invention.
Figure 3H:
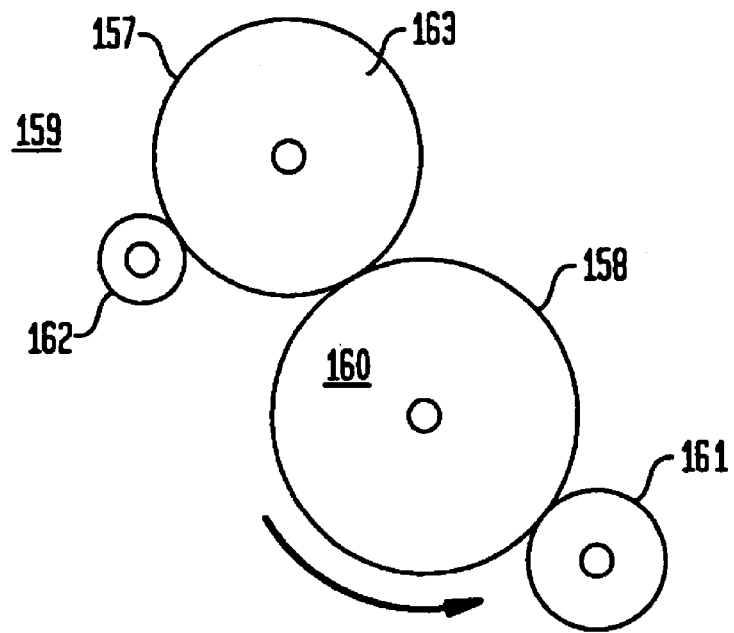
FIG. 3H is a corresponding sectional view through line 169-169' of FIG. 3G.

Achieving a uniformly thick adhesive coating on the standoff walls is best achieved when a uniformly thick coating of adhesive exists on the roller 163 prior to the roller contacting the standoff walls. An apparatus 159 used to coat the roller 163 to a uniform thickness will now be described, with reference to the perspective drawing of FIG. 3G and the sectional drawing of FIG. 3H, the section taken through line 169-169' of FIG. 3G. Referring to the sectional drawing in FIG. 3H, the apparatus 159 includes rollers 160, 161 and 162, all of which rotate during operation. Roller 160 preferably has at least a soft outer surface 158, preferably having a surface region of an elastomeric material or the roller 160 may be made entirely of a material which is elastomeric. The elastomeric material preferably includes rubber or other polymeric material. A soft material is less likely to damage the metal-coating at the outer surface 157 of the primary roller 163 and to absorb stresses in the event that the axes of the rollers 160 and 163 do not remain entirely parallel during operation. Moreover, a rubber adhesive-dispersing roller is used to ensure uniform pressure of the adhesive-dispersing rollers against each other. Uniform pressure helps achieve uniform dispersal of the adhesive and in avoiding frequent calibrations of the application device. Roller 161 functions as a pickup and distribution roller to pick up and/or distribute adhesive material in a direction of the width 156 of the rollers 160, 161. The pickup roller 161 is movable in an axial direction along its axis to distribute the adhesive along the width of the rollers 160 and 161. Alternatively, roller 160 is movable along its axis, or both rollers 160 and 161 are movable along their respective axes to distribute the adhesive. Preferably, roller 161 includes or consists essentially of a metal.

In an embodiment of the present invention, the axes of the adhesive-dispersing rollers 160, 161 are rigid, i.e., the two axes do not move when the adhesive is spread over the rollers' surface. Otherwise, the axes can move to accommodate the thickness of the adhesive, according to the properties of the adhesive.

In use, roller 163 is placed on roller 160 and pressure is applied thereto by two shorter and preferably smaller rollers 162, placed at opposite ends of the roller 163. Rollers 162 contact only areas of roller 163 that will not be in contact with the standoff walls of the wafer. Roller 160 carries a coating of wet adhesive material which is transferred to the roller 163. The coating of adhesive on roller 160 is achieved preferably by dispensing a predefined quantity of adhesive onto a pickup roller 161 which then transfers the adhesive to the roller 160. The rollers 160, 161 rotate on their axes to achieve a uniform coating of the adhesive on roller 160, for example, a uniformly thick coating of between about 5 microns and about 20 microns. While the roller 163 is placed on the apparatus 159, the two smaller rollers at ends of the roller 163 help apply pressure to roller 163. This keeps roller 163 in a proper position and applies pressure between roller 163 and roller 160 to help assure the uniformity of the adhesive coating achieved on roller 163.

Optionally, at first the adhesive-dispersing rollers are touching. The poured adhesive causes the adhesive-dispersing rollers to move away from each other, spreading the adhesive uniformly over the surfaces of the rollers. The amount of adhesive poured determines the thickness of the adhesive spread over the adhesive-applying roller.

Preferably, the adhesive-applying roller should be heavy enough to ensure that a uniform adhesive spread occurs, but a lightweight roller may be used if appropriate pressure is applied. Because the adhesive-applying roller usually is heavy, it is necessary to ensure that it is not damaged and/or scratched during the adhesive-dispersion process—when the adhesive-applying roller is brought into contact with the adhesive-dispersing rollers to spread the adhesive.

Before each time adhesive is applied to the primary roller 163, the apparatus 159 is cleaned including rollers 160, 161 and 162 and other associated parts. This helps to assure that a predefined amount of adhesive is uniformly applied to the roller. In an embodiment of the present invention, an adhesion promoter is used for improving the adhesion power.

In order to obtain uniform spreading of the adhesive over the roller, equal pressure on the surface of the roller has to be kept. In an embodiment of the present invention, one of the rollers is made of rubber, resulting in good pressure equalization. Moreover, in the case where one of the rollers is made of rubber, when the roller erodes, a homogeneous spreading of the adhesive can be achieved by increasing the pressure applied to the rollers.

The adhesive type, adhesive viscosity, and required thickness of the adhesive on the adhesive-applying roller all determine the length of time the rollers are rotating. For example, the rollers can be rotated for a predetermined period of time such as 90 seconds.

The methods and corresponding devices of the present invention for spreading the adhesive are not sensitive to the length of rotation time, as long as a homogeneous and/or uniform adhesive layer having the required thickness is obtained and the adhesive does not lose its bonding qualities during the spreading process.

The amount of adhesive spread over the rollers may be derived from one or more of the following parameters: the adhesive's characteristics, the wetting of the roller, the size of the surface area over which the adhesive is spread, the type of the application, and the thickness of the adhesive layer that should be spread over the roller. For example, between 0.5 milliliter and 3.0 milliliter of adhesive are spread on the roller in order to obtain a 5-micron layer of adhesive spread over standoff walls of a 200 mm (eight inch) wafer. An accordingly larger amount is used for wafers of 300 mm or 12 inch size.

The rollers may feature different materials, wherein the materials selections are determined by the wetting properties requirements and the surface-conforming properties requirements based on the adhesive's properties, as well as the surface properties of the surface on which the adhesive is applied. The roller's construction design may include multiple outer layers, for example in order to improve its mechanical stability.

Alternatively, it is possible to spread the adhesive using polished glass instead of the adhesive-dispersing roller as follows. The adhesive is spread onto a polished glass surface, and then the adhesive-applying roller is rolled over the glass surface until a uniform coating of adhesive is achieved over the roller's surface.

For example, using a robotic arm to move the roller in at least two directions to ensure that a uniform spreading of the adhesive occurs. In this case, the plane is defined by the variable 'X' and 'Y', and a few shifts are performed on the 'X' and 'Y' axes.

Figure 3J:
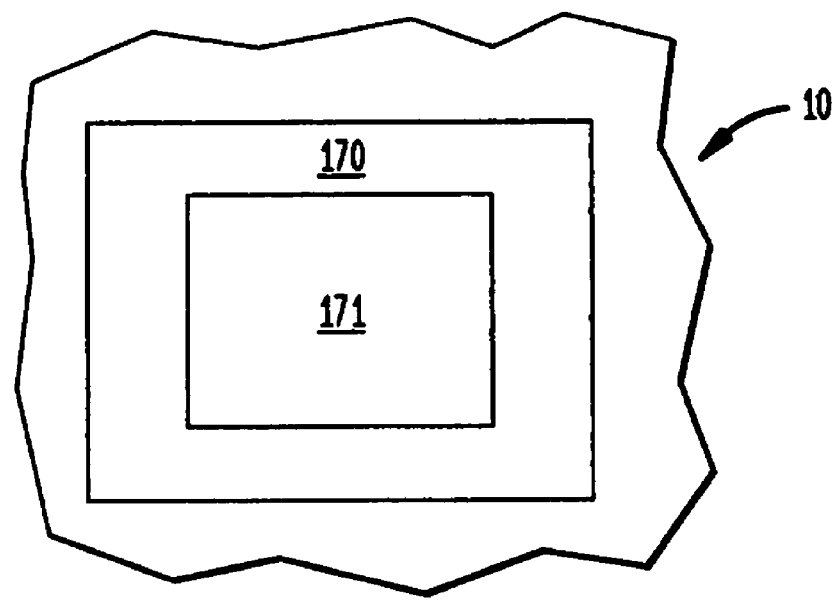
FIG. 3J is a fragmentary partial plan view of a microelectronic element to be packaged in accordance with an embodiment of the invention.

In an embodiment of the present invention, the wetting properties of device wafer 10 are suited to the adhesive type and bonding conditions. Referring to FIG. 3J, in an embodiment of the present invention, each microelectronic element of device wafer 10 features at least two areas having different wetting characteristics. Area 170 features good wetting for standoff wall bonding, whereas area 171 features lower wetting ability such that area 71 helps keep areas of the device wafer free of adhesive.

Optionally, oxygen plasma is used as a pretreatment process for improvising wettability of surfaces to be bonded using the above method.

The adhesive-applying roller is used to spread a layer of adhesive over standoff walls 32 by moving the roller in a first direction. Optionally, the adhesive spreading process can be repeated by moving the roller in the same direction or in a direction opposite to the first direction.

An additional adhesive layer can be spread over standoff walls by again rolling the roller 163 a second time over standoff walls. Optionally, the second process of spreading the adhesive over standoff walls is performed in a second, predefined direction, which is different than the first predefined direction. Optionally, the first and second predefined directions are approximately perpendicular.

Optionally, when standoff walls 32 create a square structure, the rolling direction of the roller is perpendicular and parallel to standoff walls 32.

In order to obtain a uniform coating of the adhesive over standoff walls, the viscosity level of the adhesive should be maintained within a predefined range, defined by the time after mixing. For example, a predefined waiting time of half an hour is needed before the adhesive can be used, after which the viscosity of the adhesive remains within the predefined range for bonding the lid wafer thereto for an additional quarter hour.

To protect certain devices such as optoelectronic devices, e.g., imaging devices and MEMs from contact with the sealing medium or adhesive used to bond the standoff walls, a guard ring 64 can be provided which has an exposed surface that is not wettable by the sealing medium. For example, when the sealing medium includes a polymer, a guard ring 64 (FIG. 3C) can be provided which includes a non-wettable material at the exposed surface such as polytetrafluoroethylene ("PTFE") commonly known as "Teflon®" (registered trademark of Dupont Corporation). When the sealing medium includes a solder, a guard ring having a non-wettable metal at the exposed surface will suffice. Optionally, the lid wafer may undergo drying prior to assembly with the device wafer in order to assure that no residual humidity remains which might interfere with the assembly process or the operation of the devices of the device wafer after assembly.

Once the lid wafer is assembled to the device wafer to form the structure shown in FIG. 3A, the device region 14 at the front surface 26 of each chip is protected against harm from dust or other particles or contaminants which may be present in the space external to the package. However, external interconnection remains to be made to bond pads 18 at the front surface of the device wafer. In the embodiment of the invention illustrated in FIG. 3A, processing is performed to expose the contact regions 16 of each chip while the chips remain attached to each other at dicing lanes 19.

Accordingly, portions 38 of the lid wafer which overlie the contact regions 16 are removed at this time to expose the contact regions. Later, after such portions 38 of the lid wafer are removed, the device wafer 10 will be severed at dicing lanes 19 into individual units, each unit including a chip and a portion of the original lid wafer. As further illustrated in FIG. 3A, using a saw, the lid wafer is now cut from the outer surface through to the inner surface in locations shown as saw lanes 33 on both sides of corresponding dicing lanes 19. The saw lanes 33 are shown having a width 35 representing the width of the cut produced by the saw.

Figure 4A:
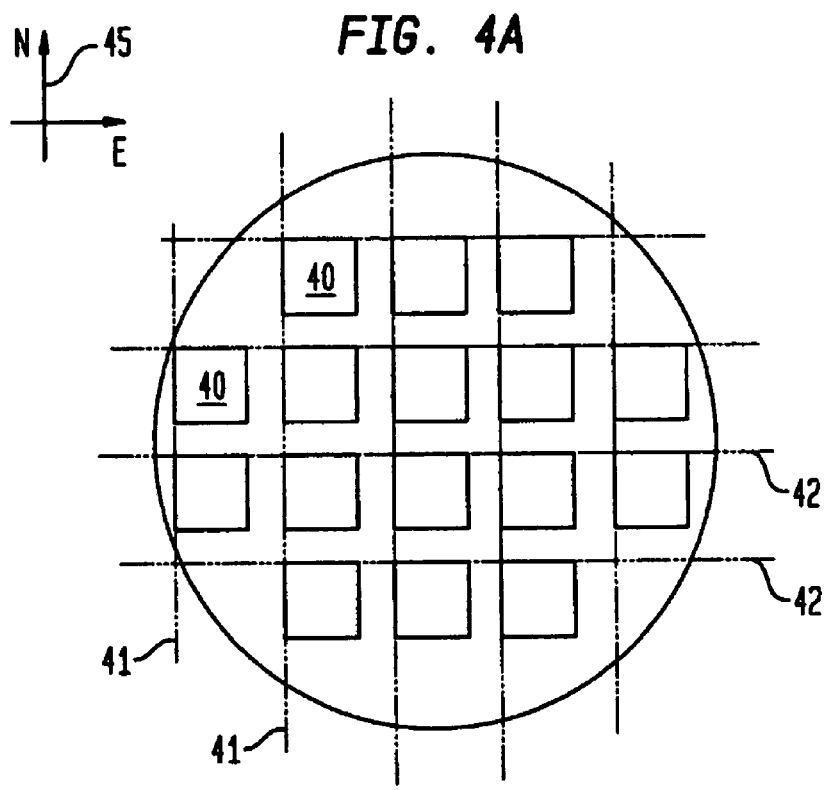
FIGS. 4A, 4B, 4C and 5 are plan views illustrating operations performed in a method of severing a lid wafer into individual elements in accordance with a packaging process according to an embodiment of the invention.
Figure 4B:
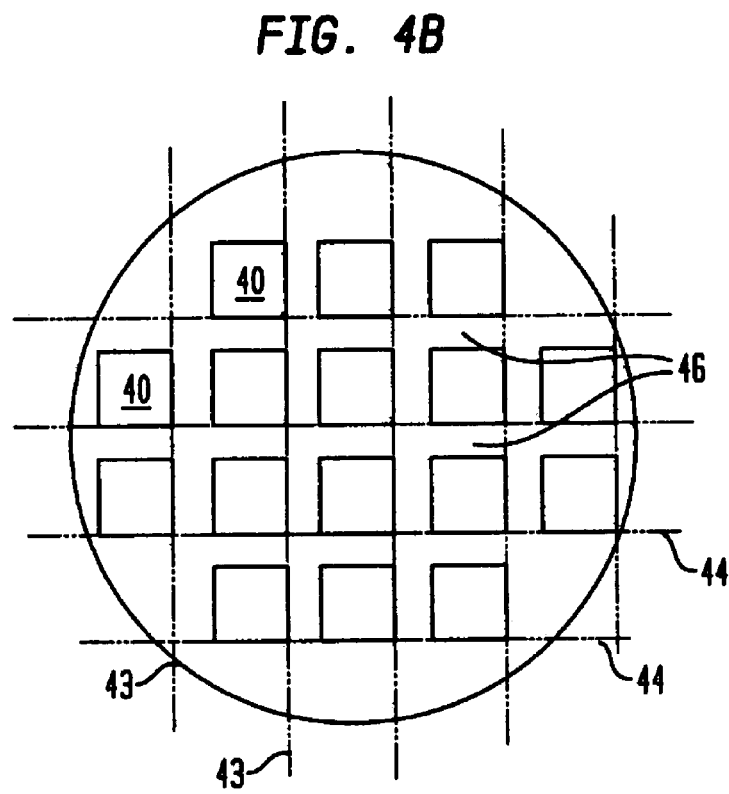
Figure 4C:
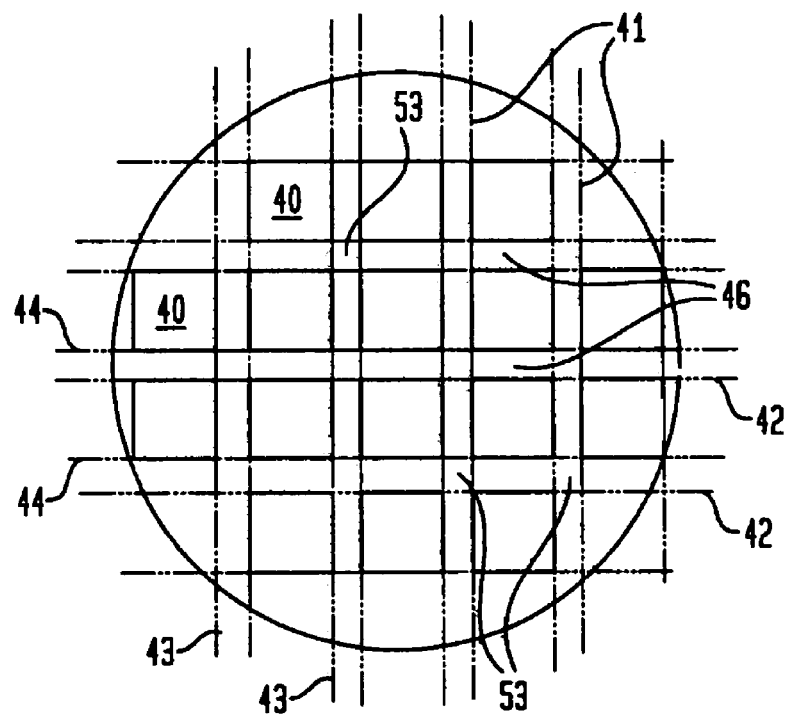

In one embodiment, as illustrated in FIGS. 4A and 4B, the portion of the lid wafer overlying each chip of the device wafer is cut four times so as to leave a plurality of spaced apart lid elements 40 overlying chips of the device wafer. As illustrated in FIG. 4A, first cuts 41 (FIG. 4A) in a vertical layout direction, i.e., along a "north-south" direction corresponding to that shown in legend 45, sever the lid wafer in such north-south direction along one side of the dicing lanes between each chip. Subsequently performed second cuts 43 (FIG. 4B) in the north-south direction sever the lid wafer into the lid elements and into remnant pieces from the cutting process between the lid elements. Similarly, in a horizontal layout direction, or "east-west" direction corresponding to the direction shown in legend 45 a first east-west cut 42 (FIG. 4A) severs the lid wafer in an east-west direction along a side of an east-west dicing lane. Later, a second east-west cut 44 (FIG. 4B) severs lid elements overlying the device region of each chip from remnant pieces 46 between the lid elements. Here, the directions North, South, East and West are not meant to represent true directions, but rather orthogonal directions parallel to the surface of the device wafer. Such directions are generally aligned with vertical and horizontal directions of the layout of conductive features or other features along a face of the device wafer. However, north-south and east-west directions can include any two orthogonal directions within or parallel to the planes defined by major surfaces of the device wafer or lid wafer. FIG. 4C is a diagram illustrating the results of making the saw cuts as described relative to FIGS. 4A-4B. Both of the east-west saw cuts 42, 44 and both of the north-south saw cuts are illustrated in FIG. 4C. Remnant pieces 46 of the lid wafer overlie portions of the device wafer between the adjacent support structures for side-by side units. In addition, portions 53 of the cover wafer occupy areas of the lid wafer at the intersections between the four saw cuts. Mechanical support is desirably provided during the sawing process for these particular portions. Methods and structures for providing such support is described below with respect to FIGS. 8A through 8D.

Moreover, while it is preferred and most common for features of chips such as bond pads and for cover elements to be laid out in orthogonal directions, it is not strictly necessary. Such elements can be laid out in non-orthogonal directions and the saw cuts can be made along such non-orthogonal directions.

Preferably, as shown in FIG. 3A, and as best seen in the enlarged view thereof in FIG. 3B, the saw lanes 33 at least partially overlap the support structures, such that a cut produced by sawing extends past an edge 37 of a wall 32 to at least partially overlie one of the support structures. The saw lanes may either partially overlap the walls of the support structures or fully overlie the walls. When the lid wafer includes a brittle, chippable material such as a glass, preferably the lid wafer is sawn in such overlapped saw lanes in order to reduce the movement of chips produced by the sawing process. The bond pads of the device wafer in the form as produced by a semiconductor fabrication facility typically have a thickness of 0.5 to 1.5 µm (microns). The small thickness makes the bond pads vulnerable to damage by objects such as chipped fragments and debris produced during the sawing process. Sawing a glass lid wafer at locations partially or fully overlying the walls of the support structures hinders or stops glass fragments from striking the bond pads, serving to protect the bond pads from potential damage. In addition, during or after sawing along one of the saw lanes 33, the walls 32 continue to support the cut or severed portion 38 of the lid wafer.

Preferably, the cut to be made by the saw is kept to a small width 35, such as by use of a saw blade having a small thickness. When the thickness of the saw blade is small, a smaller amount of loose material, i.e., fragments and particles is produced from the lid wafer and the support structures at the site of the cut. In addition, a smaller amount of material is required to be removed from the cutting site of the lid wafer than when the thickness is large. For this reason, sawing with a thinner saw blade can be performed at a faster feed rate because less material needs to be removed than when the saw blade is much thicker. Of course, the saw blade must have at least a minimum thickness appropriate for cutting the particular material of which the lid wafer is made, given the thickness between the outer and inner surfaces of the lid wafer. Glass, for example, typically requires a thicker saw blade than silicon. While acknowledging that minimum blade thickness is needed for cutting glass, a thin saw blade that is at or close to such minimum thickness is preferred for making the cuts 33 illustrated in FIGS. 3A-3B.

Figure 5:
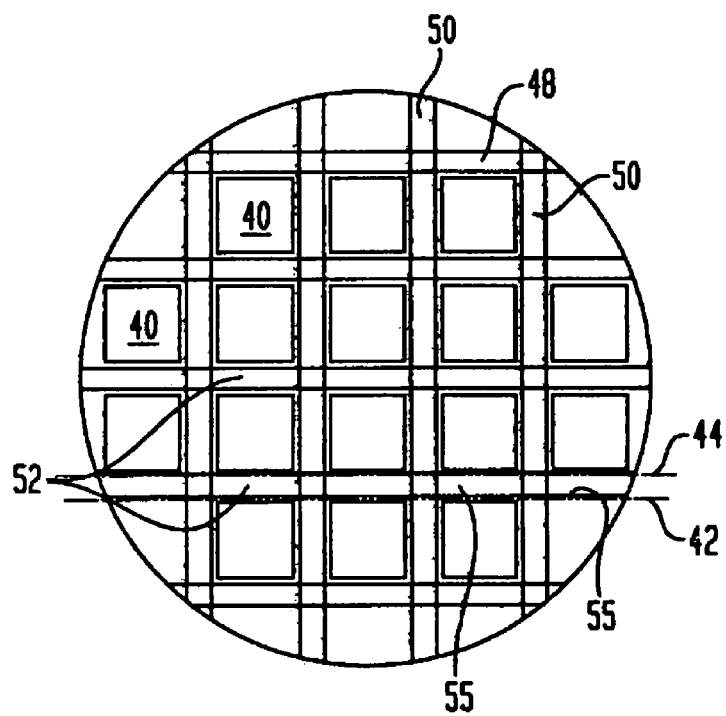

After sawing the lid wafer into pieces, further processing is performed to remove the remnant pieces of the lid wafer that remain between the lid elements that cover the individual chips. When the saw cuts are performed in locations which partly or fully overlie the walls 32 of the support structures, the walls provide mechanical support for the remnant pieces after completing the saw cuts. This helps avoid such remnant pieces from falling onto the contact regions 16 and becoming more difficult to remove or perhaps affecting the contact characteristics of the bond pads therein. In a preferred embodiment, an adhesive 48 overlying the outer surface of each of the remnant pieces facilitates their removal during a pick-up process during or after the sawing process. As shown in FIGS. 3A-3B, an adhesive layer 48 overlies an outer surface of the lid wafer, over the portions 38 to be removed during the sawing process. As best seen in FIG. 5, the adhesive layer 48 is provided in form of a grid pattern, having first portions 50 extending in a north-south direction over the lid wafer and second portions 52 extending in an east-west direction.

As seen in FIG. 3B, the adhesive layer may extend to partly within saw lanes 33. Alternatively, portions of the adhesive layer 48 extend in a grid pattern, having lines narrower than the width defined by parallel edges of the saw lanes 42, 44 (FIG. 5) and edges 55 between the edges of the saw lanes 42, 44. The adhesive layer is preferably formed prior to sawing the lid wafer. Preferably, the adhesive may be provided on the lid wafer prior to the lid wafer being assembled together with the device wafer. As best seen in the plan view of FIG. 5, the adhesive preferably only overlies portions of the lid wafer between or between and including parallel saw lanes, so as to form a grid pattern overlying the lid wafer. Following the lid sawing process, the adhesive is contacted by a pick-up device to remove the remnant pieces and expose the contact regions 16 (FIGS. 3A-3B) of the device wafer. For example, after sawing the exposed surface of the adhesive can be contacted by a roller, or contacted in a direction preferably normal to the outer surface 24 by a plate, or brush-like device causing the remnant pieces to selectively adhere to such device. Once the pieces are well away from the device wafer, they can then be removed from the pick-up device.

Subsequently, the device wafer is severed, such that the lidded device wafer is severed into a plurality of individual units, each unit containing one or more chips having an attached lid element. This can be done, for example, by sawing through the thickness of the device wafer along the dicing lines 19 (FIG. 3A), or by partially cutting, i.e., by scribing the bottom surface 28 of the device wafer along lines 19 and then breaking the device wafer along the scribed lines 19.

Figure 6A:
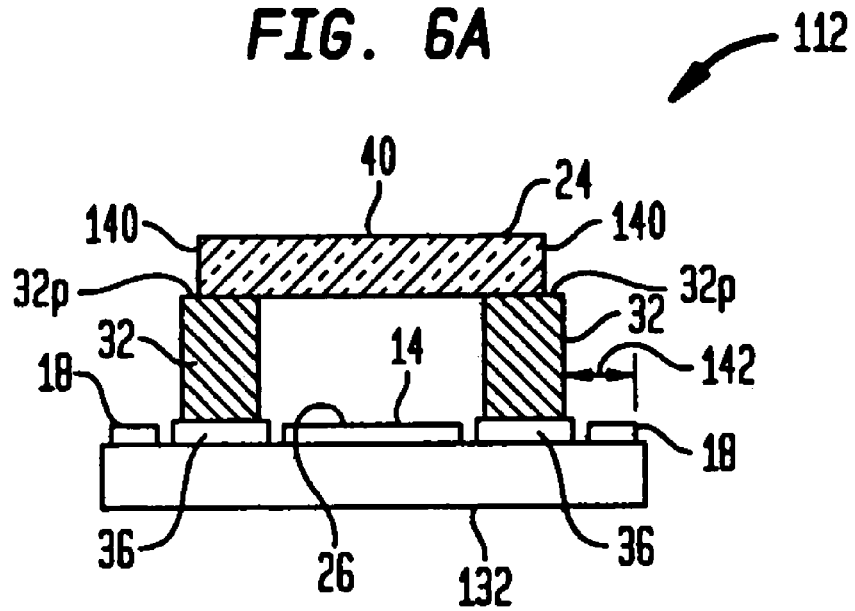
FIG. 6A is a sectional view illustrating a packaged chip in accordance with an embodiment of the invention.

FIG. 6A illustrates one such individual unit 112 resulting from the above-described process. As shown therein, unit 112 includes a chip 132 on which device region 14 is covered by lid element 40. The lid element 40 is supported at a predetermined spacing from the device region 14 by walls 32 of a support structure which preferably are bonded to the chip 132 by an adhesive 36 as described above. Bond pads 18 of the chip are exposed beyond edges of the walls 32 to permit conductive interconnection with other circuit elements, e.g., circuit panels or other microelectronic elements. Portions 32p of the walls are exposed beyond edges 140 of the lid element 40.

Figure 6B:
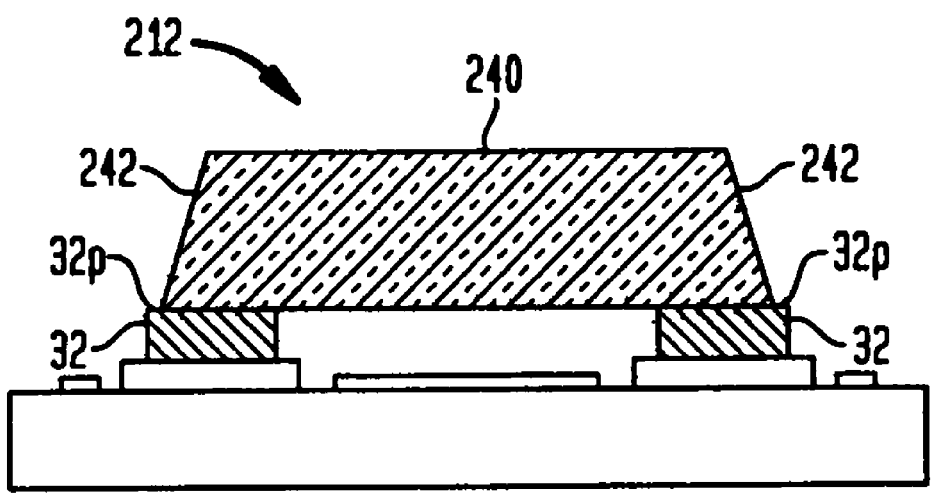
FIG. 6B is a sectional view illustrating a packaged chip in accordance with a variation of the embodiment of the invention shown in FIG. 6A.
Figure 16:
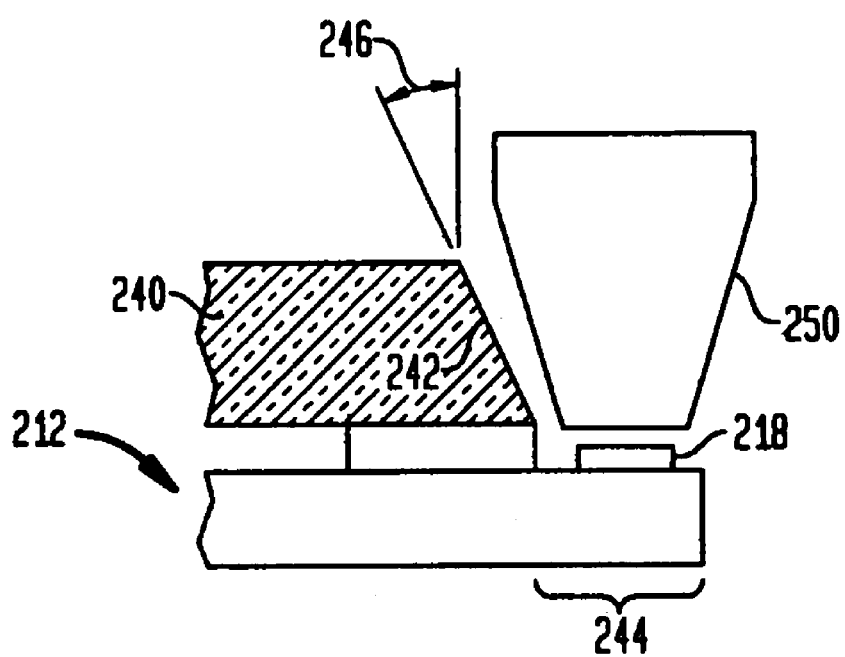
FIG. 16 is a fragmentary sectional view illustrating a method of attaching a bond wire to a packaged chip in accordance with an embodiment of the invention.

FIG. 6B illustrates an individual unit 212 according to a variation of the embodiment shown in FIG. 6A in which the edges 242 of the cover element 240 are sloped, as will be further described below with respect to FIG. 16.

In the embodiment shown in FIG. 6B, portions 32p of the walls 32a are exposed beyond the edges 242 of the cover element 240. These portions become exposed during the sawing process performed in accordance with the embodiment described above relative to FIGS. 3A-3B and 4A-4B. Specifically, these portions 32p of the walls 32 remain attached to the chip below the regions where the saw cuts through the cover wafer on both sides of the chip dicing lanes, as described with respect to FIGS. 3A-3B.

Figure 7A:
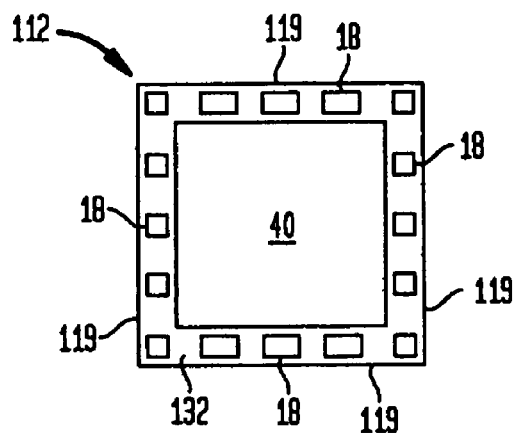
FIG. 7A is a plan view illustrating a packaged chip having exposed contacts arranged in accordance with a particular arrangement according to an embodiment of the invention.

FIG. 7A provides a top-down plan view of unit 112 looking towards the upper surface of lid element 40 and towards the front surface 24 of the chip 132. As shown therein, lid element 40 overlies only an interior portion of the chip 132 that is set back from each of the edges 119. Bond pads 18 adjacent to all four edges 119 of the chip are thus exposed.

Figure 7B:
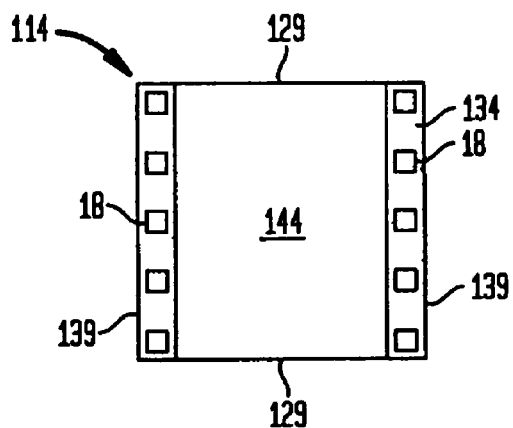
FIG. 7B is a plan view illustrating a packaged chip having exposed contacts arranged in accordance with a variation of the arrangement shown in FIG. 7A.

FIG. 7B is a top-down plan view illustrating an individual unit 114 having an alternative structure in which the lid element 144 extends all the way between two opposing edges 129 of a chip 134. In this case, sets of exposed contacts 18, e.g., bond pads are present and exposed only along certain other edges 139 of the chip. In the particular example shown, the contacts 18 are exposed along a particular two opposing edges 139 of the chip and no contacts are exposed along two other opposing edges 129.

Fabrication of unit 114 is similar to that described above, with exception that the process of making parallel cuts between pairs of adjacent chips is performed only with respect to edges of the chips which are aligned in certain directions. With particular reference to FIGS. 4A-4B, parallel saw cuts, e.g., cuts 41, 43, for example, are performed only in the north-south direction, for example. In such case, the parallel cuts 42, 44 in the east-west direction, for example, are not performed. Instead, only one saw cut is made in the east-west direction to separate the lid wafer at edges 129 of each chip. In addition, the single east-west saw cut between adjacent chips can be performed either during the time of making the north-south saw cuts, or more preferably, later when severing the device wafer into individual units.

During sawing operations, a net may be spread over the area surrounding the lid wafer, device wafer and associated tooling to prevent relatively large pieces of the lid wafer from being dispersed in different directions. In an exemplary embodiment, the net has openings in which the longest dimension of the openings is no greater than 0.5 mm.

Prior to or after severing the device wafer into individual units, material, e.g., chips, particles or other pieces of the lid which remain or other foreign material are removed via one or more cleaning procedures. For example, a liquid, air or other gas can be used to rinse or jet particles, chips or other foreign matter remaining from the prior sawing operation that contacts the device region and walls of the support structures. Such procedure is preferably performed prior to severing the device wafer into individual units. Alternatively, the procedure can be performed after the device wafer is severed.

Figure 8A:
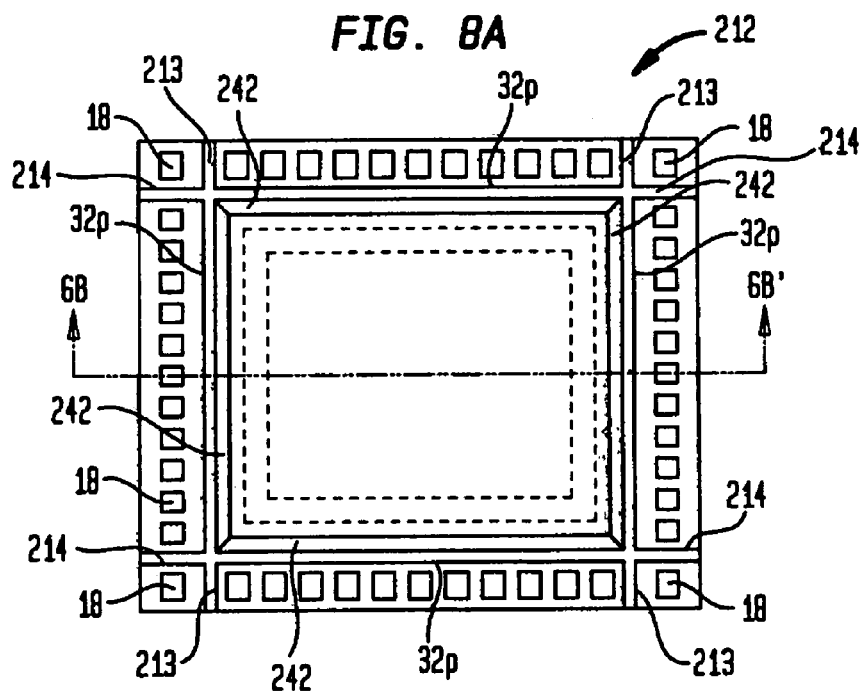
FIGS. 8A, 8B and 8C are plan views illustrating a portion of a device wafer on which support wall structures having a particular placement and construction are provided.

As noted above, one concern for the process according to this embodiment of the invention (FIGS. 3A through 4B), is to maintain adequate support for portions of the cover wafer when the cover wafer is sawn in areas overlying portions of the walls of the support structures. FIG. 8A is a top-down plan view illustrating an individual unit 212 as illustrated in the sectional view of FIG. 6B through line 6B-6B'.

As best seen in FIG. 8A, portions 32p of the walls of the support structure are exposed beyond the sloped edges 242 of the unit. These portions support the sawn or severed portions of the lid wafer during the process of removing them from the lid wafer. Without support, if the saw blade were allowed to pass through an unsupported portion of the lid wafer, stresses exerted upon such portion of the cover wafer could cause it to twist and bend, and sometimes cause the lid element overlying the chip to crack or break in addition to generating unwanted pieces of debris that can harm the bond pads of the chip.

Figure 8B:
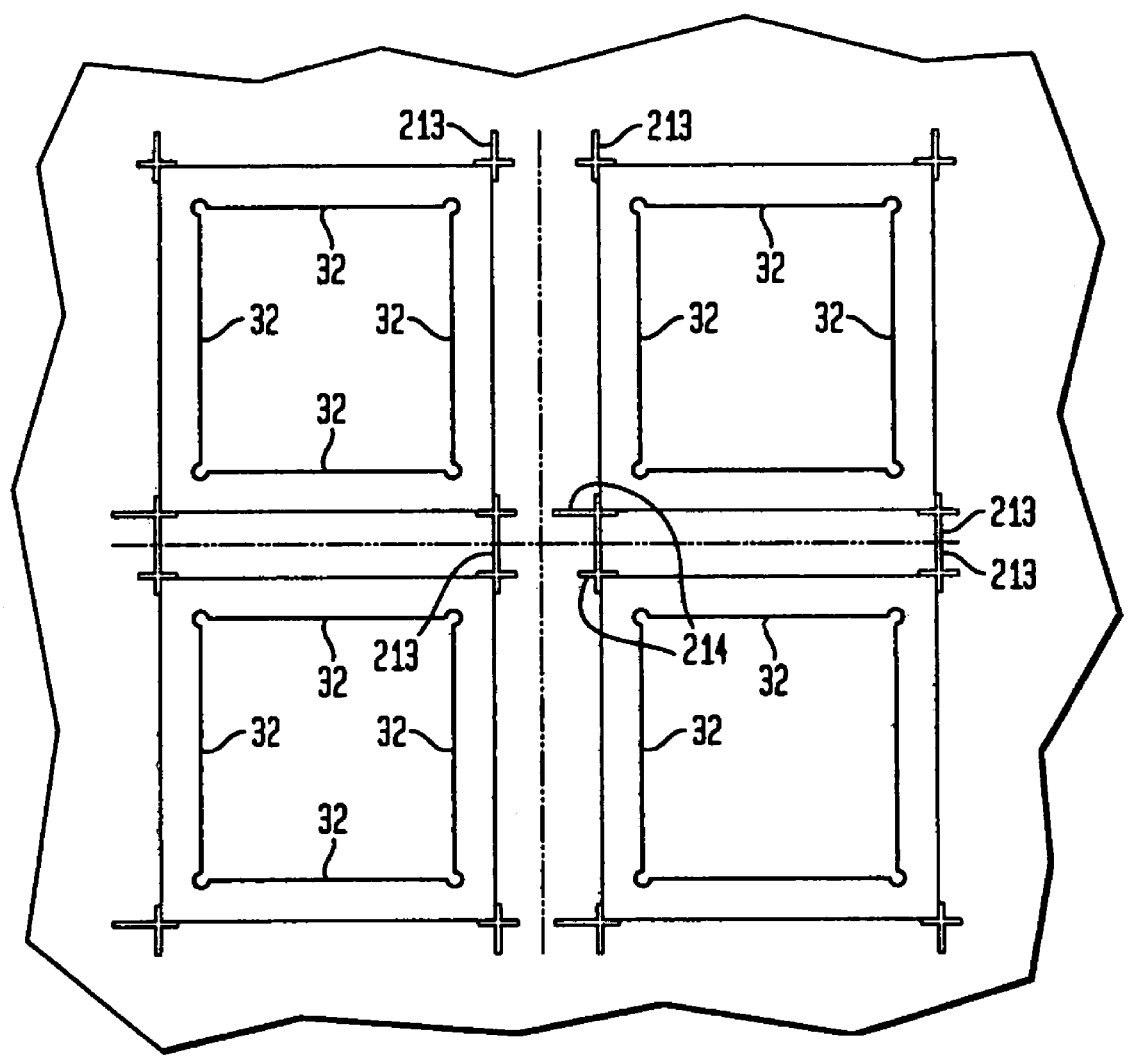

Normally, the walls 32 do not extend much beyond the bottom edges 242 of the lid elements because the area of the chip beyond those edges is generally fully occupied by bond pads. In order to increase support for portions of the cover wafer that exist during and after the severing process, extensions 213, 214 can be provided to the walls 32 of the support structures for that purpose. Preferably, the extensions 213, 214 run in each of two directions such as orthogonal directions, which are named north-south and east-west, respectively for convenience and the extensions are aligned with the areas of the walls over which the saw blade passes when the lid wafer is sawn into pieces. When features of the chip are laid out in patterns aligned to regular orthogonal directions, as is typically the case, the extensions 213, 214 run in these orthogonal directions. FIG. 8B is a fragmentary top-down plan view illustrating a portion of a lid wafer on which four support structures and the walls thereof 32 are shown. As illustrated therein, the extensions 213 and 214 extend in both such orthogonal directions to bridge the gaps between the walls of each support structure.

However, there is no requirement that the directions be actually aligned with a true north-south direction or true east-west direction, nor that the directions be orthogonal to each other. For example, when the exposed portions 32a of the walls are aligned to directions that are not orthogonal, the extensions will normally be aligned with the directions in which those exposed portions of the walls extend.

Figure 8C:
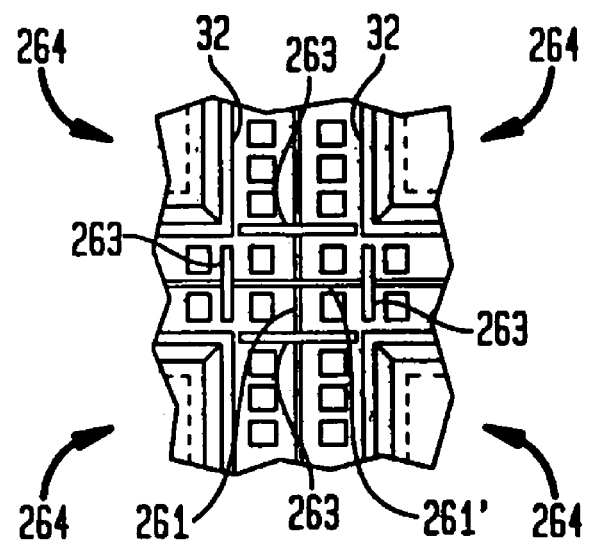

FIG. 8C is a fragmentary partial top-down plan view illustrating corner portions of four units 264, each unit including a chip covered by a cover element in a manner similar to that described above with respect to FIG. 8A. In the variation illustrated in FIG. 8C, some or all of the extensions 263 are not physically joined to the walls 32. Instead, the extensions can either be free-standing or be mechanically supported by support members 261 and 261' which run in north-south and east-west directions, respectively. The ability to provide the extensions 263 without requiring them to be connected to the walls 32 per se allows further variations. For example, bond pads can be disposed between edges of the walls 32 and the extension. In such case, the saw blade is allowed to pass over the bond pad, but damage to the bond pad is avoided because the unsupported span across which the saw blade travels when cutting the cover wafer is relatively small, given the presence of the extension 263 opposite the bond pad from the wall 32 on one chip.

Note that a variety of materials can be utilized in forming the walls of the support structures and the extensions. In a preferred embodiment, the support structures and the extensions are formed simultaneously by a process of patterning on a cover wafer a photo-imageable polymer material such as a solder mask. Desirably, the photo-imageable polymer is deposited on the wafer and then areas thereof are opened by photolithography to define the dimensions and shapes of the walls and extensions. Alternatively, the support structures and extensions can be formed simultaneously by an electrophoretic process. For example, a conductive coating can be formed on a surface of a dielectric cover wafer such as a glass wafer or polymer, especially transparent polymer wafer such as by sputtering or by electroless plating. Thereafter, the sputtered or electrolessly plated (or otherwise provided) conductive coating is patterned by photolithography to define the areas of the cover wafer to be covered by the walls and the extensions. Thereafter, an electrophoretic process is used to deposit a polymer onto the areas occupied by the conductive coating, which is held at controlled potential. The polymer builds in thickness to form the walls of the support structures and the extensions which remain attached to the cover wafer. An advantage of electrophoretic deposition is that it produces walls having uniform thickness. Electrophoretically deposited walls usually have superior uniformity over walls that are deposited by other means such as spin-coating, for example. Spin-coated structures exhibit edge-bead phenomena which can impact uniformity of thickness.

In a particular variation of the above-described process (FIG. 8A), electrophoretic deposition is used to form the support structures on the device wafer rather than the cover wafer, when such device wafer includes chips which are capable of withstanding electrophoretic deposition processes.

In another variation of the above-described process, electroplating is used to form walls and extensions of metal. This will be the case when the sputter coating and/or the coating electrolessly deposited prior thereto is continuous. The initial coating requires electrical continuity in order to maintain a single potential over the dimensions of the device wafer for performing the subsequent electroplating process.

In yet another variation, the cover wafer includes a material such as silicon. Silicon is not transparent to visible wavelengths of light, but is transparent to useful infrared wavelengths of interest. Accordingly, the cover wafer can be provided of a wafer consisting essentially of silicon when chips includes devices which do not require transparency to visible wavelengths. For example, infrared transmitters and/or receivers, pressure sensors and surface acoustic wave ("SAW") filters include devices which need not be housed in a cover transparent to visible wavelengths.

In such case, the walls of the support structures can be patterned by electrophoretic deposition onto portions of a doped silicon wafer which are exposed between photoresist patterns, for example. In another alternative, especially in the example of SAW filters, the silicon can be electroplated to form walls which project from the surface of the silicon. In still another example, a silicon wafer can be patterned by etching to form cavities in locations overlying the device regions and the contact regions (overlying the bond pads) on the device wafer. In the case of a silicon wafer, one important step in the process is aligning the silicon wafer to the device wafer during the bonding of the two wafers together, and subsequently when the cover wafer is cut to expose the bond regions of each chip and the device wafer is diced. In such case, since the cover silicon wafer is substantially opaque to visible wavelengths, alignment marks can be provided on the outer region or ledge region of the cover wafer as well as the outer exposed ledge of the chip on the device wafer. Alternatively, the chuck which holds the wafer during the bonding process and the chuck holding the wafer during the process of dicing the cover wafer can be provided with infrared illumination and/or sensing equipment for observing alignment marks on the device wafer which would otherwise remain hidden underneath the cover element. In this way, the bonding and dicing processes can be performed with proper alignment, even when the cover wafer is opaque to visible wavelengths of light.

Figure 9:
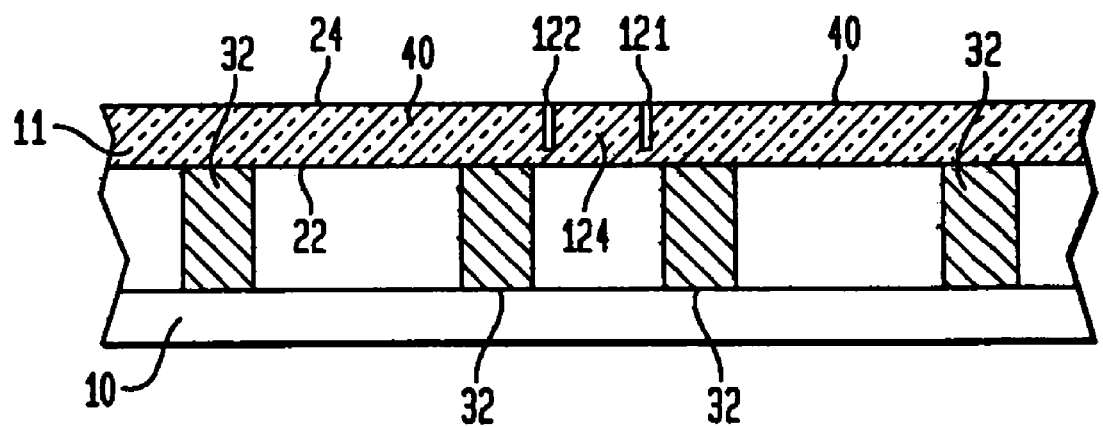
FIG. 9 is a partial sectional view illustrating a stage in severing an assembled device wafer and lid wafer to form individual lidded chips.

Referring to FIG. 9, in one embodiment, sawing of the lid wafer 11 is performed so as to avoid sawing the lid wafer completely through from the outer surface 24 to the inner surface 22. In such embodiment, the lid wafer is sawn partially through its thickness to a predetermined depth within the lid wafer. This process makes the lid wafer ready for separation by subsequently breaking the lid wafer into pieces including lid elements 40 that remain attached to the device wafer 10 and unsupported pieces 124 that do not. Two parallel cuts 121, 122 are sawn or scribed in the lid wafer between each pair of adjacent walls extending above neighboring chips as shown in FIG. 9. Thus, the partial cuts or scribe lines 121, 122 define locations where the lid wafer will be separated. Thereafter, an adhesive is used to remove unsupported, i.e., unwanted pieces 124 of the lid wafer overlying the contact regions 16 between the saw cuts/scribe lines 121, 122.

Figure 10A:
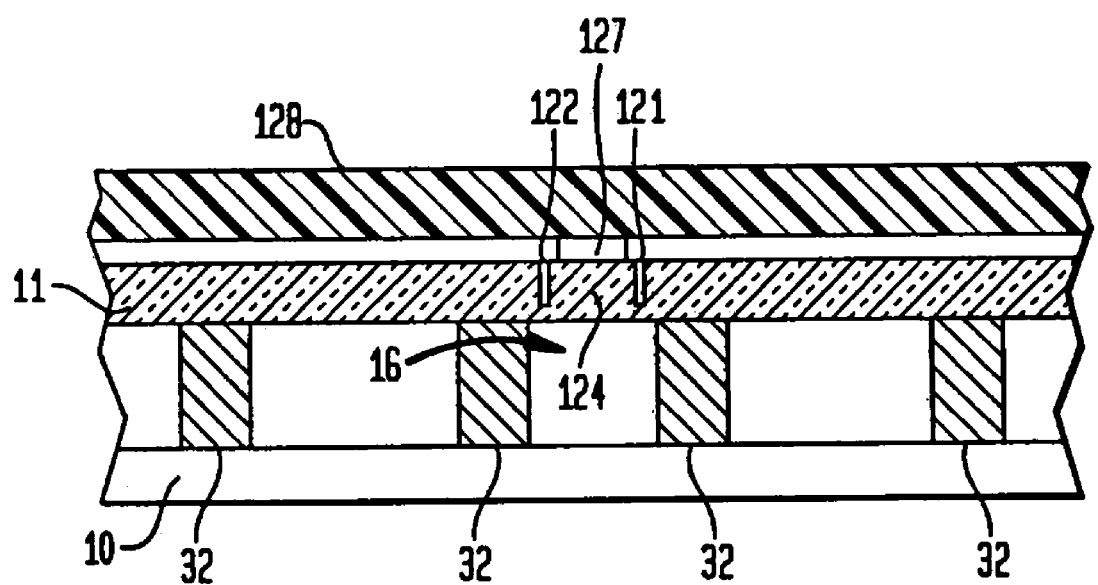
FIGS. 10A and 10B are partial sectional views illustrating operations for severing an assembled device wafer and lid wafer in accordance with particular embodiments of the invention.

In one example, as shown in FIG. 10A, a photosensitive adhesive 127, e.g., an adhesive curable by ultraviolet ("UV") light, can be used to selectively adhere the unsupported pieces 124 of the lid wafer 11 to a lifting layer 128 such as a flexible sheet such as one including a polymer, e.g., polyimide. In such case, preferably after the lid wafer has been sawn or scribed, the UV curable adhesive is deposited over the lid wafer and portions disposed between the partial cuts or scribe lines 121, 122 are cured by selective exposure to UV light through a mask. The lifting layer is then lowered onto the surface of the lid wafer including the cured adhesive such that the lifting layer adheres to the unsupported piece 124. Then, a pre-defined vertical force or a pre-defined shifting force can be applied to move the piece 124 horizontally relative to other parts of the lid wafer to break the piece therefrom. The shifting force can be applied by a mechanical apparatus, for example, a stepping motor.

With force controlled appropriately in amount and direction, the removal of the lifting layer removes the unsupported pieces 124 with the lifting layer. When this operation is performed with the device wafer in an inverted position such that the lid wafer is below the device wafer, an added advantage can be achieved in that debris and particles resulting from the removal do not fall onto the contact regions.

Uncured portions of the deposited adhesive overlying the lid elements can then be removed, as by rinsing. Depending on the composition of the curable adhesive, the uncured portions can be removed either before or after pieces 124 are removed from the lid wafer. In a particular case, the uncured adhesive is removed during subsequent cleaning performed after separation of the device wafer into individual chips.

Figure 10B:
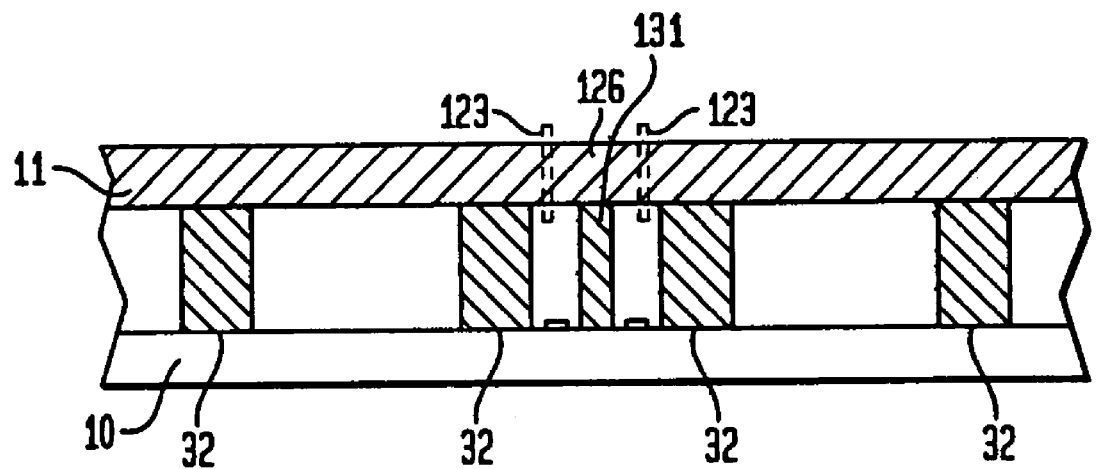

In another example, an additional support structure 131 (FIG. 10B) is provided for supporting the lid wafer 11 above the device wafer 10 while leaving the contact regions 14 exposed from above between the walls 32 and the additional support structure 131. The additional support structure 131 is narrow such that it is easily removed later as a result of the dicing operation used to sever the device wafer 10 into chips. This structure 131 supports a piece 126 of the lid wafer 11 when a pair of relatively narrow cuts are made either partially through the lid wafer or preferably entirely through the lid wafer by a saw or scribe at locations 123. After making such cuts, the piece 126 can be removed by an adhesive and a lifting layer such as that shown and described above. During the removal step, a portion or all of the supporting structure 131 may also be removed as a consequence.

In a variant of the above, shown in FIGS. 11A-11D, a planar lid unit 320 is laminated to the wafer unit using adhesive seals 330 covering the peripheral areas, contacts 318 and region boundaries 319, in much the same way as discussed above with reference to FIGS. 1-3A. In this embodiment, and in the embodiments discussed above, seals 330 may be formed by a film of adhesive material that is pre-punched to form holes corresponding to the active areas of the wafer element. Here again, there is no need for precise lateral alignment of the lid element 320 and wafer element 310.

Figure 11A:
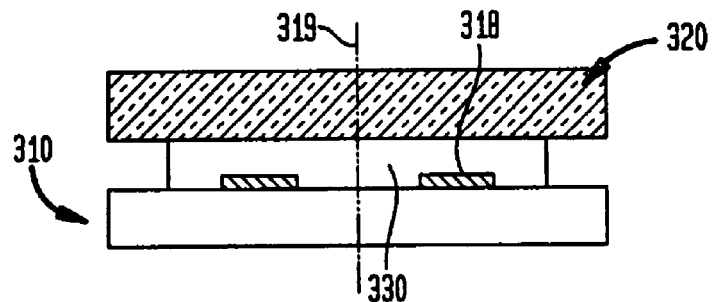
FIGS. 11A-11D are sectional views illustrating stages in a process of fabricating packaged chips in accordance with an embodiment of the invention.
Figure 11B:
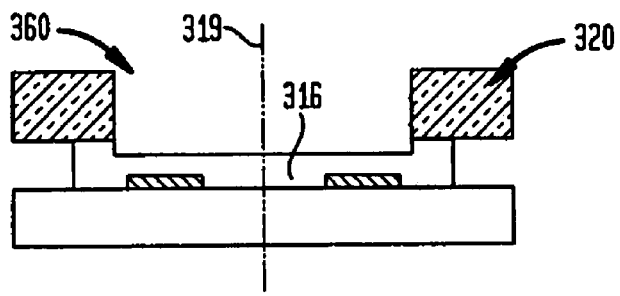
Figure 11C:
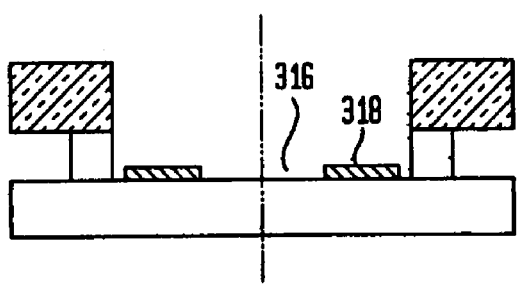
Figure 11D:
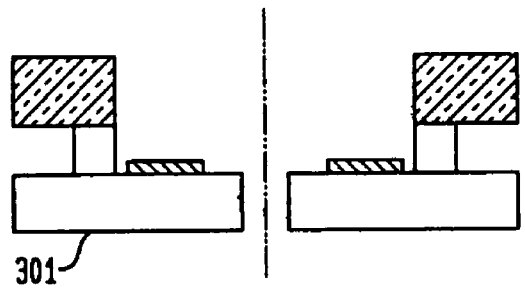

After assembly of the lid element 320 and wafer element 310, an orthogonal array of trenches 360 (FIG. 11B) of a controlled depth is formed in the lid element 320. The array of trenches 360 is preferably in alignment with the region boundaries 319 and the peripheral areas 316 of the various regions. The trenches 360 may be formed by masking and etching or, more preferably, by dicing using a saw or abrasive. Ideally, the trenches 360 will penetrate the seal 330, but not the wafer element 310. The seal material exposed by the trench 360 can then be removed by laser ablation, dissolution in chemical solvents or a plasma process, so as to leave the peripheral areas 316 and contacts 318 of the various regions exposed (FIG. 11C). Following formation of the trenches 360, the wafer element 310 is severed along the boundaries 319, so as to form individual units 301. (FIG. 11D).

Another way to protect the bond pads of the chip from damage when the lid wafer is patterned is to form the support structures 32 in the manner as described above relative to FIGS. 2-3E and apply a sacrificial coating over the bond pads of the contact region. The sacrificial coating can be removed through a cleaning process after the lid wafer is patterned and more preferably after the device wafer has been severed into individual units.

In a particular example of the above process, the trenches 360 are formed by making a single large, wide cut aligned with the contacts 318 of the device wafer. This avoids additional processing required to lift away cut portions of the lid wafer that remain after making the parallel cuts. However, a single cut using a saw tends to produce much material which requires removal. Saws for this purpose may include systems for delivering a fluid to the site of sawing for removing debris as well as for cooling the blade and/or the article being cut. When the cut is particularly wide, the rate of material removal can slow, which tends to slow the feed rate of the saw. A surfactant can be added to a liquid used to remove the material or cool the blade to decrease its surface tension and improve the ability of the liquid to clean the wafer during the sawing operation.

Figure 11E:
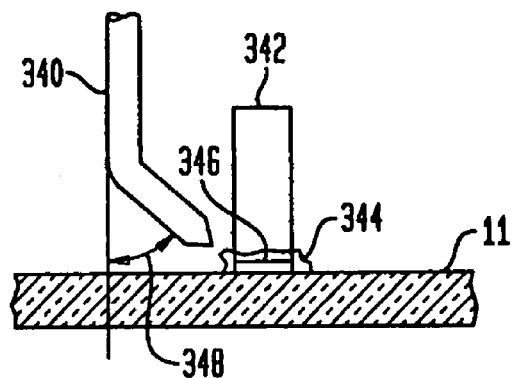
FIG. 11E is a sectional view illustrating application of a fluid to a saw blade during a severing operation in accordance with an embodiment of the invention.

FIG. 11E illustrates a preferred arrangement in which a liquid or other fluid is directed through a nozzle 340 ahead of a saw blade 342 at the location where the lid wafer 11 will be cut. The center of the stream 344 ejected from the nozzle is preferably zero to two millimeters ahead of the leading edge 346 of the saw blade such that edge 346 is positioned within the fluid stream as it cuts through the lid wafer 11. Preferably, nozzle 340 produces a highly focused stream of fluid which disperses at a relatively small angle as it leaves the nozzle. The nozzle 340 is angled, preferably at an angle 348 between 30 and 45 degrees in order to eject the liquid in a direction towards the leading edge 346. The particular angle that is used is selected based upon the distance between the nozzle and the saw blade and the properties of the fluid stream.

As the blade cuts through the lid wafer, over time, the leading edge 346 of the blade erodes, causing it to move upward in a direction away from the lid wafer. In this case, sawing operations can be performed without having to adjust the position of the nozzle in relation to the blade until the blade has significantly eroded. Specifically, no adjustment in the nozzle position or direction is needed to continue sawing as long as the diameter of the focused fluid stream produced by the nozzle is larger than the change in the diameter of the saw blade, that is when the stream diameter is larger than the distance that the leading edge 346 of the saw blade erodes from its original position. As a result, the edge 346 of the blade remains constantly within the fluid, despite the leading edge eroding away from its original position. The ability to keep supplying the fluid to the lid wafer improves the efficiency of removing material from the lid wafer.

Figure 12A:
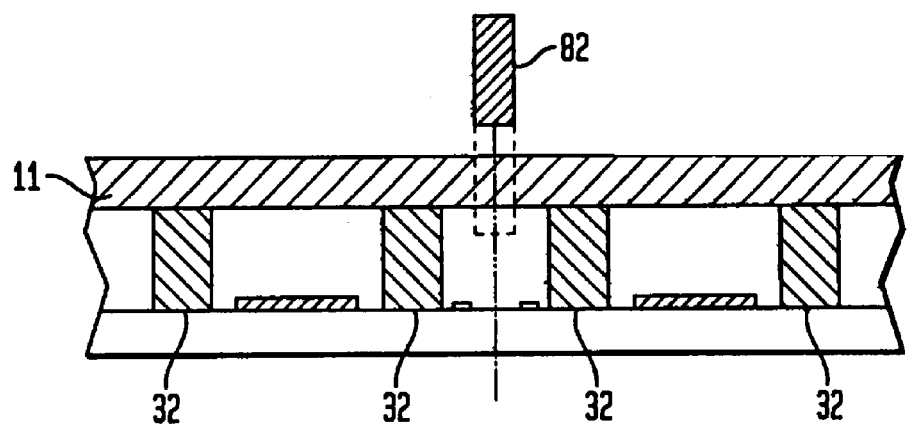
FIGS. 12A, 12B, 13 and 14A are partial sectional views illustrating severing operations performed in accordance with various embodiments of the invention.
Figure 12B:
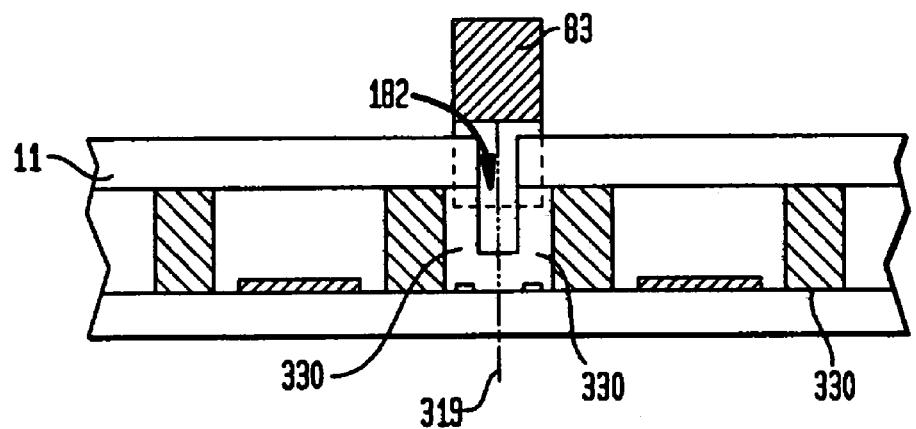

In a variation of the above process, the lid wafer 11 is first sawn using a blade 82 having moderate thickness (FIG. 12A) centered at the dicing lane 319 between walls 32, in order to reduce the amount of material required to be removed after the sawing operation. This produces a trench 182 (FIG. 12B) extending into the lid wafer and the seal material 330 below the lid wafer which has approximately the same width as blade 82. Subsequently, the lid wafer 11 is sawn again along the dicing lane 319 with a wider blade 83 to produce a trench in the lid wafer which has the final desired width. In each sawing operation, the width of the blade is selected so as to keep the amount of material being removed in each operation to a manageable quantity for removal by a fluid (e.g., liquid or gas, etc.).

In a particular example, the first blade 82 can have a width of about 100 microns and the second blade has a width of about 500 microns.

Figure 13:
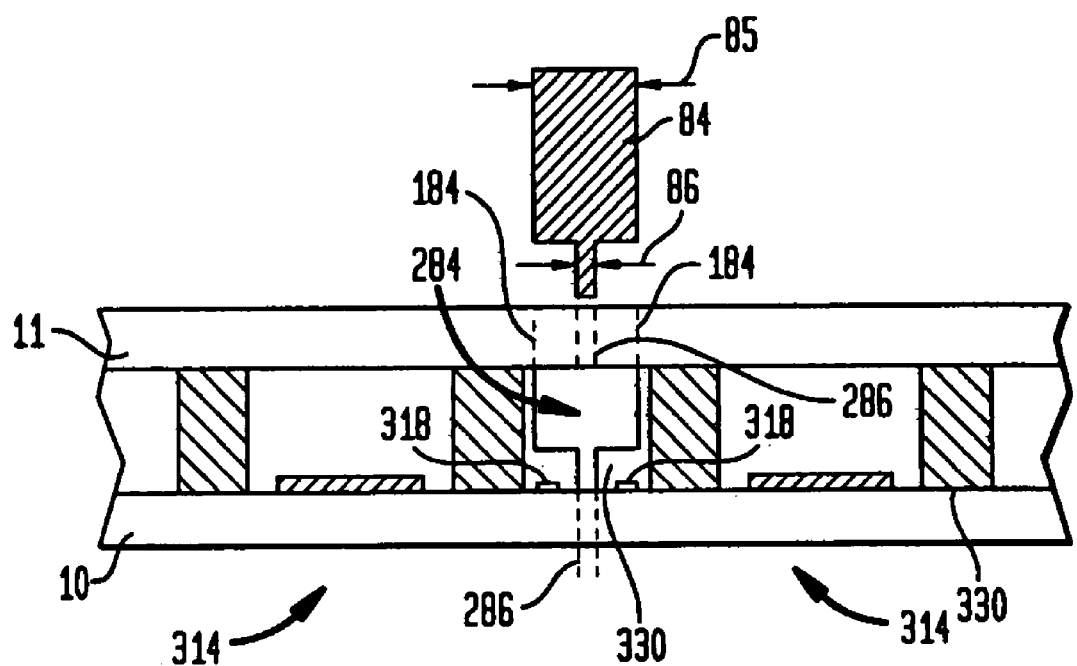

In a further variation, a saw having a blade 84 (FIG. 13) with dual widths is used to cut an opening in the lid wafer 11 above the contacts 318 (through lines 184) and to sever the device wafer 10 between adjacent regions 314 in one continuous sawing operation. Here, a first relatively narrow portion of the blade having width 86 makes an opening 186 in the lid wafer of about the same width as the width 86. As the blade progresses into the material of the lid wafer, the wide portion of the blade having width 85 produces the opening in the lid wafer between lines 184 while also forming the trench 284 in the seal material 330. As the blade progresses further downward, the narrow portion of the blade cuts a relatively narrow path or line 286 through the device wafer. The narrow portion of the blade is sized and the sawing process is controlled such that the blade 84 produces the narrow cut 286 through the device wafer without the opened trench 284 exposing the contacts.

Figure 14A:
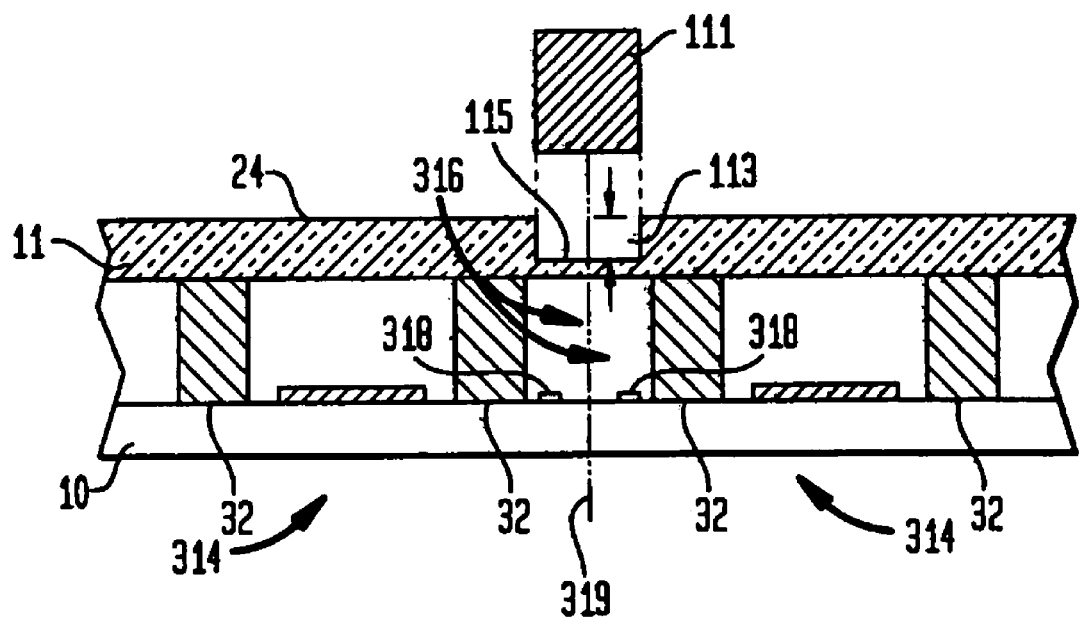

In another variation illustrated in FIG. 14A, the walls of support structures 32 or sealing material between the device wafer 10 and lid wafer 11 are dimensioned such that the sealing material does not extend over the contact regions 316 at the peripheral edges along the dicing lane 319 between regions 314. Then, a wide area of the lid wafer extending over the width of the contact regions 316 is first partially sawn or abraded. This is done by sawing or abrading through a portion of the thickness of the lid wafer to a depth 113 at which little of the thickness of the lid wafer remains to be removed. Loose material produced during this first operation is removed either during or after such operation. During and after this first sawing or abrading operation, a thin window 115 of the lid material remains over the contact regions 316, shielding the contact regions from the resulting loose material. Subsequently, the device wafer 10 is severed into individual regions 314 or chips along dicing lane 319. This severing operation can be performed, for example, by sawing with a blade through the device wafer 10 or by scribing the device wafer 10 along the dicing lane 319 and breaking it along the scribe line while simultaneously breaking window 115 of the lid wafer. The window 115 is sufficiently thin to be frangible during either such sawing or scribing and breaking operations. Because only a thin window of lid material remains above the contact regions, little loose material of the lid wafer results from the dicing operation. Thus, there is little material of the lid wafer available during the dicing operation to fall onto the contact regions. In this way, the space above the contact regions 318 need not be covered by a sealing material, such as by support structures.

In a variation of the above-described sawing process, first and second initial cuts 317a and 317b (FIGS. 14B, 14C) in the lid wafer 11 are made, such as by sawing using a tapered blade 311 having an edge (or edges 312a, 312b) oriented at a substantial angle (e.g., between about 10 degrees and about 70 degrees) with respect to a normal 313 to the front surface 26 of the device wafer 10. In such manner, edges 336 of the lid elements remaining after the sawing process are oriented at a desirable angle with respect to the normal. Benefits of orienting the edges at an angle are described further below with reference to FIG. 16, among others. After sawing with the tapered blade, thinned portions or windows 315 (FIG. 14C) remain in the lid wafer 11 overlying the contact regions 316 of adjacent microelectronic elements. The initial cuts are made such that at least portions of the windows 315 directly overlie the standoff walls, as apparent at locations 332 of the standoff walls.

Figure 14E:
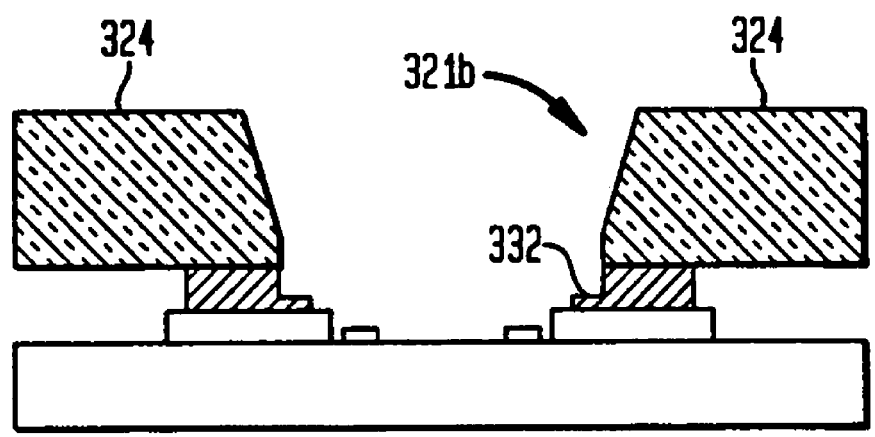

Following these saw cuts, additional cuts 321a (FIG. 14D), 321b (FIG. 14E) are made which extend through the lid wafer to sever the lid wafer into individual lid elements 324. Preferably, the additional cuts are made using a blade 326 which has edges 327 aligned with the normal to the front face of the device wafer. Moreover, preferably the blade 326 has smaller thickness 328 than a thickness 329 of the blade 311 used to make the initial cuts. In this way, the aligned edges 327 of the blade 326 and its smaller thickness can be used to produce more precise cuts 321*a*, 321*b* which are aligned with portions 332 of the standoff walls. As a result, an amount of fragments and debris produced by cutting the lid wafer can be reduced.

In addition, the smaller thickness of the blade 328 allows the additional cuts 321*a*, 321*b* to be made by moving one of the lid wafer and the saw blade relative to the other may enable the lid wafer to be severed by cuts made at faster feed rates than otherwise. For example, were the initial cuts to be made in a way that extends completely through the thickness of the lid wafer (from the outer surface of the lid wafer to the inner surface), such cuts might need to be made at a feed rate substantially less than about 6 mm/sec to best avoid production of lid fragments and debris, breakage, chipping and cracking of the lid wafer which might damage the bond pads 318 of the device wafer. An exemplary feed rate for making the initial cuts could be 2 mm/sec., for example. In the herein-described method, the relatively wide and angled initial cuts 317*a*, 317*b* (FIGS. 14B-14C) can be made at a faster feed rate such as 8 mm/sec because the cuts are terminated before sawing completely through the thickness of the lid wafer, thus avoiding fragments and debris produced during the initial sawing operation from reaching the bond pads 318. Terminating the tapered cuts before sawing completely through the lid wafer also reduces the stress caused by sawing and avoids cracks from appearing in the lid wafer.

Additional cuts 321*a*, 321*b* can be made at an even faster rate, such as, for example, 60 mm/sec., the aligned edges and narrow blade used to make the additional cuts helping to avoid fragments and debris from being scattered onto the bond pads during these later sawing operations. Together, the faster feed rates at which both the initial cuts and the additional cuts can be made can increase the rate of processing the lid wafer by decreasing the total amount of time needed to sever the lid wafer into individual lid elements.

In other variants of the above processes, areas of a lid wafer 411 above contacts 418 (FIG. 15A) are removed by laser cutting, laser drilling or laser ablation instead of cutting with a saw or abrading or grinding as described above. Laser ablation is a dry process, not requiring a liquid for removal and produces little mechanical stress or vibrations in the piece being worked. In addition, laser ablation leaves little debris or coarse particles behind which might obstruct or damage the contacts 418.

Figure 15A:
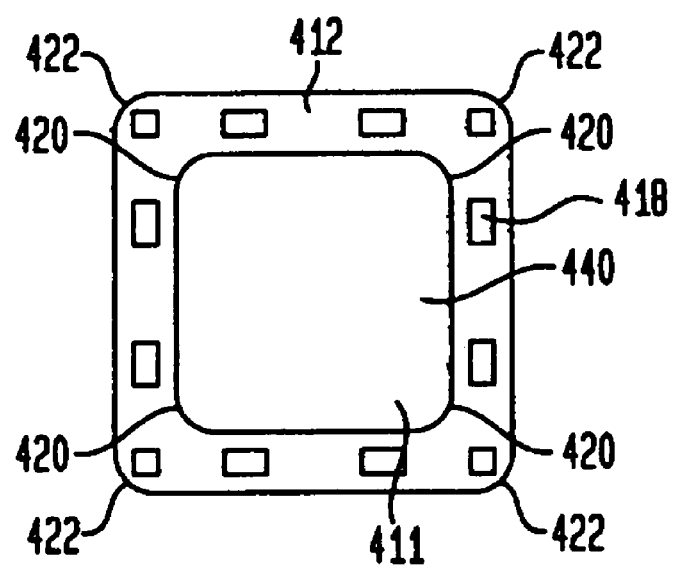
FIG. 15A is a plan view illustrating a packaged chip having rounded edges in accordance with an embodiment of the invention.

Using one or more lasers, cuts of various widths can be made. Thus, a laser having a narrow beam can be used to make narrow cuts in the lid wafer to scribe the lid wafer for subsequent breaking. Likewise, the device wafer can be scribed or cut by a laser, preferably a narrow beam laser. Alternatively, a laser producing a wider beam can be directly used to ablate a relatively wide path through the lid wafer to expose the contacts of the lid wafer 418 as shown in FIG. 15A.

An added advantage of laser ablation is that can be used to produce lid elements that have rounded corners. Laser ablation proceeds by directing a laser beam onto the lid element, the beam having a typically round, i.e., circular or elliptical spot. As the position of the spot moves over the lid wafer, the edge of the spot defines the edge of the lid element that remains. By appropriately controlling its path, the laser can be used to cut lid elements 440 having rounded corners 420. Similarly, a chip 412 having rounded corners 422 can be produced when laser ablation is used to singulate chips. It is advantageous for chips and lid elements to have rounded corners 422, 420. Chips and lid elements having rounded corners are less susceptible to breakage during handling and subsequent manufacturing than those which have corners that project out.

Alternatively, if a laser is not used to singulate chips, other processes such as polishing and grinding can be used to round the corners of the singulated chips to reduce the possibility of damage thereto.

In a particular embodiment (FIG. 15B), to support the ledges 450 and rear face of a chip against damage from handling a subsequent processing, a support plate 452 can be attached to the rear face 456 of the chip. The support plate preferably consists essentially of a metal, to provide good thermal conductivity and high resistance against fracturing. Desirably, the support plate has a coefficient of thermal expansion ("CTE") at least approximately equal to that of the chip. Exemplary materials for the support plate include silicon, glass, nitrides of silicon, nitrides of aluminum or a metal such as molybdenum or tungsten, because the coefficient of thermal expansion ("CTE") of the support plate must match that of the chip, for example, a silicon chip. The support plate is preferably attached using thermal adhesives 451, 453 on both sides to conduct heat away from the chip. Alternative connection methods include soldering, brazing, anodic bonding and the like. Optionally, a thermal conductor 348 or heat sink can be provided under the thermally conductive support plate in the circuit panel 454. The support plate can have less area than the rear face of the chip such that it underlies only a portion of the rear face. For example, the support plate can underlie portions of the rear face adjacent to some or all of the peripheral edges of the chip. Alternatively, the support plate can underlie and fully support the rear face of the chip in its entirety.

Figure 15B:
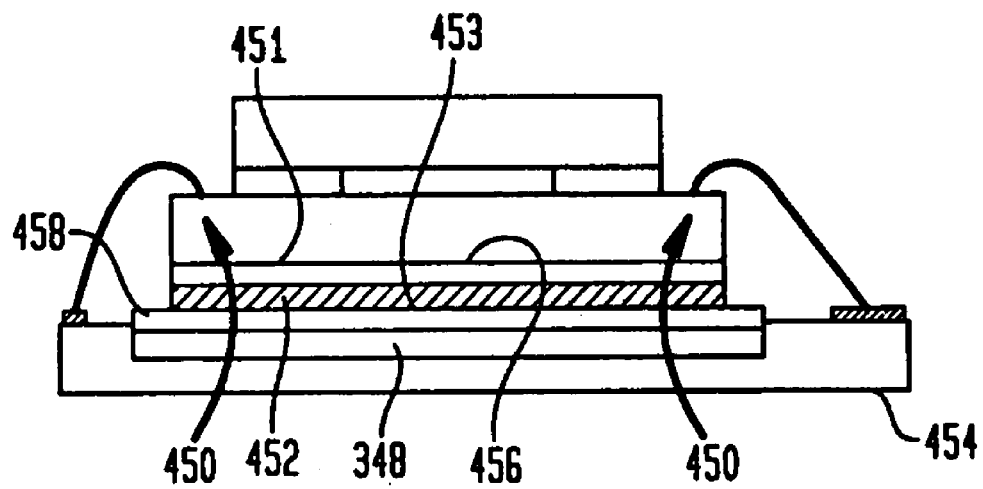
FIG. 15B is a sectional view illustrating an assembly including a packaged chip as attached to a circuit panel through a support plate in accordance with an embodiment of the invention.

In the embodiment shown in FIG. 15B, the rear face 456 of the chip is bonded to a circuit panel through an adhesive. In many applications, it is important for the rear face of the chip to be mounted parallel to the circuit panel 454, in order to properly align an imaging plane on the front surface of the chip with optics to be provided above the lid. Accordingly, the manner in which the adhesive is applied to the rear face of the chip can determine whether success is achieved in obtaining planarity. For this purpose, when grooves 279, 289 are provided in the rear face of the chip, as shown in the bottom plan views of FIGS. 17D and 17E, globs of adhesive that may bulge away from the surface can escape through the grooves, leading to a more planar bond between chip and circuit panel. FIG. 17F is a sectional view illustrates three alternative sectional shapes 281, 283, 285 that the grooves can take within the rear surface of the chip.

For example, in certain applications, a chip is required to be mounted to a reference plane such as a circuit board with a high degree of planarity. In "chip-on-board" mounting, the chip is mounted face up on a circuit board and a lens turret is mounted to the circuit board over the chip so as to focus incoming light onto an imaging plane of the chip. One issue affecting the ability to mount the chip with good planarity is the accumulation of adhesive on the rear face of the chip. Various ways have been tried to increase the planarity with which the adhesive is applied to the chip. However, when the chip is joined to the board, it is still possible for the adhesive to collect and interfere with achieving planarity. One solution to this problem is to form grooves 279 (FIG. 17D) in the rear face of the chip. Such grooves permit the adhesive to flow away from the interface, allowing the surface of the chip to flatten against the surface of the board that to which it is being attached. Grooves can be formed by various ways including machining, etching, and scoring. As shown in FIG. 17D, grooves 279 are laid out in a grid pattern. On the other hand, in the example shown in FIG. 17E, grooves 289 are laid out in a star pattern. FIG. 17F is a sectional diagram illustrating different profiles of grooves (straight trench) 281, circular or etched trench 283 and v-groove trench 285 in the mounting surface that can be obtained and used for this purpose.

In the individual lidded chips and units 112 (FIG. 6A) in accordance with the above-described embodiments, the walls 32 of the support structures and the edges 140 of the lid elements rise in a substantially vertical direction from the front face 26 of the chip 132. However, when the unit 112 is to be further interconnected to other circuit elements via wire-bonding, the wall 32 and edge of the lid element may hinder movement of the wire-bonding tool's capillary towards the contact 18, i.e., a bond pad of the chip. The capillaries of wire-bonding tools are commonly tapered at an angle of 22 degrees from the vertical axis in which the capillary is commonly moved toward a bonding site. Because of this angle, when the wire-bonding tool is to form the bond within a relatively deep opening, such opening must be wider.

The straight edge 140 of the completed unit 112 (FIG. 6A) makes it more difficult to form bonds when unit 112 is higher, i.e., when the distance of the lid's outer surface from the chip's front surface 26 is higher. In that case, the bond pad 18 needs to be placed at a greater distance from the wall 32 and edge 140 of the lid element. For a chip to be further interconnected through wire bonds, the dimension of the contact region must be increased outward to accommodate the movement of the wire-bonding tool into a position to form the bond. This result is to be avoided. In a chip having a given device size, a larger contact region makes the area usage of the chip less efficient, and the chip accordingly more costly to make or lower in function.

Accordingly, in a lidded unit 212 according to another embodiment (FIG. 16), the edge 242 of the lid element 240 slopes at an angle upwardly away from the bond pad. In this way, the capillary 250 of the wire-bonding tool can move into position to bond a wire to the bond pad 218 even when the ledge 244 of the chip that extends beyond the lid element 240 is relatively narrow. Preferably, the angle 246 that the sloped edge 242 makes with the vertical is about 20 degrees. However, the angle can range between about 5 and 40 degrees. A diagram illustrating a similar such unit is illustrated in FIG. 6B.

Figure 17A:
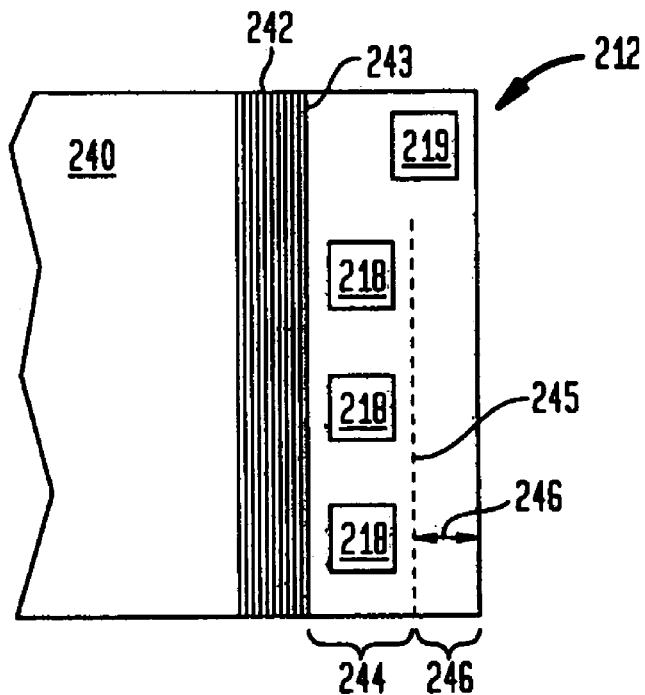
FIG. 17A is a plan view illustrating placement of contacts on a packaged chip in accordance with an embodiment of the invention.

FIG. 17A is a fragmentary top-down plan view of unit 212, illustrating a benefit of sloping the edge 242 of the lid element 240 upwardly away from the contact region 244. By virtue of the sloped edge 242, the bond pads 218 of unit 212 can be placed relatively close to the bottom 243 of the edge 242 while still permitting access thereto by a wire-bonding tool. In such case, the peripheral edge 245 of the chip can be located a distance away from the bottom edge 243 of the lid element that is defined by the width 244. On the other hand, when the edge of the lid element is not sloped, bond pad 219 must be placed a greater distance away from the bottom edge 243, such that the width of the contact region and indeed the chip must be greater by an additional width 246.

Figure 17B:
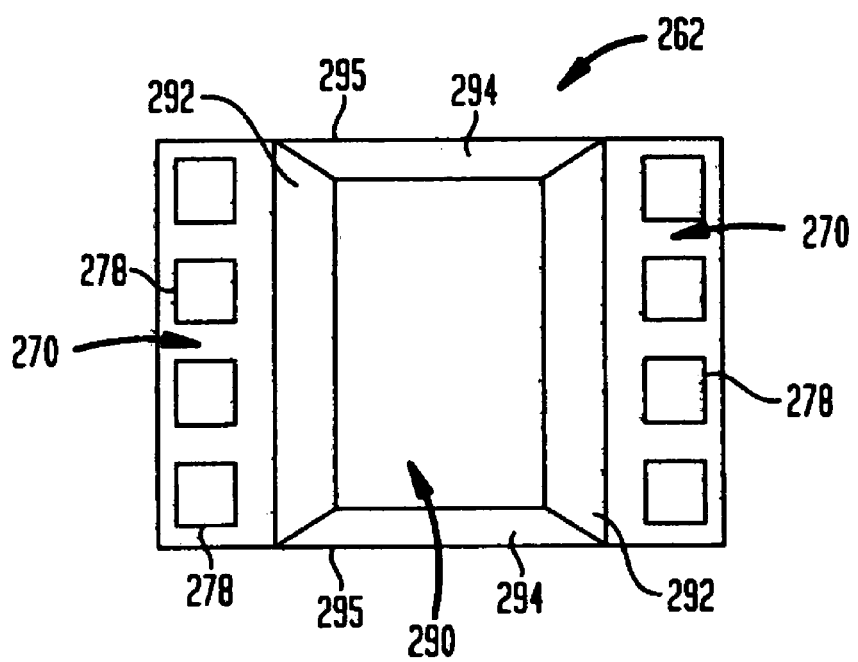
FIG. 17B is a plan view illustrating a packaged chip in accordance with a particular embodiment of the invention.

FIG. 17B further illustrates a lidded unit 262 having sloped edges 292 adjacent to contact regions 270 on which bond pads 278 are disposed. In addition, unit 262 further contains sloped edges 294 on opposing sides of the lid element 290, these edges 294 extending to edges 295 of the chip.

Another benefit of sloping the edges of the lid element is that it aids in protecting the bond pads from damage by fragments of the lid material in the above-described sawing and scribe and break cutting operations. The sloped edges make it less likely for loose material such as glass fragments produced by sawing a glass lid wafer to fall onto the bond pads. In addition, the sloped edges of the lid element aid in removing the glass fragments from the cutting site, as the fragments are more likely to fall onto the edges or top of the lid wafer, away from the contact region at the bottom of the kerf.

A third advantage of making sloped edges is reducing spurious reflections in images that are cast upon an imaging device covered by such lid element. When light confronts a boundary between two media at a small grazing angle, it is likely to undergo internal reflection. With the sloped edges, more of the light under or inside the lid has an escape route out of the lid through the sloped edges.

Figure 17C:
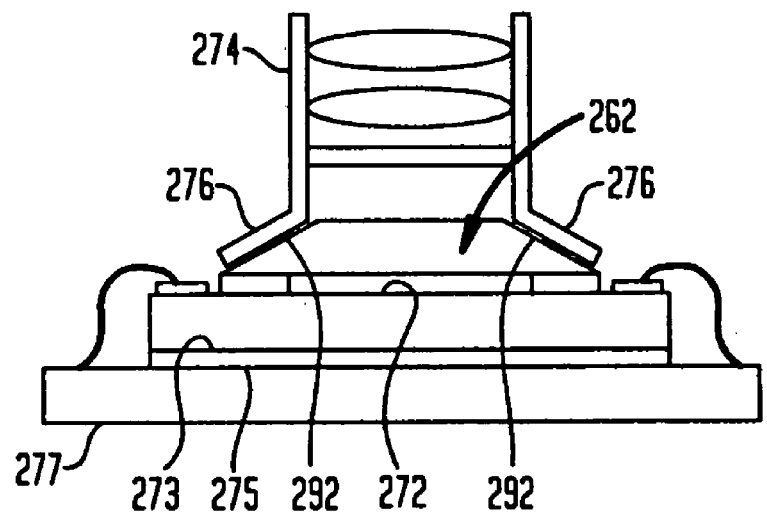
FIG. 17C is a sectional view illustrating an assembly including a lens turret and a packaged chip in accordance with an embodiment of the invention.
Figure 17D:
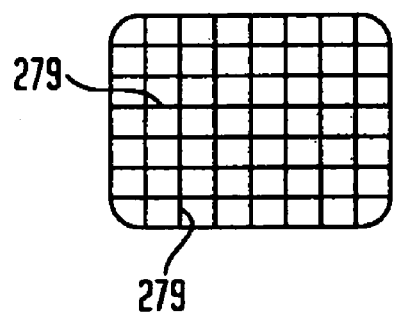
FIGS. 17D and 17E fragmentary plan views illustrating a rear face of a chip showing grooves thereon in accordance with an embodiment of the invention.
Figure 17E:
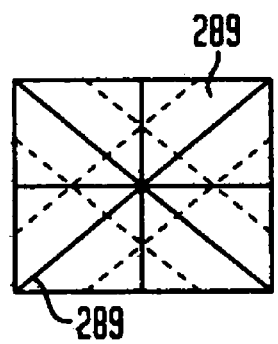
Figure 17F:
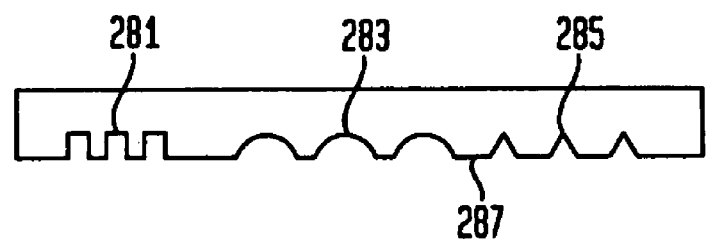
FIG. 17F is a sectional view corresponding to the plan views of FIGS. 17D and 17E.

Still another advantage of a unit 262 having sloped edges is the ability to align the plane 272 of the imaging device within the unit to a lens turret 274 (FIG. 17C) mounted above the unit. Specifically, the sloped edges 292 of lid and other sloped edges, e.g., edges 294 (FIG. 17B) provide a surface on which to align and mount the lens turret. The turret includes a set of tapered feet 276 which rest upon the edges 292, 294 (FIG. 17B) of the lid. The chamfer of the turret is set to match the slope of the edges of the lid exactly, since the accuracy of sawing operations to remove portions of the lid is generally only a few microns away from the intended location as assisted by alignment marks provided therefor in the semiconductor chip. After mounting the turret on the lid in this way, a screw mechanism in the turret can be used to adjust the height of a lens above the imaging plane 272 for focusing purposes.

Figure 18A:
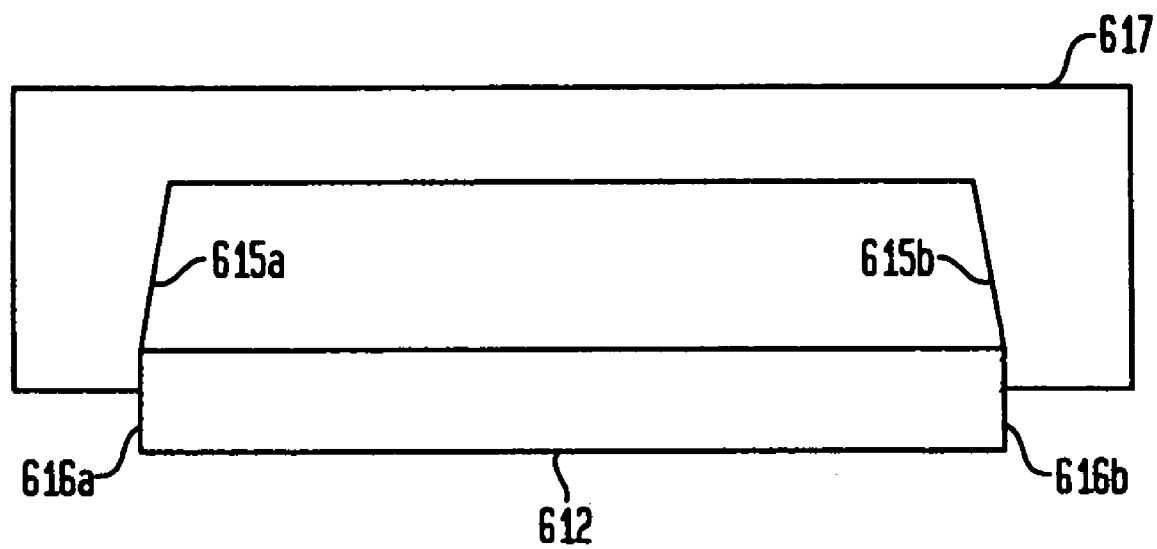
FIG. 18A is a sectional view illustrating handling of a chip by a placing tool.

Accuracy of placement is critical to the performance of an image sensor which is mounted in a chip-on-board ("COB") mounting arrangement on a circuit panel, e.g., printed circuit board or other wiring board. FIG. 18A illustrates a method used to lift and move a bare image sensor chip 612, such as used in placing such chip on a circuit panel. Typically, a collet 0617 located at an end of a wand is lowered in position over the chip 612 until edges 615a and 615b of the collet frictionally engage corresponding edges 616a, 616b of the chip. Due to the imprecise nature of the dicing process, the edges 616a, 616b may not be perfectly parallel or straight. However, the edges 615a, 615b of the collet typically are straight such they engage the chip where the chip's edges 616a, 616b extend the farthest, i.e., where the chip is broadest.

Figure 18B:
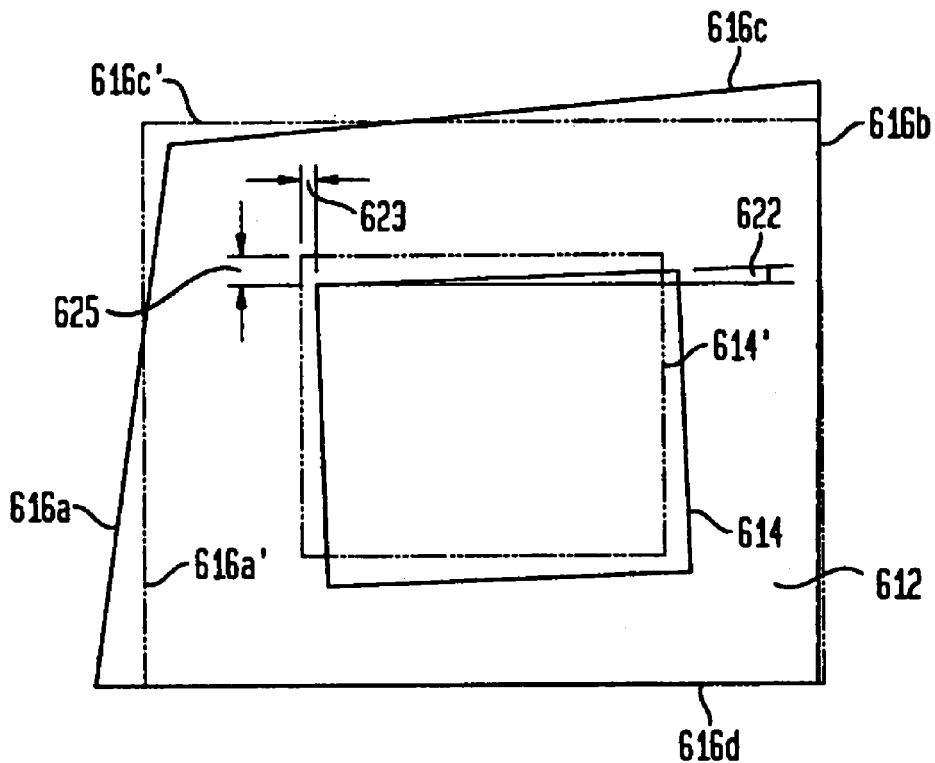
FIG. 18B is a plan view illustrating possible misalignment between an expected location on a chip for an image sensor and an actual location.
Figure 18D:
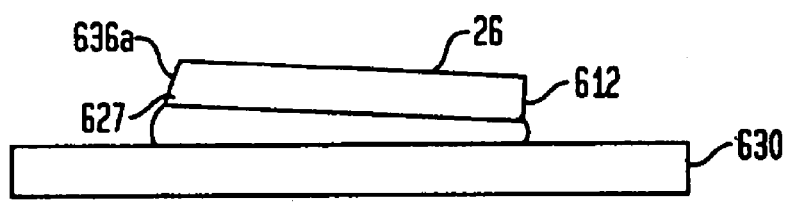
FIG. 18D is a further sectional view showing another form of misplacement of a chip.

As best seen in FIG. 18B, the dicing process can lead to irregularities in the placement, orientation and straightness of edges of the chip. For example, edge 616a is canted at an angle with respect to the ideal location 616a' of the edge. In like manner, the actual edge 616c is canted at another angle with respect to the corresponding ideal edge 616c'. Such irregularities can cause the location and orientation of the image sensor 614 to vary in relation to its expected position 614' on the chip 612. Thus, as shown in FIG. 18B, the actual position 614 of the image sensor (marked by the solid box) in a horizontal layout direction of the chip varies from the expected position 614' (marked by the dotted line box) by a distance 623. In addition, the actual position 614 of the image sensor in a vertical layout direction of the chip varies from the expected position 614' by a distance 625. The actual position 614 of the image sensor may even be rotated at an angle 622 relative to ideal position 614'.

Figure 18C:
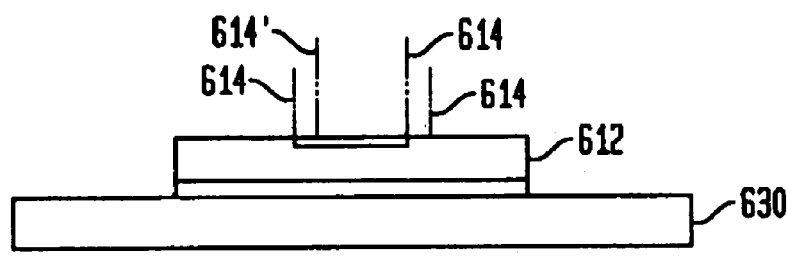
FIG. 18C is a sectional view corresponding to FIG. 18B.

The combined result of the imprecise dicing and the edge-based method of moving and placing the chip using a collet (FIG. 18A) is to introduce variability in the actual mounted COB position of the image sensor relative to its ideal location referenced to the circuit panel. Use of the collet to left and move the chip to a designated position on a circuit panel 630 can cause the position 614 of the image sensor (FIG. 18C) relative to the circuit panel to vary by at least as much as the amount by which the position of the image sensor 614 varies from ideal (expected) position 614' on the chip.

Moreover, inaccuracies in the dicing process can also cause an edge, e.g., 636a to be oriented at an angle 627 (FIG. 18C) with respect to the normal angle that the edge is expected to make with the front face 26 of the chip 612. As a result, the front face 26 of the chip may be tilted as placed by the collet tool onto the circuit panel 630.

Figure 18E:
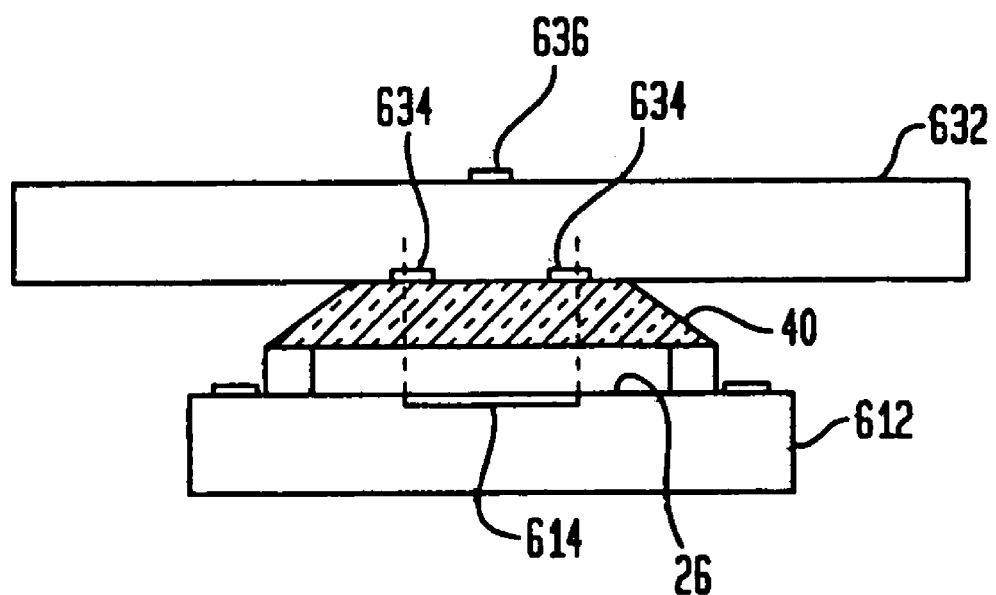
FIG. 18E is a sectional view illustrating placement of a lidded chip using a vacuum wand in a method according to an embodiment of the invention.

An improved method of placing an image sensor chip on a circuit panel which overcomes the above-described difficulties is illustrated in FIG. 18E. In this method, the chip to be mounted to the circuit panel is packaged in a unit with a lid element overlying the image sensor as in one or more of the above-described embodiments. As illustrated in FIG. 18E, a vacuum wand 632 includes optical alignment sensors. The wand can include, for example, one or more sensors 634 on a front face of the wand, or one or more sensors 636 mounted in an opening or to a transparent portion or window at a rear face of the wand.

Figure 18F:
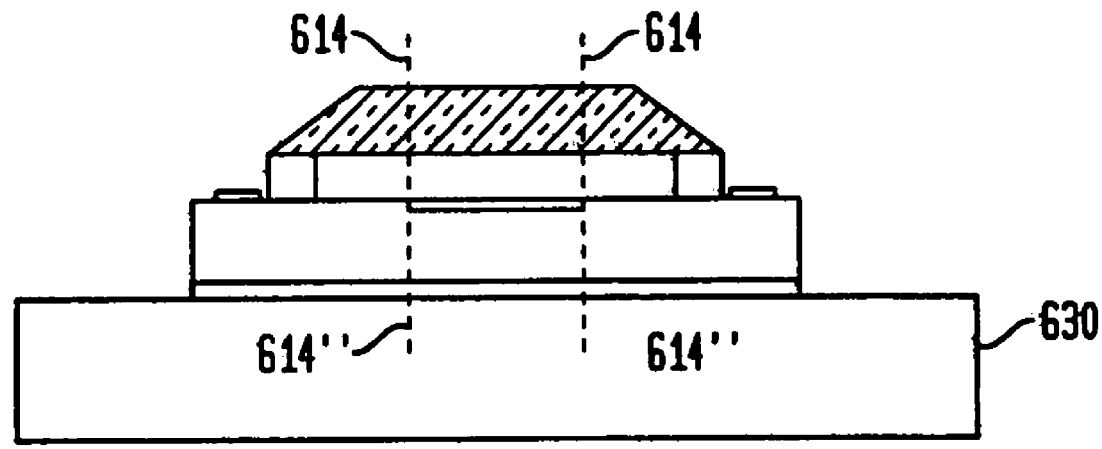
FIG. 18F is a sectional view illustrating placement of a lidded chip on a circuit panel in a method according to an embodiment of the invention.

Using the sensors 634, 636, the wand 632 can be aligned in accordance with the actual position 614 of the image sensor by utilizing a signal, e.g., light received from the front face 26 of the chip through the light-transmissive lid 40 of the unit. For example, variations in dark or light patterns on the front face of the chip can indicate the position 614 of the image sensor or the position of one or more alignment marks on the front face 26. Using the vacuum wand, the lidded chip unit can now be placed on the circuit panel 630 (FIG. 18F) in such manner that the position 614 of the image sensor is now aligned with a desirable position 614' of the image sensor referenced to the circuit panel 630. Utilizing such vacuum-based tools to place the lidded chip unit, the placement accuracy of the image sensor relative to the circuit panel is no longer dependent upon the accuracy of the dicing process in obtaining straight and accurately positioned edges.

Figure 18G:
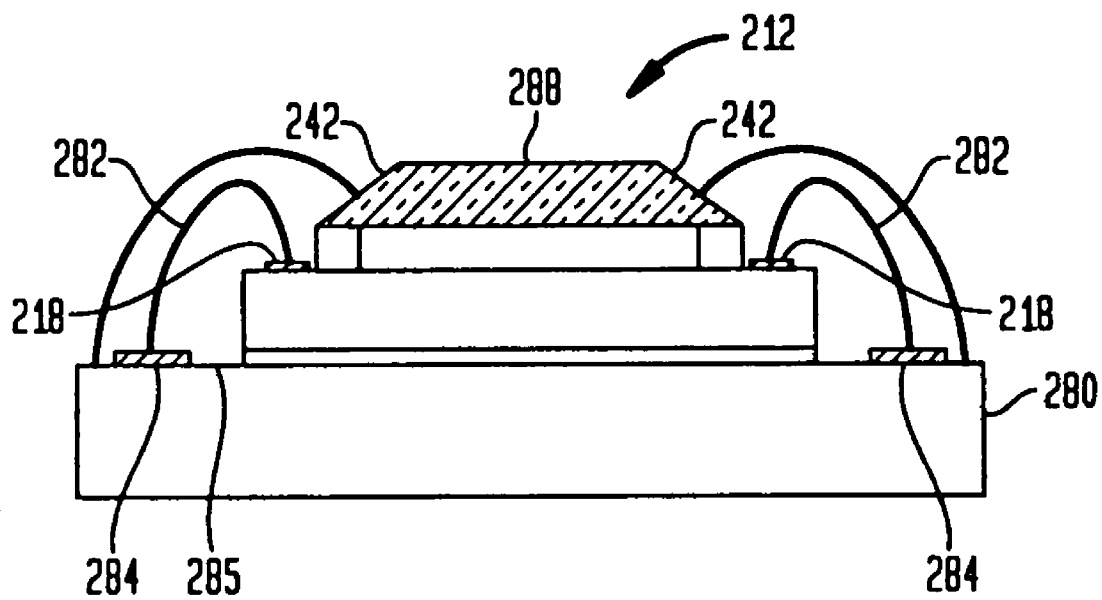
FIG. 18G is a sectional view illustrating an assembly including a lidded chip and a circuit panel in accordance with an embodiment of the invention.

Referring to FIG. 18G, the lidded unit 212 can be conductively interconnected to a circuit panel 280 through wire bonds 282 connecting the bond pads 218 to terminals 284 on the front face 285 of circuit panel 280. In this case, the sloped edges 242 of the lid 240 help avoid material 286 used to encapsulate the wire bonds from contacting the top face 288 of the lid. In this way, the primary path of light through the top face for imaging is protected against obstruction by the encapsulant.

Figure 19:
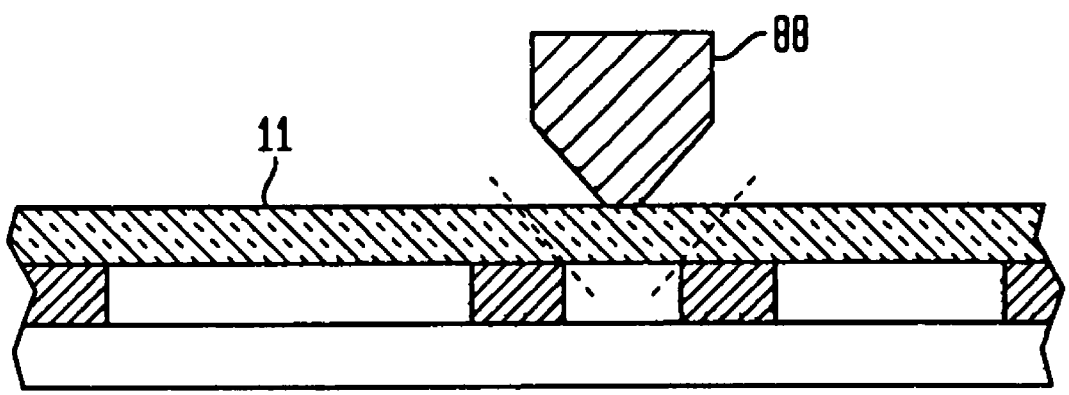
FIG. 19 is a partial sectional view illustrating a severing operation in accordance with an embodiment of the invention.
Figure 20:
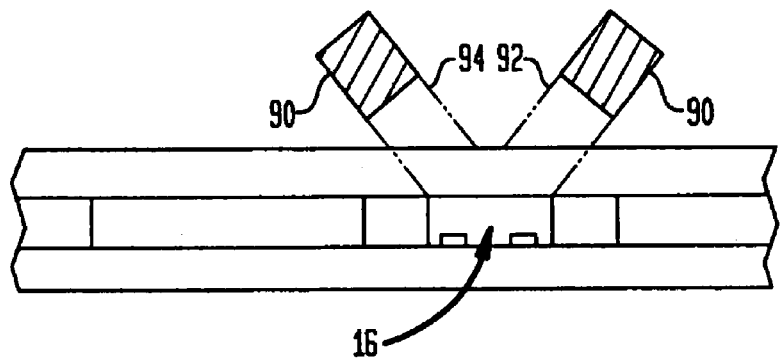
FIG. 20 is a partial sectional view illustrating a severing operation in accordance with an embodiment of the invention.

Various methods can be used to form lids having such sloped edges. For example, the lid wafer 11 can be sawn using a blade 88 (FIG. 19) having a tapered profile to sever the lid wafer into individual lid elements having sloped edges 242 as shown in FIG. 18. In another example, the blade 90 of the saw can be oriented at an angle to the lid wafer 11, as illustrated in FIG. 20. A first saw cut can be made at a first angle through the lid wafer, through a first path 92. Thereafter, a second saw cut can be made at a second angle through the lid wafer, through a second path 94. The second path 94 preferably meets the first path area of the lid wafer that is removed during the first cut such that the lid wafer is completely opened above contact region 16 once the second cut is made.

Other ways that lids having sloped edges can be achieved starting from a planar lid wafer include ultrasonic machining using a tool having a sloped wall or other appropriate shape. In addition, ablation using a laser or other radiation can be used to pattern sloped edges in the lid wafer. Other alternatives include etching the lid wafer, typically via a wet process. However, the angle achieved when etching glass or silicon is usually larger than 20 degrees. An abrasion process referred to as "powder blasting" forms openings in materials such as glass at an angle of about 20 degrees as a natural consequence of the process.

Figure 21A:
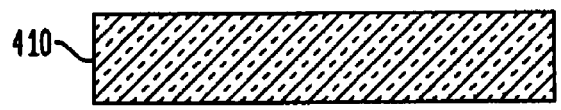
FIGS. 21A through 21D are partial sectional views illustrating stages in a method of fabricating lidded chips in accordance with an embodiment of the invention.
Figure 21B:
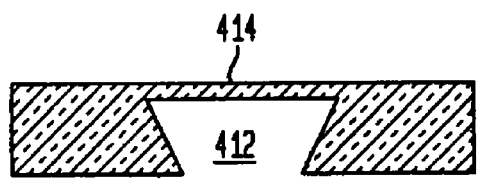
Figure 21C:
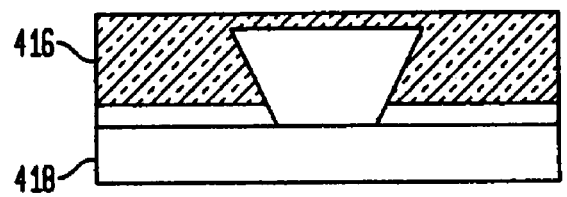
Figure 21D:
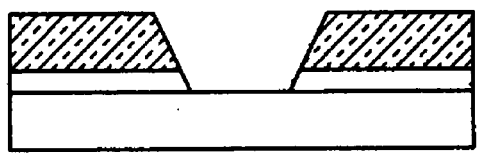

As another alternative a grinding and lapping process can be used, as illustrated in FIGS. 21A-21D. Such process begins with a planar lid wafer 410 (FIG. 21A), preferably consisting essentially of glass but which may be made of other materials, e.g., silicon. The lid wafer is thicker than the final desired lid thickness. The wafer is machined to form slots 412, while preserving windows 414 above the slots for mechanical integrity (FIG. 21B). The machined glass wafer 416 is then bonded to the device wafer 418, as shown in FIG. 21C. Subsequently, the windows 414 are removed by a thinning process, such as grinding and lapping to produce the final lid contour as shown in FIG. 21D.

Figure 22A:
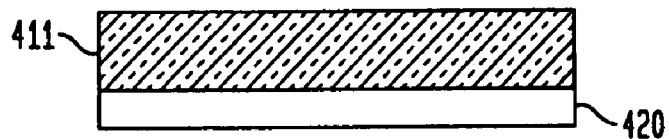
FIGS. 22A through 22E are partial sectional views illustrating stages in a method of fabricating lidded chips in accordance with an embodiment of the invention.
Figure 22B:
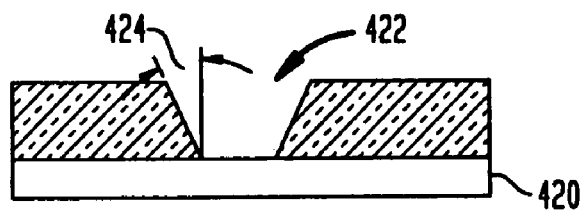
Figure 22C:
Figure 22D:
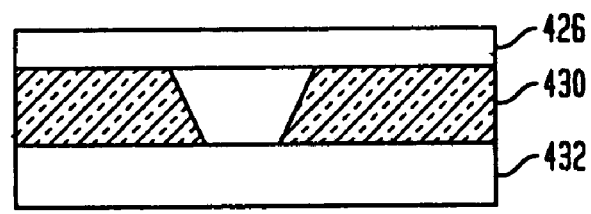
Figure 22E:
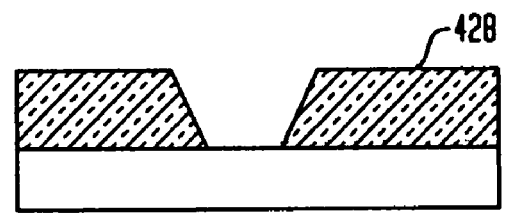

In another process illustrated in FIGS. 22A through 22E, a lid wafer 411, consisting essentially of glass, for example, is machined while the lid wafer is attached to a transfer layer 420 to form tapered slots 422 (FIG. 22B) having the desired slope angle 424. The transfer layer includes an adhesive that can be peeled or otherwise removed, as by rinsing, dissolving, etc., after use. After the lid wafer is machined, a further transfer layer 426 (FIG. 22C) is attached to the machined face 428 of the glass wafer and the first transfer layer 420 removed. Then, the machined lid wafer 430 is bonded to the device wafer 432 (FIG. 22D). Thereafter, the transfer layer 426 is removed from the machined face to complete the operation (FIG. 22E).

Figure 23A:
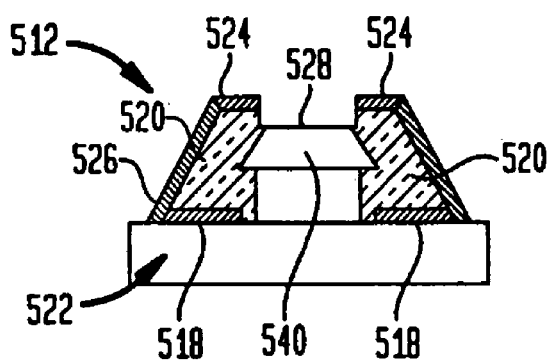
FIGS. 23A through 23C are sectional views lidded chips in accordance with various embodiments of the invention.
Figure 23B:
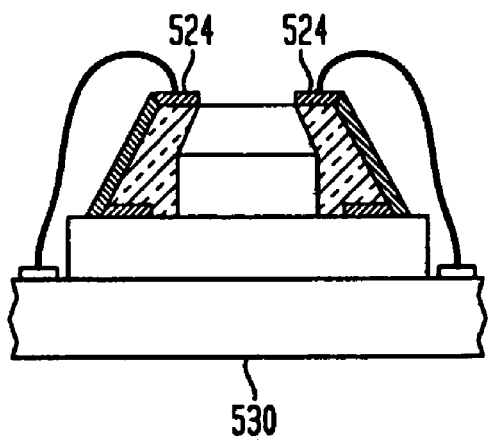
Figure 23C:
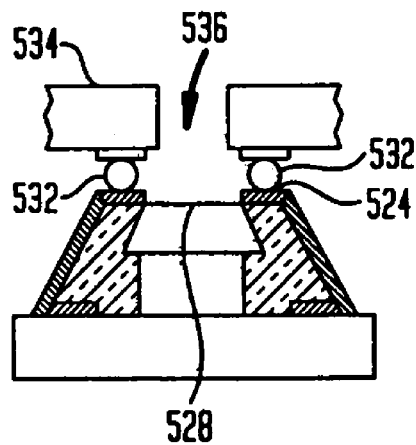

Referring to FIGS. 23A-23C, some alternative ways are illustrated for forming interconnections between the individual lidded device chip and an external circuit element. For example, FIG. 23A illustrates a unit 512 in which a conductive trace provides conductive interconnection between a bond pad 518 on ledge 522 of the chip and an exposed contact 524, e.g., a land at a top surface of the unit. Specifically, FIG. 23A illustrates an example in which the conductive trace runs on an external surface of a dielectric support structure or encapsulant 520. Such structure 520 can be formed, for example, by molding over the side surfaces of the lid 540, taking care to avoid contacting the top surface 528 of the lid with the encapsulant. For protection, prior to molding the encapsulant, a removable lift-off layer can be provided on the top surface 528. Simultaneous patterning of conductive traces 520 which extend up the opposing external walls of encapsulant 526 can be patterned from a metal layer using one or more of the methods described in U.S. Pat. No. 5,716,759 to Badehi, the disclosure of which is hereby incorporated by reference herein.

Alternatively, as shown in FIG. 23B, contacts 524 of unit 512 can be wire-bonded to a circuit panel 530. In another alternative, bumps 532 (FIG. 23C) of solder or other fusible material are formed on contacts 524 for further interconnection, such as to a circuit panel 534 having an opening 536 corresponding to the dimensions of the top surface 528 of lid.

Figure 24A:
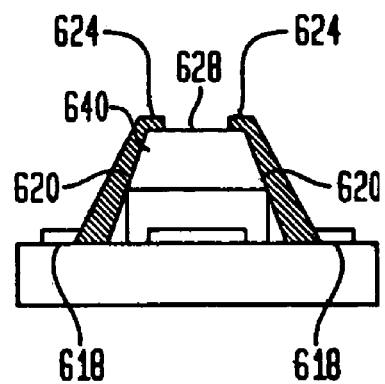
FIGS. 24A through 24C are sectional views lidded chips in accordance with various embodiments of the invention.
Figure 24B:
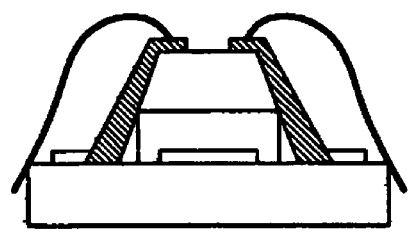
Figure 24C:
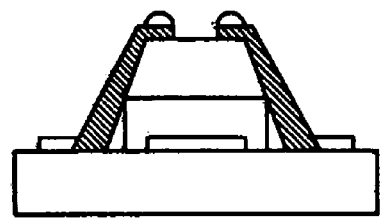

FIG. 24A illustrates a variation of the above structure in which a conductive trace 620 is patterned to extend from each bond pad 618 along external edges of the sealing layer 626 and the lid 640 to connect to a set of exposed upper contacts 624. The upper contacts 624 overlie peripheral locations of the top surface 628 to facilitate conductive interconnection to an external circuit, such as through a circuit panel in a manner as shown in FIG. 23C. FIGS. 24B and 24C illustrate other possible types of external interconnection which are similar to those described above in relation to FIGS. 23B and 23C.

Figure 25:
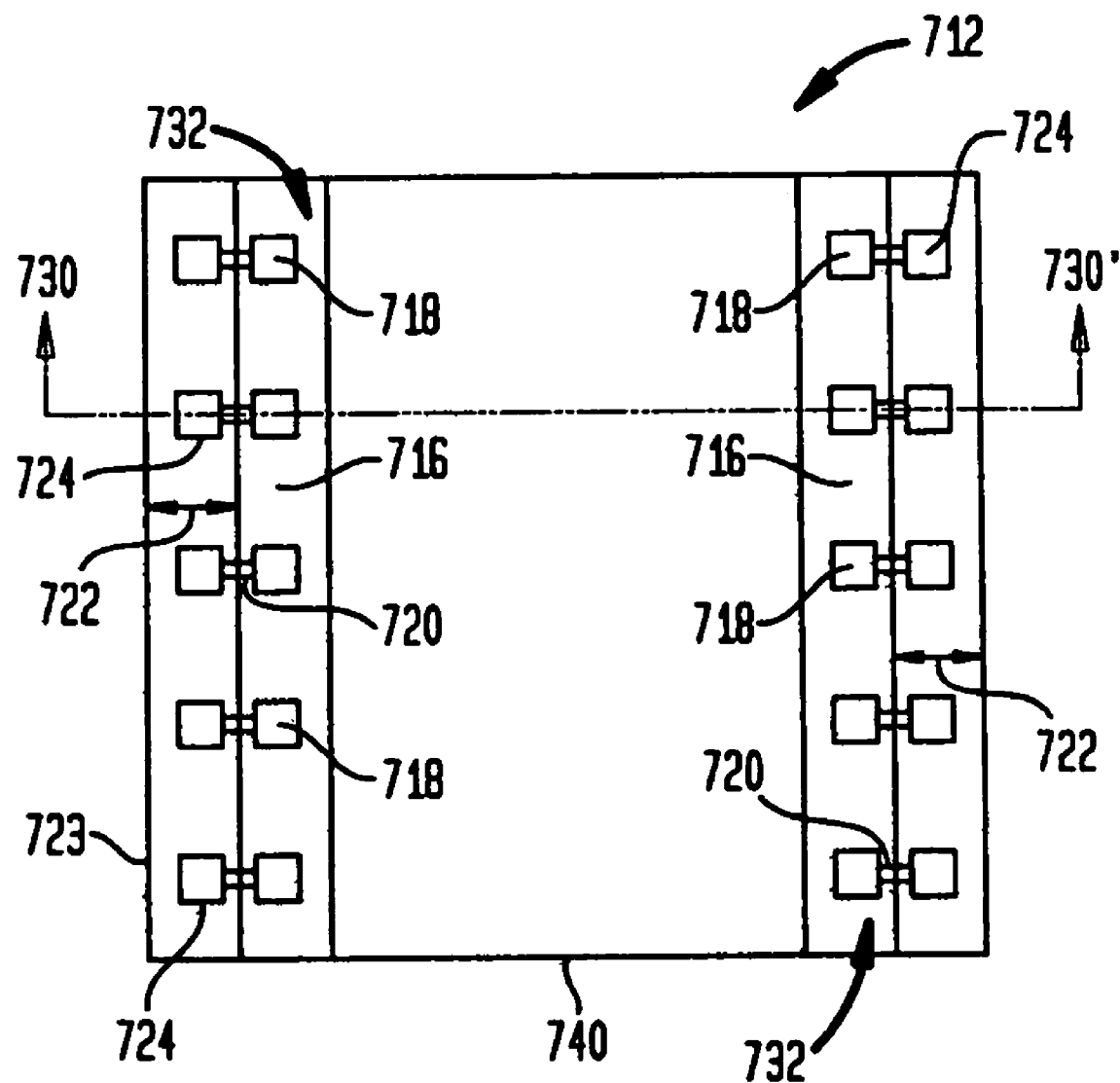
FIG. 25 is a plan view of a lidded chip corresponding to the lidded chips in accordance with the embodiments illustrated variously in FIGS. 23A-C, 24A-24C.
Figure 26A:
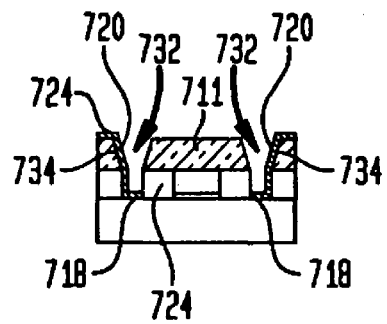
FIGS. 26A-26C are sectional views of lidded chips in accordance with various embodiments of the invention.

FIG. 25 is a top-down plan view of a lidded chip 712 according to a further embodiment. In this embodiment, bond pads or other contacts 718 in contact regions 716 of the chip are disposed a distance 722 away from edges 723 of the chip. A lid 740 overlies a device region of the chip between the contact regions. As best shown in the corresponding sectional view through line 730-730' (FIG. 26A), portions of the sealing material 724 and lid wafer 711 overlying the contact regions and bond pads 718 of the chip are removed to form channels 732. Such channels can be formed using any one or more of the above-described techniques for removing a portion of the lid and the sealing material and/or support structures underlying the lid. Preferably, walls 734 of the channels are sloped at an angle to more readily facilitate patterning of conductive traces 720 thereon, such as through use of techniques described in the incorporated U.S. Pat. No. 5,716,759 to Badehi. As in the above case, the conductive traces 720 extend from the bond pads 718 upward along walls 734 of channels 732 to upper contacts 724, e.g., lands, at the top surface of the lidded chip 712.

Figure 26B:
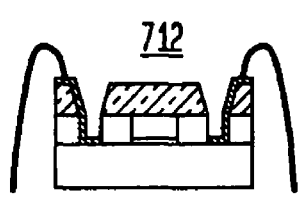
Figure 26C:
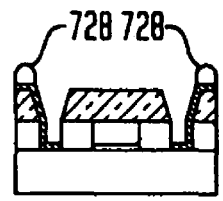

Bond wires can then be used to interconnect the lidded chip 712 to a circuit panel below the lands (FIG. 26B). As illustrated in FIG. 26C, further interconnection to an external circuit can then be made through conductive bumps 728 disposed on the upper contacts 724, e.g., as in the manner described above with reference to FIG. 23C.

One difference from the above-described structures is that each of the channels exposes the contacts of only one chip. Such contacts may be provided in a single row within each contact region, as shown in FIG. 25, allowing the width of the cut through the lid wafer to be narrower than in the examples shown above.

Figure 27B:
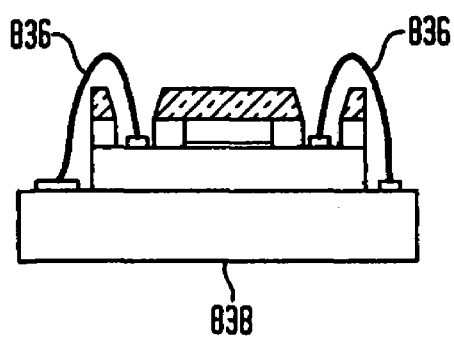
FIGS. 27B and 27C are partial sectional views of various lidded chips corresponding to the plan view shown in FIG. 27A.
Figure 27C:
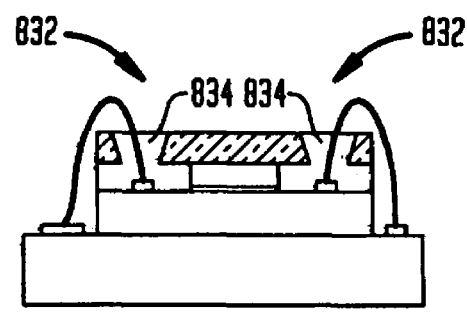
Figure 27A:
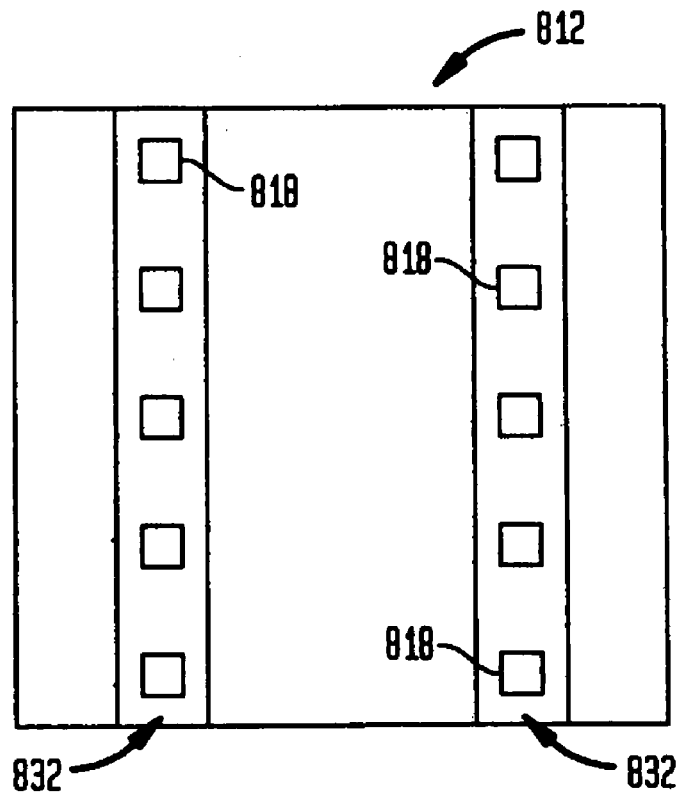
FIG. 27A is a plan view of a lidded chip in accordance with an embodiment of the invention.

In a particular variation, the bond pads 818 of a similar lidded unit 812 lie exposed within channels 832 formed in the lid and sealing material below the lid (FIG. 27A). In this case, the channels are formed in such manner to permit access to the bond pads by a wire-bonding tool to attach bond wires 836 (FIG. 27B). Specifically, the channels are formed with sufficient width in relation to their height and with walls angled appropriately to permit the wire-bonding tool to reach the bond pads within the channels. After forming wire-bonds to a circuit panel 838, optionally, an encapsulant 834 (FIG. 27C) can be deposited within the channels 832 and cured to provide support for the bond wires.

Figure 28:
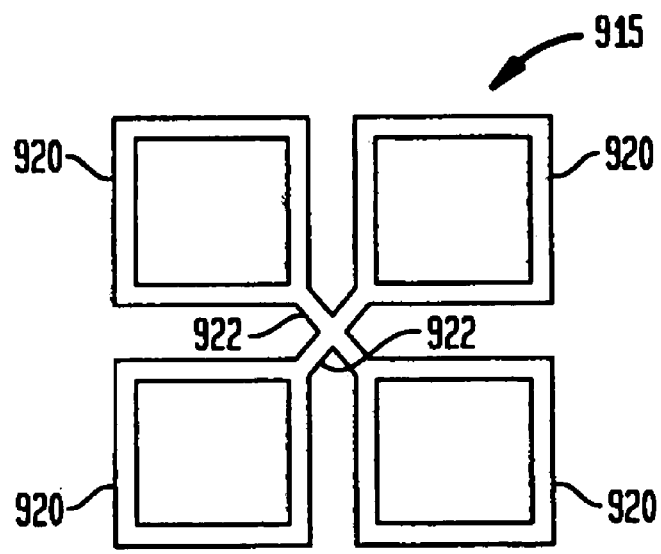
FIG. 28 is a partial plan view illustrating adhesive support wall structures for use in making lidded chips in accordance with an embodiment of the invention.

In a particular example, the "picture frame ring seal" or walls 32 of a support structure surrounding the device region of the chip, as shown in FIGS. 6A-6B, is patterned prior to being joined to the lid wafer. Such sealing material, which may be provided in form of an adhesive, can be patterned first by punching and then laminated to the lid wafer by heat and pressure, as by use of a roller or other press. The adhesive can be punched in a pattern 915 (FIG. 28) of rectangular ring structures 920 connected by temporary elements 922 which maintain the structural integrity of the sheet of adhesive during the subsequent lamination and manufacturing processes. When the chip is later singulated, the temporary elements are severed from each other at the dicing lanes between chips.

The following possible advantages may result from use of a punched adhesive. Patterning is performed with a punching tool instead of photolithographic processing which can be expensive by comparison. Application of liquid phase adhesives to the device wafer can be avoided using the punched adhesive. In such way, measures such as non-wettable guard rings needed to protect the device region from contact with the sealant can be eliminated. Alternatively, in lidded units without guard rings, design rules for placing the adhesive can be relaxed. In addition, polishing and/or chemical processing of an adhesive layer on the lid wafer is eliminated, reducing yield loss, which can be approximately 5%. In addition, use of the punched adhesive facilitates the above-described processes for making lidded units as illustrated in FIG. 6A or 6B. That is, the process uses lid wafers consisting essentially of regular glass which need not have a coefficient of thermal expansion ("CTE") such as borosilicate glass shih exactly matching that of the device wafer.

Figure 29A:
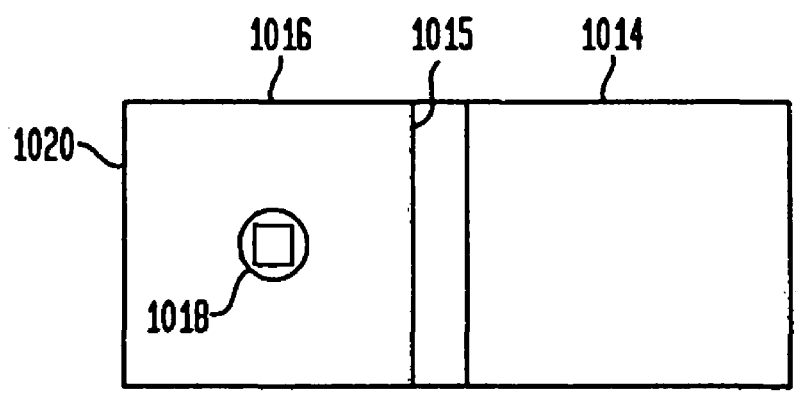
FIG. 29A is a fragmentary partial plan view and FIG. 29B is a corresponding sectional view illustrating a packaged chip in accordance with an embodiment of the invention.
Figure 29B:
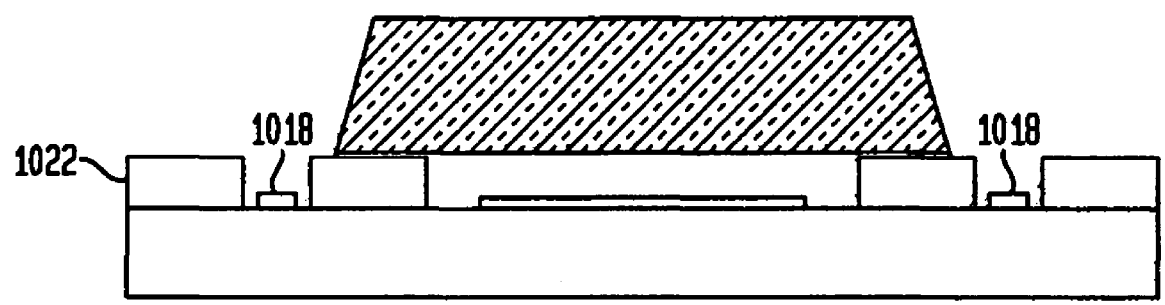

FIG. 29A is a plan view and FIG. 29B a corresponding sectional view which illustrate a further variation in which the punched adhesive extends from an edge 1015 of the device region 1014 outward over the contact region 1016 to the peripheral edge 1020 of the chip. However, holes are provided in the adhesive so as to expose only individual bond pads 1018 of the chip within the holes. The adhesive layer 1022 (FIG. 29B) overlying much of the area of the contact region 1016 protects the bond pads from glass fragments striking the bond pads. As a result, a wider variety of processes and wider process latitude can be used to remove portions of the lid wafer overlying the contact region without harming the bond pads.

Figure 30:
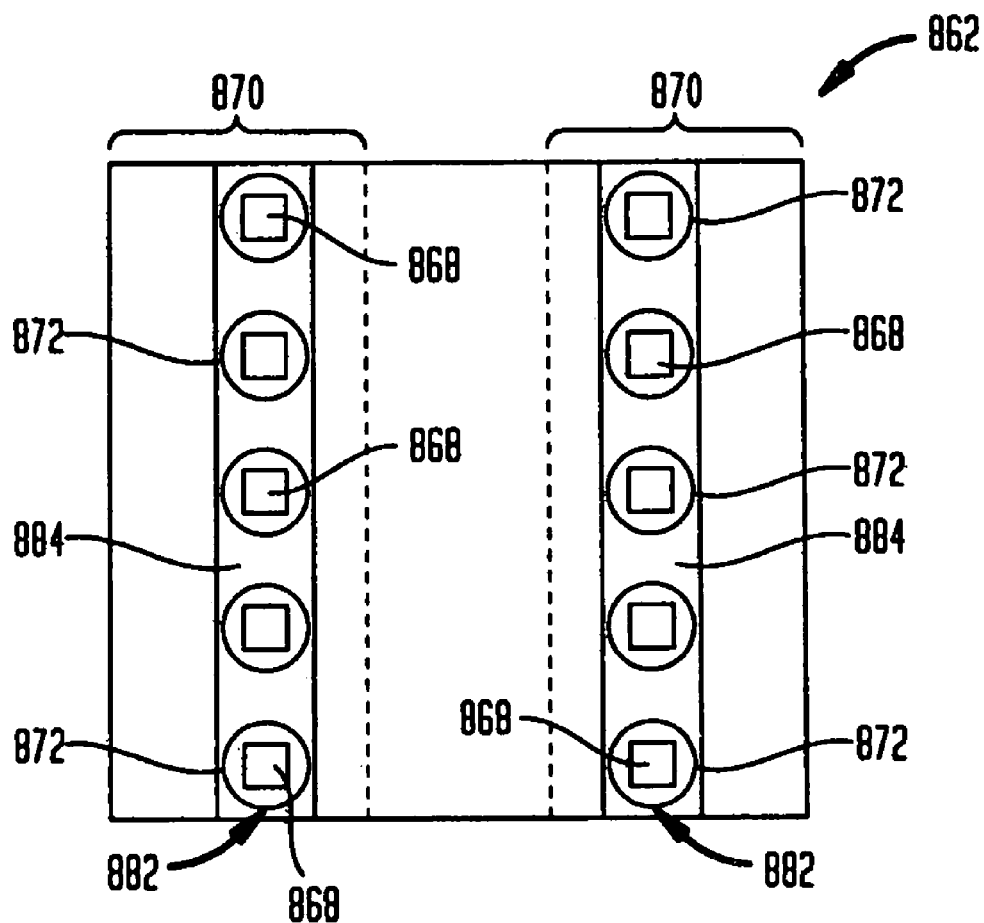
FIG. 30 is a plan view of a packaged chip in accordance with an embodiment of the invention.

FIG. 30 is a plan view of a lidded chip 862 in accordance with a variation of the embodiment illustrated in FIGS. 27A-27B. As applied to portions 870 of the device wafer, preferably such adhesive layer is a continuous sheet except for through holes 872 patterned therein, each of which exposes an individual bond pad 868 of the device wafer.

In a particular embodiment, the adhesive layer is formed by spreading a flowable photosensitive material, e.g., a polymeric material over portions 870 of the device wafer or corresponding portions of the lid wafer and then joining the lid wafer with the device wafer and such adhesive layer in between. Subsequently, preferably after the channels 882 in the lid wafer have been opened, such as by one or more of the above-described processes of sawing, scribing, etching, etc., holes 872 in the adhesive layer are patterned simultaneously by photolithography to expose the individual bond pads.

In another embodiment, the through holes in the adhesive layer are patterned by punching prior to being applied as a layer, for example, through rolling, to one of the lid wafer or the device wafer. Access is provided through such through holes for a wire-bonding tool to connect bond wires to the bond pads. Alternatively, one or more of the techniques described above with reference to FIGS. 23A, 25 and 26A can be used to pattern conductive traces to an upper surface of the unit.

Among advantages of this embodiment is that the adhesive layer overlies more of the area within the channels 882. When the lid wafer is sawn to expose the channels such as by one of the processes described above, e.g., with respect to FIG. 3A, the adhesive layer helps stop loose material from striking the bond pads and damaging them. Other advantages relate to particular configurations of lidded units. For example, in chips where the imaging area is located asymmetrically within the chip, the imaging area can be located very close to certain bond pads. In addition, the adhesive layer may need to be very thin, i.e., to achieve very small spacing between confronting surfaces of the lid wafer and device wafer for hermeticity. In such case, the greater coverage of the adhesive layer over the channels is especially beneficial in helping to avoid damage to the bond pads. Another advantage that may be achieved is greater design freedom. The adhesive need not be applied in a way to avoid the adhesive from spreading onto the channels and the bond pads therein. For this reason, tolerances on applying the adhesive over portions 870 can thus be loosened.

Figure 31:
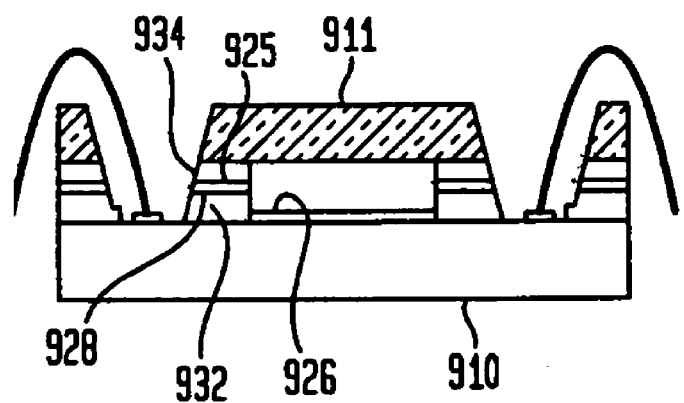
FIG. 31 is a partial sectional view illustrating a packaged chip in accordance with a particular embodiment of the invention.

In another variation of the above embodiment shown in FIG. 31, support structures 932, 934, such as those fabricated in accordance with the embodiments described above, are provided on each of the front surface 926 of the device wafer 910 and the inner surface 925 of the lid wafer, respectively. The lid wafer and device wafer are then attached together by an adhesive 928 between confronting faces of the support structures 932, 934. Preferably, through holes are pre-formed in at least the support structures 932 which are attached to the front face of the device wafer. Corresponding holes or channels can be formed in the support structures 934 which are attached to the lid wafer 911 as a result of the process of sawing channels in the lid wafer. Alternatively, the holes can be pre-formed in the support structures 934 prior to joining the lid wafer to the device wafer. An advantage of the structure illustrated in FIG. 31 is that the adhesive used to bond the two wafers together is less likely to spill onto the device region or bond pads because of greater separation therefrom due to the height of the bonding surface and adhesive 928 above the front surface 926 of the device wafer.

Figure 32A:
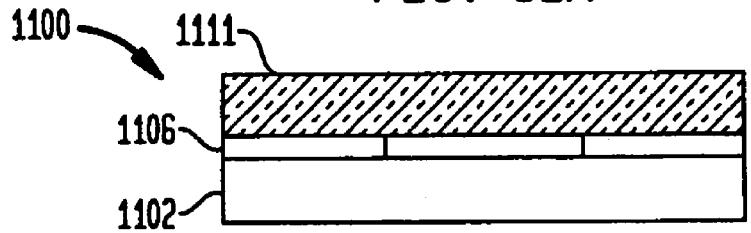
FIGS. 32A through 32D are partial sectional views illustrating stages in fabricating packaged chips in accordance with an embodiment of the invention.
Figure 32B:
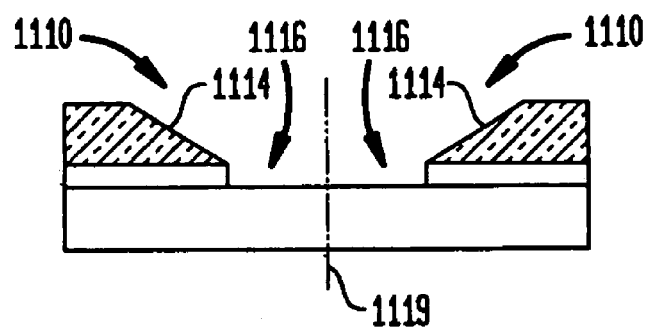
Figure 32C:
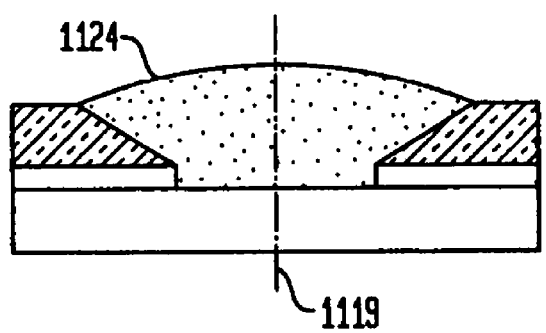
Figure 32D:
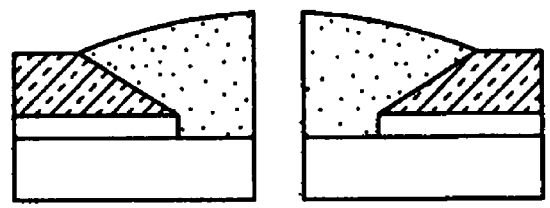

FIGS. 32A-32D illustrate a method that can be applied to further seal external edges of individual units, such as for purposes of improving hermeticity, strengthening exposed ledges of a chip or for electrical isolation, among others. In a particular example, an assembly 1100 including a lid wafer 1111 joined to a device wafer 1102 through a sealing material 1106 (FIG. 32A) is processed to form units 1110 (FIG. 32B). Each such unit includes a lid having sloped edges 1114 which slope upward in a direction away from a dicing lane 1119 between the two units. FIGS. 32A-32D illustrate a case in which a further sealing material is applied to regions of chips that do not contain contacts. An encapsulant 1124 (FIG. 32C) or other insulative, curable material, preferably including a polymer, is then applied to the area between the sloped lid edges. Finally, the assembled lid wafer and device wafer is severed along dicing lanes 1119 to form separated individual units 1110 (FIG. 32D).

Figure 32E:
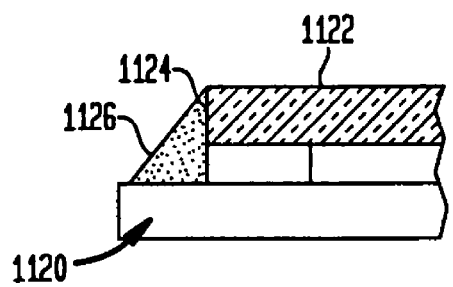
FIGS. 32E and 32F are fragmentary partial sectional views illustrating packaged chips in accordance with an embodiment of the invention.
Figure 32F:
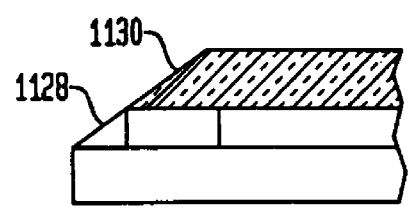

FIGS. 32E and 32F are partial sectional diagrams illustrate alternative profiles that the encapsulating or additional sealing material may make upon the chip. FIG. 32E illustrates a case in which the additional sealing material 1126 is deposited onto the ledge 1120. Typically, the encapsulating material is deposited after formation of interconnects, e.g., wire-bonds (not shown), to protect both the ledge and the interconnects to form a seal to a lid 1122 that has a vertically rising edge 1124. FIG. 32F illustrates a case in which the additional sealing material 1128 is deposited adjacent to a sloped edge 1130 of a lid.

Figure 33A:
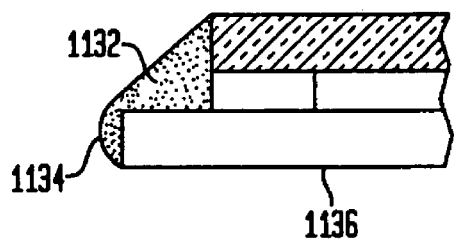
FIGS. 33A, 33B and 33C are fragmentary partial sectional views illustrating packaged chips in accordance with an embodiment of the invention.
Figure 33B:
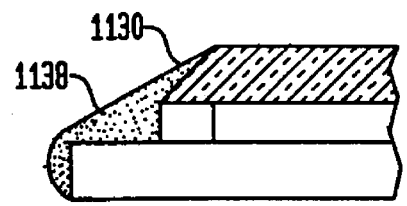

FIG. 33A illustrates a sealing material applied in accordance with a further embodiment in which the sealing material 1132 is allowed to spread further onto a peripheral edge 1134 of the chip 1136, such as to further improve the seal or to strengthen protection against chipping or breaking. FIG. 33B illustrates a corresponding case when the sealing material 1138 is applied to overlie the sloped edge 1130 of a lid.

Figure 33C:
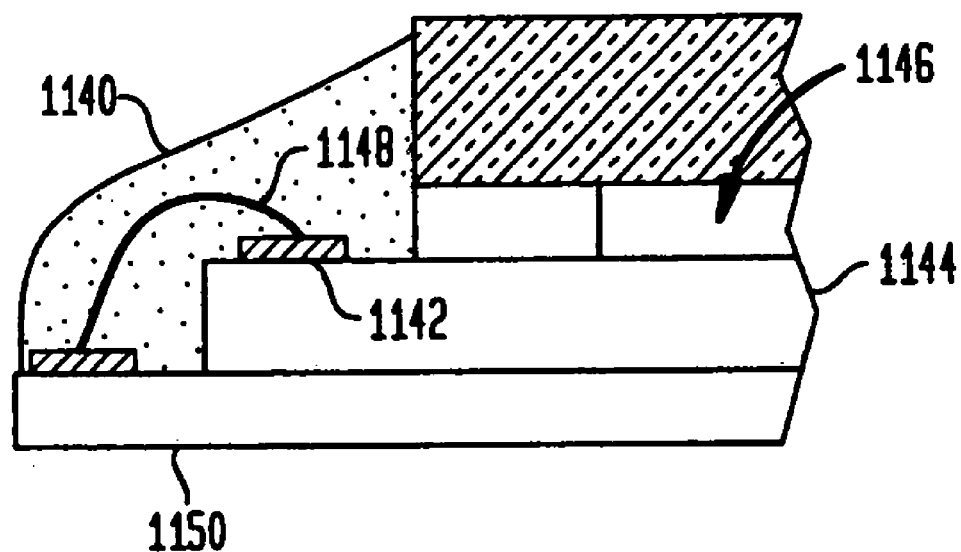

FIG. 33C is a partial sectional view illustrating a further variation in which an encapsulant 1140 is applied over an exposed ledge 1142 of a chip 1144. In this way the encapsulant simultaneously improves the quality of the seal provided to interior cavity 1146 and to provide mechanical support and protection to bond wires, such as bond wire 1148 which connects the chip to a terminal of a circuit panel 1150 below the chip.

Other particular structural features and techniques may be employed to improve the quality of the seal provided to the interior cavity of a lidded unit. For example, as shown in the partial sectional view of FIG. 34, the surface of the lid wafer in contact with a support structure or adhesive in the lidded unit is roughened to increase adhesion. Particular materials, such as PTFE, exhibit beneficial properties in terms of resistance to moisture penetration and resilience at high temperature. However, PTFE has low surface energy making it difficult to form a strong bond to most materials. When an improved bond can be achieved between such material and the lid or device wafer which it contacts, an improved seal is obtained. Increased surface area of contact between the lid, for example, and an adhesive improves the strength of the bond. In addition, the leak rate past such bond decreases because gases must travel a greater distance over the roughened surface between the lid and the adhesive to reach the interior cavity or arrive at the exterior therefrom.

Figure 34:
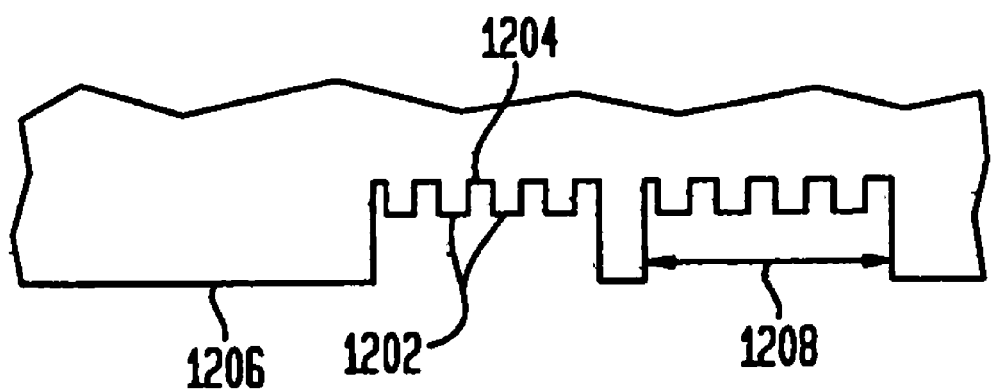
FIG. 34 is a fragmentary sectional view illustrating a bonding surface of lid element including in a packaged chip according to an embodiment of the invention.

In the example shown in FIG. 34, either micro-scale topography (features 1202 or spacings 1204 of less than 1 micron (μm) size) and/or larger, macro-scale topography (features 1206 or spacings 1208 of greater than 1 micron in size) are incorporated into the surface of the lid and/or device wafer in contact with the sealing material. Examples of micro-scale topography include corrugations, castellations, saw-teeth and random orientations of the surface which can be produced by a variety of means. By way of example, a saw tooth surface can be produced by controlled grinding and randomly oriented surface topography can be produced by abrading the surface through blasting with grit.

Figure 35:
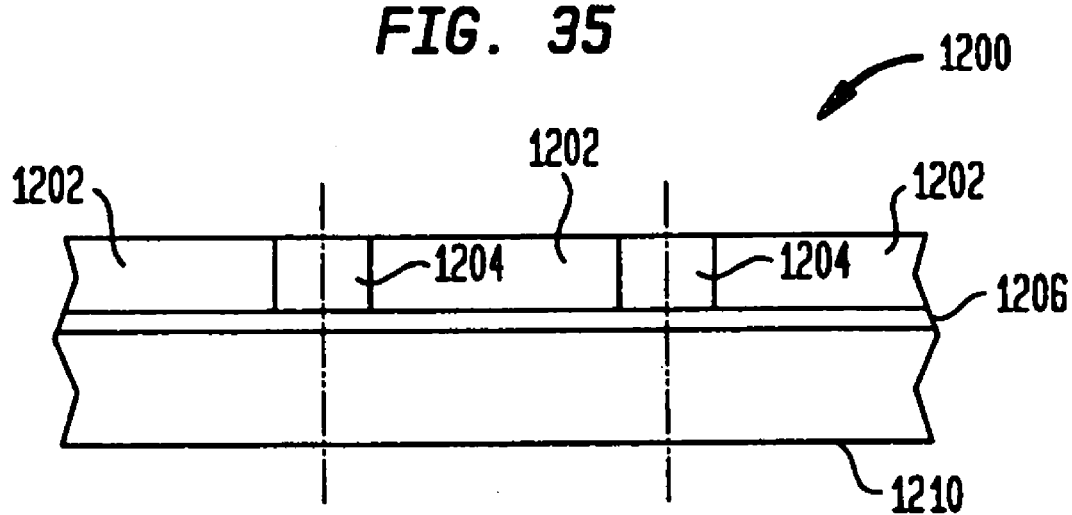
FIGS. 35-36 are partial sectional views illustrating a method of fabricating packaged chips according to an embodiment of the invention.
Figure 36:
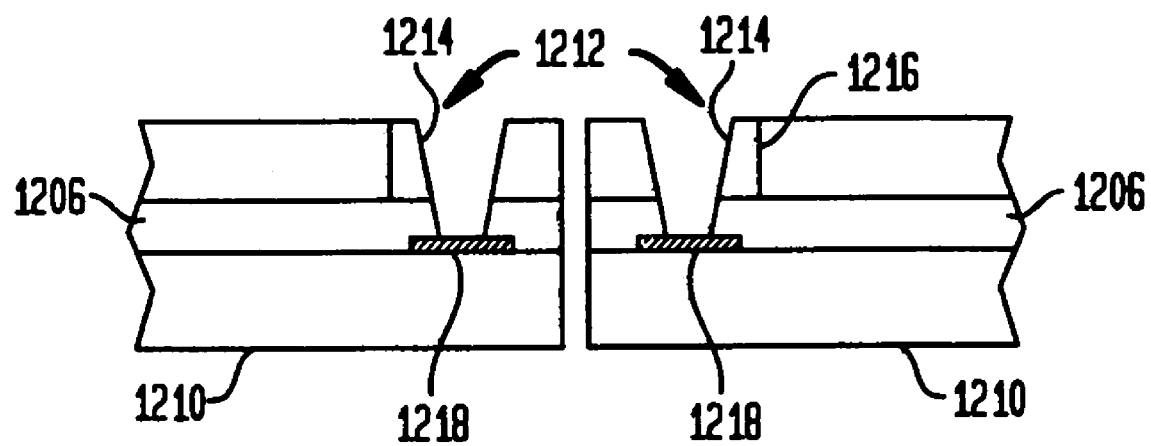
Figure 37A:
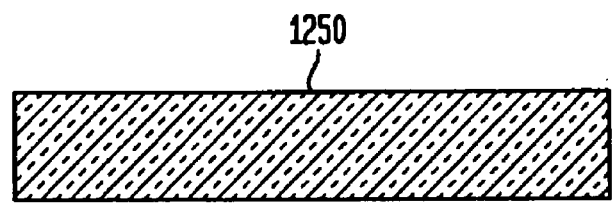
FIGS. 37A-37D are partial sectional views illustrating stages in a method of fabricating a lid wafer used in a method of packaging chips according to an embodiment of the invention.
Figure 37B:
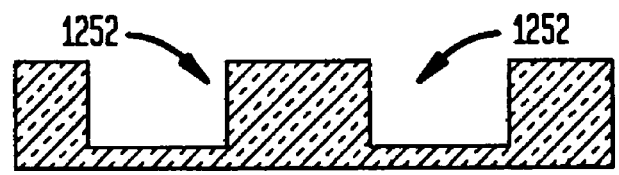
Figure 37C:
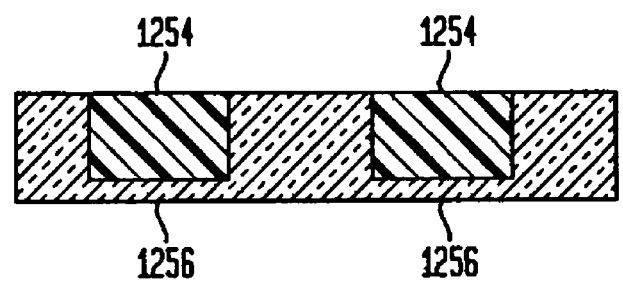
Figure 37D:

FIG. 35 is a sectional view illustrating a method of forming lidded units according to a further variation of the above-described methods. In this method, glass portions 1202 of a lid wafer 1200 are tiled with other portions 1204 which include a polymeric material, and the lid wafer bonded with an adhesive 1206 to a device wafer 1210. As shown in FIG. 36, openings 1212 are formed through the polymeric portions 1204 and adhesive 1206 to expose contacts, e.g., bond pads 1218, of the device wafer 1210. One or more of the above-described methods of forming openings may be used, such as for example, sawing, etching, laser ablation or drilling, thermosonic or mechanical abrasion, among others. The openings 1212 can be made either in form of channels which overlie rows of contacts on the device wafer as described above (FIG. 27A), or in form of through holes which expose individual ones of the through holes. After the openings are formed, polymeric features 1214 remain attached to walls 1216 of the glass portions 1202, protecting the exposed edges of the glass portions from damage from contact, such as due to movement of a wire-bonding tool.

FIGS. 37A through 37D illustrate a method of fabricating the tiled lid wafer 1200 shown in FIG. 35. In such method, a continuous sheet 1250 (FIG. 37A) of the lid wafer material, e.g., glass is processed, e.g., by sawing, abrading, machining, anisotropic etching, etc., to form slots 1252 therein. The slots are then filled with a polymeric material 1254 (FIG. 37C), which is then cured. Areas 1256 of the original sheet under the slots are then removed, such as by grinding and lapping to produce the tiled wafer 1200.

The foregoing method is only one example for manufacturing the tiled wafer. In another example, the tiled wafer is constructed by injection molding or casting polymeric material to form a wafer-size grid structure corresponding to the polymeric portions 1204 of the tiled lid wafer. Individual glass portions are then placed in locations between the polymeric portions of the grid to complete the tiled wafer.

Figure 38:
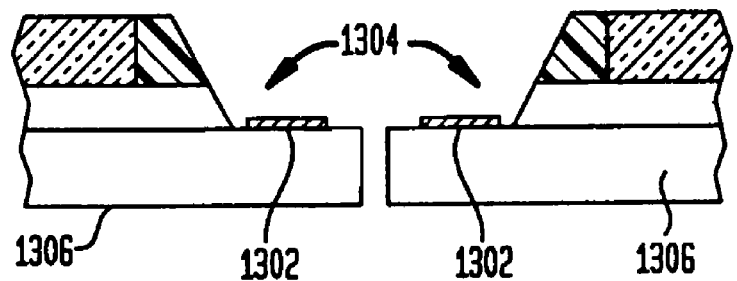
FIG. 38 is a partial sectional view illustrating a packaged chip in accordance with an embodiment of the invention.

FIG. 38 illustrates a variation of the concept shown in FIG. 35, in which the removal of the polymeric material above the bond pads 1302 exposes the ledges 1304 of individual chips 1306 completely.

Figure 39:
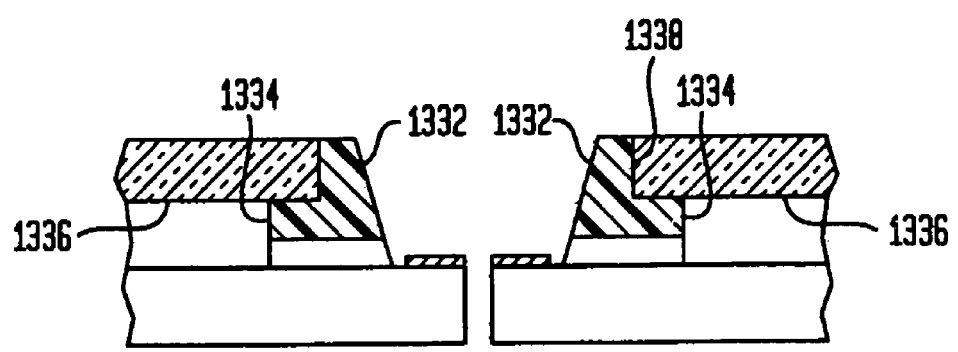
FIG. 39 is a partial sectional view illustrating a packaged chip in accordance with an embodiment of the invention.

In a further variant shown in FIG. 39, support structures 1332, preferably consisting essentially of a polymeric material, include portions 1334 which extend underneath the bottom surface 1336 of optical lid portions 1338 a short distance. In one example, each of the portions 1334 extends a distance under surface 1336 from the edge 1338 of the lid equal to about three percent or less of the total width of the bottom surface. With such arrangement, the support structures are better able to support the lid elements and a more effective seal can be obtained.

Figure 40:
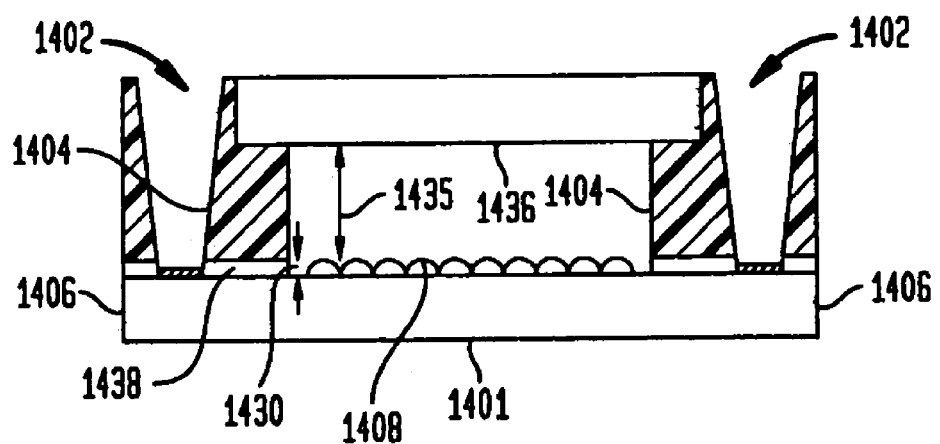
FIG. 40 is a partial sectional view illustrating a packaged chip in accordance with an embodiment of the invention.

In a particular variation of such embodiment, channels 1402 or contact holes are patterned in polymeric support structures 1404 (FIG. 40). In this arrangement, similar to that shown in FIGS. 27A-27C, the channels 1402 formed in the polymeric structures expose the bond pads 1418, but without having to expose areas of the chip completely out to the edges 1406. In a case where the device region includes an imaging device 1408, the height 1435 of the inner surface of the 1436 lid above the imaging device 1408 is preferably 10 times the thickness 1430 of an adhesive 1438 that bonds the support structure to the chip 1401.

Figure 41A:
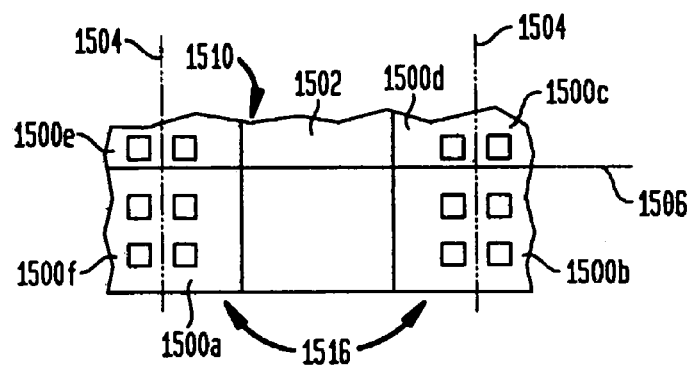
FIGS. 41A and FIG. 41B are a partial plan view and corresponding partial sectional view illustrating a stage in fabrication of a packaged chip in accordance with an embodiment of the invention.
Figure 41B:
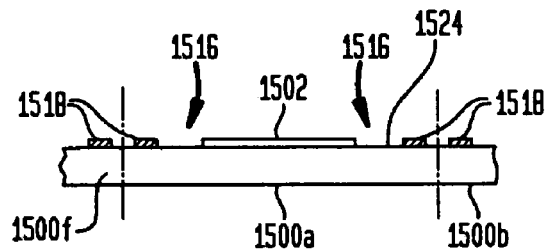

A wafer-level method of fabricating a sealed device according to another embodiment of the invention will now be described with reference to FIGS. 41A through 46B. A high degree of hermeticity can be achieved in the sealed device, owing to steps performed in its fabrication. A microelectronic device or MEMs device, e.g., optoelectronic device or SAW device is provided in a device region 1502 of a chip 1500a included in a device wafer 1510. A partial plan view of the device wafer 1510 is shown in FIG. 41A. Boundaries between an individual chips 1500a and portions illustrated of chips adjacent thereto including chips 1500b, 1500c, 1500d, 1500e, and 1500f are defined by dicing lanes. The dicing lanes include vertically oriented dicing lanes 1504 and horizontally oriented dicing lanes 1506, these directions referring to transverse directions of the layout parallel to horizontal or major surface of the device wafer. Subsequently, the chips will be singulated by sawing or otherwise severing the device wafer along the dicing lanes. As shown in the sectional view of FIG. 41B, bond pads 1518 are provided in contact regions 1516 on the front surfaces 1524 of each chip including chips 1500a, 1500b and 1500f.

Figure 42:
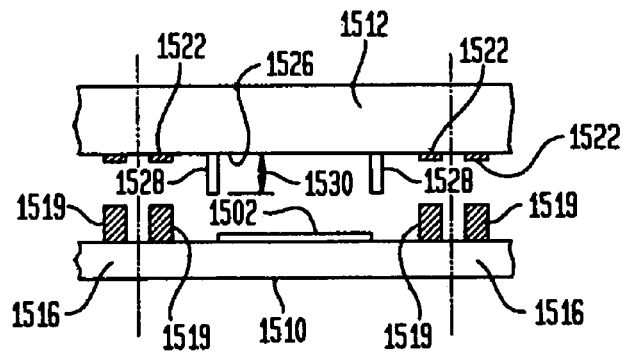
FIG. 42 is a partial sectional view illustrating a subsequent stage of fabrication.

FIG. 42 is an exploded partial sectional view of the device wafer 1510 which is about to be joined to a lid wafer 1512. As shown therein, the bond pads 1519 of the device wafer now appear taller than before, having been purposefully thickened. Thickening can be achieved, for example, by plating nickel (Ni), Indium (In) and gold (Au) onto bond pads of lithographically patterned aluminum, for example. In a particular embodiment, the bond pads are thickened by electroless plating of nickel, followed by immersion electroplating of gold. A thin removable mask coating, e.g., of a removable material such as a photoresist or solder mask, can be patterned on the device wafer by photolithography, for example, prior to such plating steps to protect the device region 1502 from unwanted plating.

For its part, the lid wafer 1512 includes corresponding metal contact pads 1522 on its inner surface 1526, these contact pads 1522 being sized and positioned to mate with the thickened bond pads 1519 of the device wafer. The contact pads are relatively thick and can be formed by the above-described processes for electroless nickel plating followed by gold electroplating. In addition, a rectangular support and sealing structure, preferably consisting essentially of a polymeric material, for example, a photoimageable polymer, is provided in form of a "picture frame ring seal", on the inner surface 1526, in a manner as described above with reference to FIGS. 2A through 2E. In the embodiment shown in FIG. 42, the rectangular sealing structure 1528 is attached to the lid wafer at a location between the device region 1502 and the contact region. Optionally, the polymer included in the sealing structure is sufficiently sticky to remain adhered to the lid wafer and device wafer and serve as the primary bonding agent between the two wafers. In addition, the sealing structure protects the device region against liquid or gas penetration during subsequent dicing or encapsulation of the chip. The distance or height 1530 that the sealing structure 1528 extends from the inner surface 1526 is designed to equal the combined height of the thickened bond pads 1519 together with the contact pads 1522.

Figure 43A:
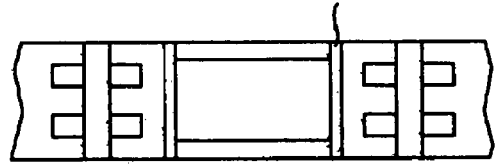
FIG. 43A and FIG. 43B are a partial plan view and corresponding partial sectional view illustrating a further stage in fabrication of a packaged chip in accordance with an embodiment of the invention.
Figure 43B:
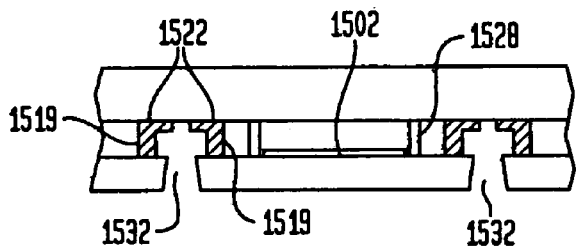
Figure 44A:
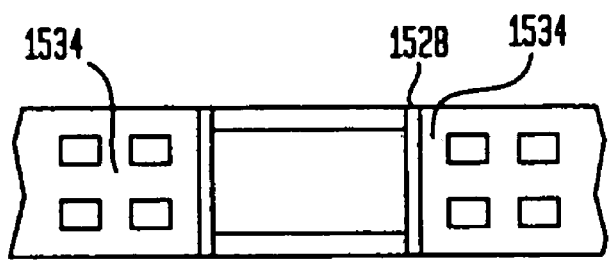
FIG. 44A and FIG. 44B are a partial plan view and corresponding partial sectional view illustrating a further stage in fabrication of a packaged chip in accordance with an embodiment of the invention.
Figure 44B:
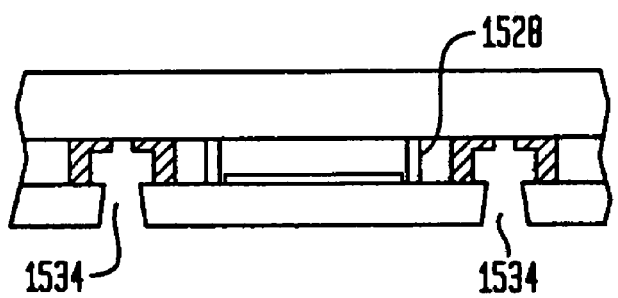

Subsequently, as shown in the plan view of FIG. 43A and sectional view of FIG. 43B, the device wafer is aligned and joined to the lid wafer by heat and pressure to cause the thickened bumped bond pads of the device wafer to form strong metallic bonds with the contact pads 1522 on the lid wafer. For example, diffusion bonds are formed in which eutectic mixtures AuIn and AuIn$_2$ result at the interfaces between the bumped bond pads 1519 and the contacts 1522. Simultaneously, the polymeric rectangular sealing structure 1528 now encloses the device region 1502. Once such bonding is completed, openings 1532 such as trenches or through holes are then formed, such as by etching or drilling. Each such opening preferably has a trapezoidal contour. An encapsulant material 1534 (FIGS. 44A-44B) is then introduced into the volume external to the walls of the sealing structure 1528. Ideally, the encapsulant should have high hermeticity once cured, and preferably be hardened by heating to an elevated temperature or by exposure to light at UV wavelengths. Preferably, the encapsulant fills the entire volume surrounding the sealing structure 1528 and has characteristics which permit it to provide an effective seal against penetration of moisture and gases.

Figure 45A:
FIG. 45A and FIG. 45B are a partial plan view and corresponding partial sectional view illustrating a further stage in fabrication of a packaged chip in accordance with an embodiment of the invention.
Figure 45B:
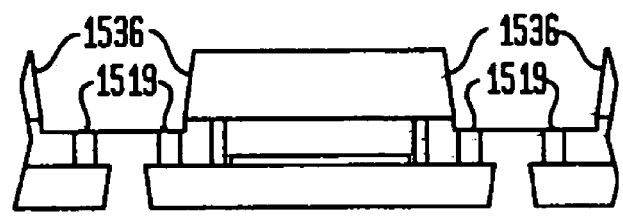

As further shown in FIG. 45A (plan view) and in FIG. 45B (corresponding sectional view), portions of the lid wafer are now removed, such as by application of one or more of the processes described above with reference to FIGS. 4A-15A, 16A-17B and 19-20. Removal is performed in such manner to produce lids covering the device regions of individual chips, in which the lids have sloped edges 1536. Simultaneously, the removal of the lid material over the contact regions exposes the bumped bond pads 1519 of the chips.

Figure 46A:
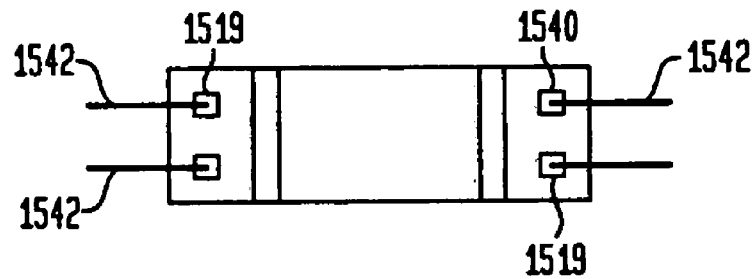
FIG. 46A and FIG. 46B are a partial plan view and corresponding partial sectional view illustrating a further stage in fabrication of a packaged chip in accordance with an embodiment of the invention.
Figure 46B:
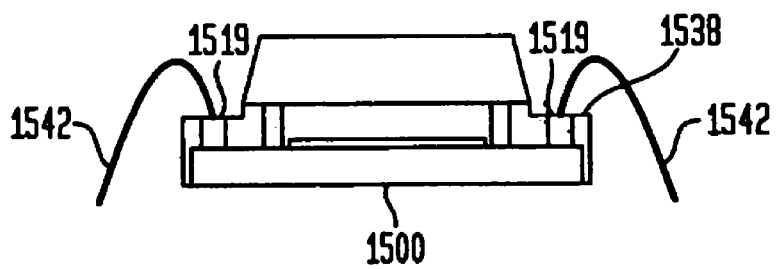

Finally, as illustrated in the plan view of FIG. 46A and the corresponding sectional view (FIG. 46B), the device wafer is singulated into individual chips including a chip 1500. As shown therein, bond wires 1542 can be attached to contacts 1519 or other conductive interconnection be made to chip 1500 through the contacts 1540 exposed at the outer surface 1538 of the encapsulant 1534.

Several different variations of the above processing are possible. Referring to FIG. 42, in one example, instead of forming the longer metallic bumps 1519 on the device wafer side, thinner contact pads are formed on the device wafer, e.g., via electroless nickel plating and corresponding longer metallic bumps are formed on the inner surface of the lid wafer, such as through nickel electroplating.

When this process is used, processing to remove the portions of the lid wafer is preferably continued until the relatively thin contact pads of the device wafer are exposed. In such way, electrical contact to the device wafer is provided through a single metal interface, i.e., through only the electrolessly thickened bond pads of the device wafer and not through portions of metal bumps remaining from the formerly attached lid portions.

In another variation of the above process, contact pads on the lid wafer are eliminated and the sealing structure 1528 serves as the primary bonding structure for sealing the internal cavity over the device region. When completed, the final lidded unit has a structure such as that shown and described above with reference to FIGS. 46A-46B.

Figure 47:
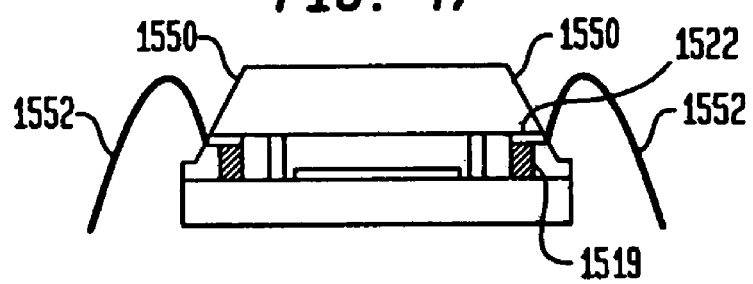
FIG. 47 is a sectional view illustrating a packaged chip in accordance with an embodiment of the invention.
Figure 48:
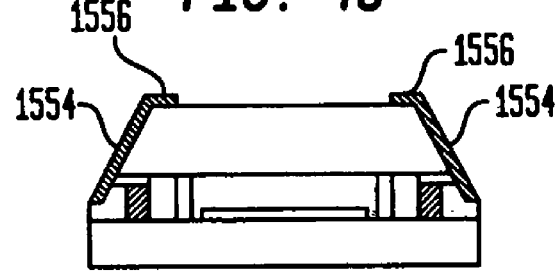
FIG. 48 is a sectional view illustrating a packaged chip in accordance with a variation of the embodiment of the invention shown in FIG. 47.

Finally; in a variant of the above process, the lid wafer is severed in a way that produces sloped edges 1550 (FIG. 47) which overlie portions of the contact pads 1522 and thickened (bumped) bond pads 1519. With the contact pads exposed at the sloped edges, a wire-bonding tool with a capillary tip having appropriately modified angular movement can attach bond wires to the exposed conductor. Alternatively, a further process can be applied to connect conductive traces 1554 and upper contact pads 1556 (FIG. 48) thereto, such as by a process as described above relative to FIGS. 23A through 25.

Figure 49:
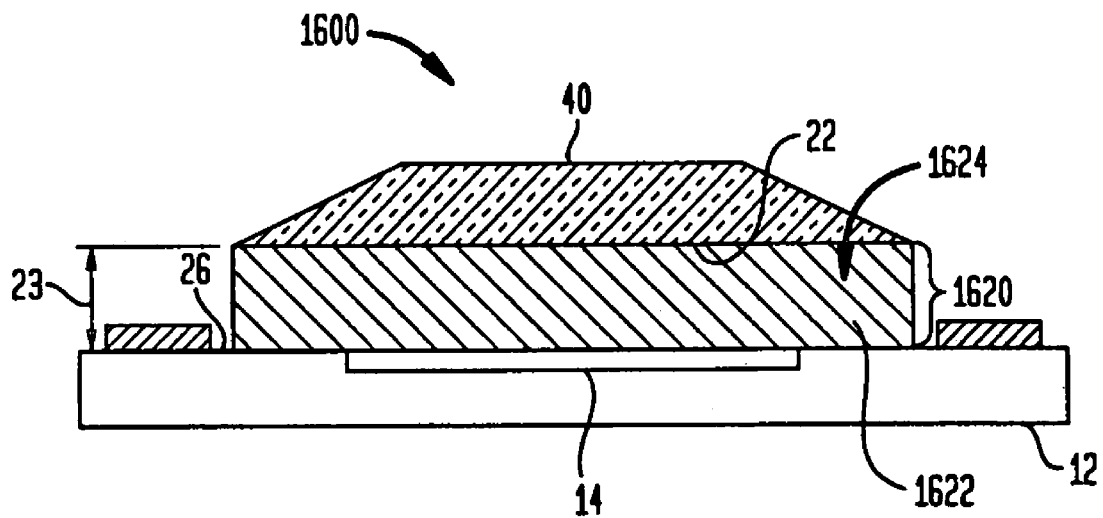
FIG. 49 is a sectional view illustrating a packaged chip in accordance with a particular embodiment of the invention.

FIG. 49 illustrates a lidded chip unit 1600 in accordance with a variation of the above embodiment (FIG. 6A) in which the lidded chip unit does not contain a cavity between a device region 14 at the front surface 26 of the chip and an inner surface of the lid element 40. Instead, one or more materials 1620 having at least one of solid or liquid phase fills a space between the front surface 26 and the inner surface 22 of the lid element 40. In one embodiment, the material between the lid and the chip can consist essentially of an adhesive which bonds the lid to the chip. Lidded units which lack interior cavities between the chip and the lid are suitable for packaging various types of devices, among which are low resolution optical imaging sensors, having a resolution of 100 by 100 pixels for example, sensors which operate with non-visible wavelengths of the spectrum and devices which require emit higher quantities of heat, such as for example, certain high intensity light emitting diodes, among others. The material 1620 between the lid and the chip can include multiple layers, e.g., layer 1622 and layer 1624, each layer consisting essentially of the same material or of different materials. The material may be selected on the basis of certain properties which can enhance the function of the lidded unit 1600. For example, a material exhibiting good thermal conductivity can be selected when the chip produces a high amount of heat. The material can also be selected on the basis of its thermal expansivity or other physical property such as electrical conductivity, high dielectric strength for maintaining high voltage stand off for example, degree of transparency or opacity, refractive index, or even based on mechanical properties such as mechanical damping. The material can be used to locally modify a stress gradient at the front face of the chip. The material can even be selected to control a distance 23 or joint gap between the inner surface of the lid wafer and the front face of the wafer. Typically, the material 1620 includes an adhesive. One or more layers 1622 of the material can have adhesive properties.

To form the lidded chip unit 1600, an adhesive can be applied to the inner surface of a lid wafer or to the front face of a device wafer to be joined thereto. The adhesive can be applied to such surface in a flowable low viscosity (liquid) phase by screen printing, for example, after which the adhesive is cured to a typically nonflowable (solid or semi-solid phase). Alternatively, the adhesive can be applied to such surface in sheet form in a nonflowable phase and then the adhesive can be thermally activated, causing the adhesive to flow and bond the lid to the chip.

Figure 51:
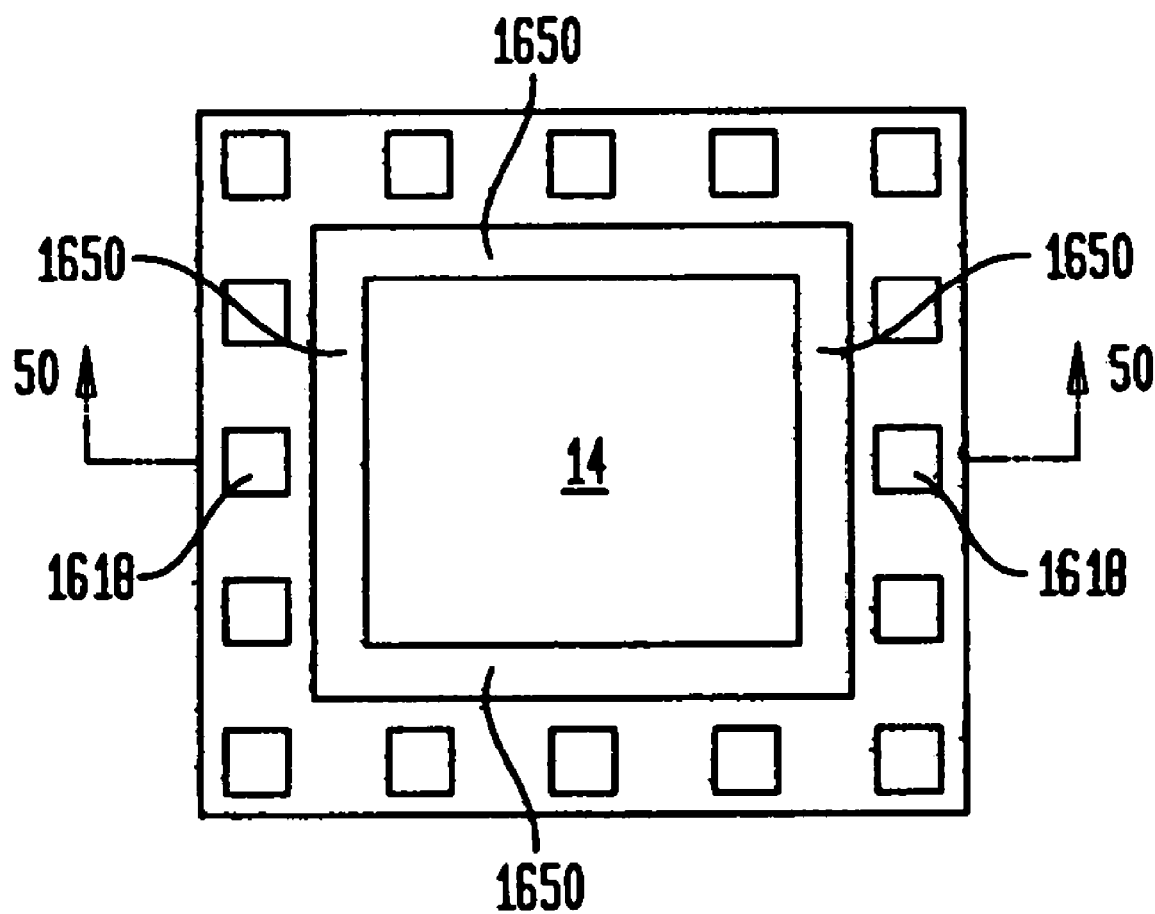
FIG. 51 is a corresponding plan view of the packaged chip shown in FIG. 50.

As illustrated in FIGS. 50 and 51, during and after fabrication of the lidded unit, exposed electrical contacts 1618 of the chip need to be kept free of adhesive or other matter which could interfere with conductive interconnection of the contacts to other electrical components, e.g., a circuit panel. During fabrication of the lidded unit, an adhesive in liquid phase tends to spread. In the embodiment shown in FIG. 50, dam walls 1650 at the front surface of the chip assist in containing a material 1621, for example, an adhesive, such that it does not flow onto the contacts 1618. As shown in FIG. 51, preferably, the dam walls 1650 are provided in form of a continuous ring having a "picture frame" i.e., rectangular or square shape.

Alternatively, the material contained by the dam walls can include another liquid phase or semi-solid material not used for bonding the chip to the lid. For example, a viscous liquid provided at the front face of the chip for its optical, mechanical or electrical properties can be held back by the dam walls from flowing onto the contacts.

Fabrication of the lidded chip unit shown in FIGS. 50-51 can be performed at wafer level, similar to the methods described above. Here, the rectangular ring of dam walls 1650 can be formed on the front face 26 of the device wafer in the location shown, such as by one or more of the above-described techniques. Thereafter, masses of a liquid adhesive can be dispensed onto individual device regions 14 of the device wafer, the dam walls 1650 keeping the adhesive from flowing onto the contacts 1618. A lid wafer such as described in the foregoing with reference to FIG. 3A et seq. can then be joined to the dispensed adhesive, after which the lid wafer is severed into individual lid elements and the device wafer is severed to provide a lidded chip unit, as described in the foregoing.

Figure 52:
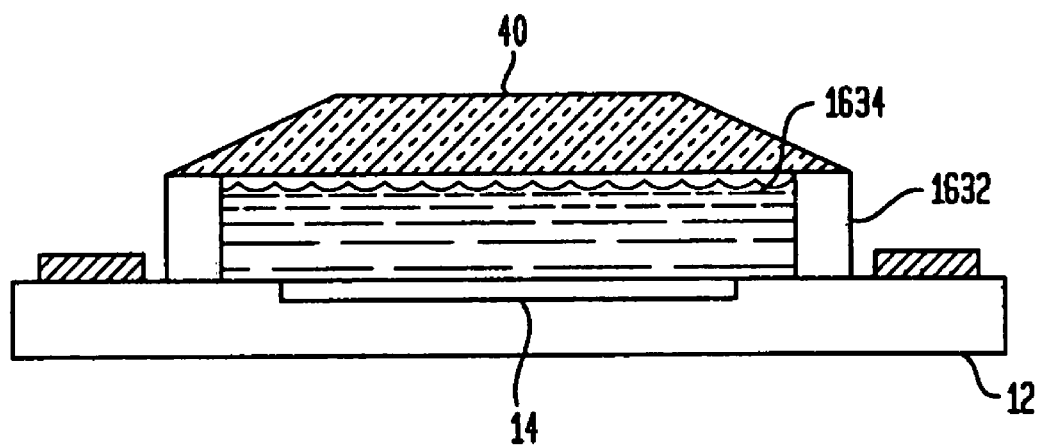
FIG. 52 is a sectional view illustrating a packaged chip in accordance with a particular embodiment of the invention.

Referring to FIG. 52, certain micro-electromechanical systems are designed to operate within a liquid medium 1634, requiring the presence of a liquid medium at or in close proximity to the device region 14 at the front face of the chip. In such systems, the liquid medium needs to be contained within an interior space between the chip and the lid. In the embodiment illustrated in FIG. 52, a liquid medium 1634 is contained between the lid 40 and the device region 14 of the chip by standoff walls 1632 similar to those shown and described above (FIG. 6A). In a particular example, the liquid can include a liquid provided in form or microdroplets at the front face of the device region, where the device region includes electrowetting devices which are operable to electrically alter the shapes of the microdroplets. In such case, the microdroplets form liquid lenses having electrically alterable optical characteristics. The altered shapes of the microdroplets can be used for focusing or other optical purpose.

As these and other variations and combinations of the features discussed above can be utilized without departing from the present invention as defined by the claims, the foregoing description of the preferred embodiments should be taken by way of illustration rather than by way of limitation of the invention as defined by the claims.

The invention claimed is:

1. A packaged microelectronic element, comprising:
   a microelectronic element having a front face and a plurality of peripheral edges bounding said front face, a device region at said front face and a contact region including a plurality of exposed contacts adjacent to at least one of said peripheral edges;
   support walls overlying said front face;
   a lid mounted to said support walls above said microelectronic element, said lid having an inner surface confronting said front face, wherein at least some of said contacts are exposed beyond edges of said lid; and
   an adhesive which bonds the front face of the microelectronic element to at least a portion of the support walls which is remote from the lid;
   wherein said support walls extend directly from the inner surface of the lid and consist essentially of a polymer;
   wherein said microelectronic element includes an optoelectronic device in said device region, wherein said lid is at least partially transparent to energy at wavelengths of interest with respect to operation of said optoelectronic device.

2. The packaged microelectronic element as claimed in claim 1, wherein said support walls are bonded by an adhesive to at least one of said front face of said microelectronic element or said inner surface of said lid.

3. The packaged microelectronic element as claimed in claim 2, wherein edges of said support walls are exposed beyond said edges of said lid.

4. The packaged microelectronic element as claimed in claim 1, wherein said support walls include recesses, the recesses extending in at least a lateral direction transverse to a normal direction with respect to said front face.

5. The packaged microelectronic element as claimed in claim 1, wherein at least some of said edges of said lid are oriented at an angle with respect to a normal to said front face of the microelectronic element.

6. The packaged microelectronic element as claimed in claim 1, wherein said support walls overlie a region of said microelectronic element between said device region and said contact region.

7. The packaged microelectronic element as claimed in claim 6, wherein said microelectronic element includes an optoelectronic device and at least one second device and the support walls at least partially overlie the at least one second device.

8. The packaged microelectronic element as claimed in claim 7, wherein the support walls do not overlie the optoelectronic device.

9. The packaged microelectronic element as claimed in claim 7, wherein the support walls conduct heat between the at least one second device and the lid.

10. The packaged microelectronic element as claimed in claim 7, wherein the support walls and the lid conduct heat between (i) a first one of the at least one second device at a first location of the microelectronic element and (ii) a second one of the at least one second device at a second location of the microelectronic element.

11. The packaged microelectronic element as claimed in claim 1, further comprising a material including at least one of a solid component or a liquid component disposed between said device region at said front face and an inner surface of said lid.

12. The packaged microelectronic element as claimed in claim 11, wherein the material includes a solid component and the solid component fills spaces between the device regions and the lid wafer.

13. The packaged microelectronic element as claimed in claim 11, wherein the material includes a liquid component and the liquid component fills spaces between the device regions and the lid wafer.

14. The packaged microelectronic element as claimed in claim 11, wherein the material controls a distance between a front surface of the device wafer and an inner surface of the lid wafer.

15. The packaged microelectronic element as claimed in claim 11, wherein the material applies a stress to at least one of the lid wafer or the device wafer.

16. The packaged microelectronic element as claimed in claim 11, wherein the material functions to perform at least one of heat-spreading or impeding of heat-spreading.

17. The packaged microelectronic element as claimed in claim 11, wherein the material has an optical property different from an optical property of the lid wafer.

18. The packaged microelectronic element as claimed in claim 11, wherein the material has a refractive index different from a refractive index of the lid wafer.

19. The packaged microelectronic element as claimed in claim 11, wherein the material has a mechanical motion damping property.

20. The packaged microelectronic element as claimed in claim 11, wherein the material increases dielectric strength between the lid wafer and the device wafer.

21. The packaged microelectronic element as claimed in claim 11, wherein at least a portion of the liquid component is included in liquid lenses between the device regions and the lid wafer.

22. The packaged microelectronic element as claimed in claim 11, wherein at least a portion of the liquid component is included in microdroplets contacting the device regions, and the device regions include electrowetting devices operable to electrically alter shapes of the microdroplets.

23. The packaged microelectronic element as claimed in claim 11, wherein said support walls include an adhesive, said packaged microelectronic element further comprising a dam extending from the front face of the microelectronic element between the device region and the contact region, the dam separating the adhesive from at least some of the contacts.

* * * * *